US012635261B2

(12) United States Patent
Lunt, III et al.

(10) Patent No.: US 12,635,261 B2
(45) Date of Patent: May 19, 2026

(54) TRANSPARENT SOLAR CELLS FOR AGRIVOLTAICS

(71) Applicant: Board of Trustees of Michigan State University, East Lansing, MI (US)

(72) Inventors: Richard Royal Lunt, III, Williamston, MI (US); Christopher Herrera, Haslett, MI (US); Eric J. Stallknecht, Lansing, MI (US); Thomas D. Sharkey, East Lansing, MI (US); Erik S. Runkle, East Lansing, MI (US); Matthew Bates, Hillsboro, OR (US)

(73) Assignee: Board of Trustees of Michigan State University, East Lansing, MI (US)

( * ) Notice: Subject to any disclaimer, the term of this patent is extended or adjusted under 35 U.S.C. 154(b) by 0 days.

(21) Appl. No.: 18/434,145

(22) Filed: Feb. 6, 2024

(65) Prior Publication Data

US 2024/0372023 A1 Nov. 7, 2024

Related U.S. Application Data

(63) Continuation of application No. PCT/US2022/039604, filed on Aug. 5, 2022.
(Continued)

(51) Int. Cl.
*H10F 19/37* (2025.01)
*A01G 9/24* (2006.01)
(Continued)

(52) U.S. Cl.
CPC ............. *H10F 19/37* (2025.01); *A01G 9/243* (2013.01); *H02S 20/10* (2014.12); *H02S 20/25* (2014.12);
(Continued)

(58) Field of Classification Search
CPC ........ H10F 19/37; H10F 10/148; H10F 77/45; H10F 77/488; A01G 9/243; H02S 20/10;
(Continued)

(56) References Cited

U.S. PATENT DOCUMENTS 9,728,735 B2 8/2017 Bulovic et al.
9,985,158 B2 5/2018 Lunt et al.
(Continued)

FOREIGN PATENT DOCUMENTS

JP H09-67148 A 3/1997
JP 2010073887 A 4/2010
(Continued)

OTHER PUBLICATIONS

International Search Report and Written Opinion for PCT/US2022/039604 dated Jan. 11, 2023.
(Continued)

*Primary Examiner* — Michael Y Sun
(74) *Attorney, Agent, or Firm* — Harness, Dickey & Pierce, P.L.C.

(57) ABSTRACT

A transparent solar panel includes a transparent substrate and a transparent photoactive material. An average photosynthetic transmittance (APT) of the entire transparent solar panel is greater than or equal to about 45%. The transparent solar panel is configured to transmit light to a region containing a plant at a daily light integral (DLI) of greater than or equal to about 10 $mol \cdot m^{-2} \cdot d^{-1}$. The transparent solar panel may be a transparent photovoltaic (TPV) or a transparent luminescent solar concentrator (TLSC).

17 Claims, 64 Drawing Sheets

Related U.S. Application Data

(60) Provisional application No. 63/230,319, filed on Aug. 6, 2021.

(51) Int. Cl.
| | |
|---|---|
| *H02S 20/10* | (2014.01) |
| *H02S 20/25* | (2014.01) |
| *H02S 20/32* | (2014.01) |
| *H10F 10/14* | (2025.01) |
| *H10F 77/45* | (2025.01) |

(52) U.S. Cl.
CPC ........... *H02S 20/32* (2014.12); *H10F 10/148* (2025.01); *H10F 77/45* (2025.01)

(58) Field of Classification Search
CPC .......... H02S 20/25; H02S 20/32; H02S 20/20; H02S 20/23; H02S 40/425; H10K 30/20; Y02E 10/52
See application file for complete search history.

(56) References Cited

U.S. PATENT DOCUMENTS

| | | | | |
|---|---|---|---|---|
| 2009/0205701 | A1* | 8/2009 | Govaerts | H10F 77/45 |
| | | | | 136/247 |
| 2011/0005128 | A1* | 1/2011 | Chuang | A01G 9/1407 |
| | | | | 248/237 |
| 2012/0024345 | A1 | 2/2012 | Reisfeld et al. | |
| 2016/0013433 | A1 | 1/2016 | Yang et al. | |
| 2017/0202155 | A1* | 7/2017 | Iwai | H02S 20/23 |
| 2018/0248064 | A1 | 8/2018 | Lunt et al. | |
| 2018/0366659 | A1* | 12/2018 | Barr | H10K 85/331 |
| 2020/0098942 | A1 | 3/2020 | Lunt, III et al. | |
| 2020/0303667 | A1 | 9/2020 | Lunt et al. | |
| 2020/0343053 | A1 | 10/2020 | Lunt et al. | |
| 2021/0050538 | A1 | 2/2021 | Pandey et al. | |
| 2021/0230427 | A1 | 7/2021 | Lunt, III et al. | |
| 2021/0233717 | A1 | 7/2021 | Lunt et al. | |
| 2023/0103150 | A1* | 3/2023 | Kang | H10F 77/488 |
| | | | | 136/259 |

FOREIGN PATENT DOCUMENTS

| | | |
|---|---|---|
| JP | 2010193837 A | 9/2010 |
| JP | 2012021056 A | 2/2012 |
| JP | 2013532368 A | 8/2013 |
| JP | 2015113678 A | 6/2015 |
| JP | 2015177781 A | 10/2015 |
| JP | 2016059280 A | 4/2016 |
| JP | 2017-029120 A | 2/2017 |
| JP | 2017516316 A | 6/2017 |
| JP | 2018-161044 A | 10/2018 |
| JP | 2019083749 A | 6/2019 |
| JP | 2020504456 A | 2/2020 |
| KR | 20110096943 A | 8/2011 |
| TW | I708401 B | 10/2020 |
| TW | 202101777 A | 1/2021 |
| WO | 2012128244 A1 | 9/2012 |
| WO | 2012/141091 A1 | 10/2012 |
| WO | 2013031902 A1 | 3/2013 |
| WO | WO-2021009144 A1 | 1/2021 |
| WO | WO-2021012037 A1 | 1/2021 |
| WO | WO-2021058644 A1 | 4/2021 |
| WO | WO-2021150504 A1 | 7/2021 |

OTHER PUBLICATIONS

Australian Examination Report for corresponding AU Application No. 2022323006 dated Nov. 25, 2024.
Lunt et al. "Transparent, Near-infrared Organic Photovoltaic Solar Cells for Window and Energy scavenging Applications", Applied Physics Letters, 2011, vol. 98 Iss. 11 pp. 113305-1-3.

Al-agele, H.A., Proctor, K., Murthy, G. and Higgins, C., 2021. A Case Study of Tomato (*Solanum lycopersicon* var. Legend) Production and Water Productivity in Agrivoltaic Systems. Sustainability 2021, 13, 2850.
Barron-Gafford, G.A., Pavao-Zuckerman, M.A., Minor, R.L., Sutter, L.F., Barnett-Moreno, I., Blackett, D.T., Thompson, M., Dimond, K., Gerlak, A.K., Nabhan, G.P. and Macknick, J.E., 2019. Agrivoltaics provide mutual benefits across the food-energy-water nexus in drylands. Nature Sustainability, 2(9), pp. 848-855.
Burnett, S.E., van Iersel, M.W. & Thomas, P.A. 2006 Medium-incorporated PEG-8000 reduces elongation, growth, and whole-canopy carbon dioxide exchange of marigold. HortScience 41 124 130.
Carini, F., Cargenelutti Filho, A., Bandeira, C.T., Neu, I.M.M., Pezzini, R.V., Pacheco, M. and Tomasi, R.M., 2019. Growth models for lettuce cultivars growing in spring. J. Agric. Sci, 11, pp. 147-159.
Detweiler, A.M., Mioni, C.E., Hellier, K.L., Allen, J.J., Carter, S.A., Bebout, B.M., Fleming, E.E., Corrado, C. and Prufert-Bebout, L.E., 2015. Evaluation of wavelength selective photovoltaic panels on microalgae growth and photosynthetic efficiency. Algal research, 9, pp. 170-177.
Dinesh, H. and Pearce, J.M., 2016. The potential of agrivoltaic systems. Renewable and Sustainable Energy Reviews, 54, pp. 299-308.
Dorais, M., Oct. 2003, The use of supplemental lighting for vegetable crop production: light intensity, crop response, nutrition, crop management, cultural practices. In Canadian Greenhouse Conference (vol. 9).
Dou, H., Niu, G., Gu, M. and Masabni, J.G., 2018. Responses of sweet basil to different daily light integrals in photosynthesis, morphology, yield, and nutritional quality. HortScience, 53(4), pp. 496-503.
Faust, J.E., 2002. First Research Report. Light management in greenhouses. I. Daily light integral: a useful tool for the US floriculture industry.
Faust, J.E., Holcombe, V., Rajapakse, N.C. and Layne, D.R., 2005. The effect of daily light integral on bedding plant growth and flowering. HortScience, 40(3), pp. 645-649.
Franklin, K.A., 2008. Shade avoidance. New Phytologist, 179(4), pp. 930-944.
Gao, W., He, D., Ji, F., Zhang, S. and Zheng, J., 2020. Effects of daily light integral and LED spectrum on growth and nutritional quality of hydroponic spinach. Agronomy, 10(8), p. 1082.
Gent, M.P., 2007. Effect of degree and duration of shade on quality of greenhouse tomato. HortScience, 42(3), pp. 514-520.
Hassanien, R.H.E. and Ming, L., 2017. Influences of greenhouse-integrated semi-transparent photovoltaics on microclimate and lettuce growth. International Journal of Agricultural and Biological Engineering, 10(6), pp. 11-22.
Hogewoning, S.W., Wientjes, E., Douwstra, P., Trouwborst, G., Van Ieperen, W., Croce, R. and Harbinson, J., 2012. Photosynthetic quantum yield dynamics: from photosystems to leaves. The plant cell, 24(5), pp. 1921-1935.
Japanese Office Action for JP Application 2024-506962 dated Feb. 4, 2025, with English summary.
Kaczperski, M.P., Carlson, W.H. and Karlsson, M.G., 1991. Growth and development of Petunia* hybrids as a function of temperature and irradiance. Journal of the American Society for Horticultural Science, 116(2), pp. 232-237.
Kavga, A., Trypanagnostopoulos, G., Zervoudakis, G. and Tripanagnostopoulos, Y., 2018. Growth and physiological characteristics of lettuce (*Lactuca sativa* L.) and rocket (*Eruca sativa* Mill.) plants cultivated under photovoltaic panels. Notulae Botanicae Horti Agrobotanici Cluj-Napoca, 46(1), pp. 206-212.
Liu, Y., Cheng, P., Li, T., Wang, R., Li, Y., Chang, S.Y., Zhu, Y., Cheng, H.W., Wei, K.H., Zhan, X. and Sun, B., 2019. Unraveling sunlight by transparent organic semiconductors toward photovoltaic and photosynthesis. ACS nano, 13(2), pp. 1071-1077.
Lunt, R.R., 2012. Theoretical limits for visibly transparent photovoltaics. Applied Physics Letters, 101(4), p. 043902. USDA National Agricultural Statistics Service. 2017 Census of Agriculture.

(56)　　　　　　References Cited

OTHER PUBLICATIONS

López-Díaz G, Carreño-Ortega A, Fatnassi H, Poncet C, Díaz-Pérez M (2020) The effect of different levels of shading in a photovoltaic greenhouse with a north-south orientation. Appl Sci 10:882.

Marcelis, L.F.M., Broekhuijsen, A.G.M., Meinen, E., Nijs, E.M.F. M. and Raaphorst, M.G.M., Jun. 2005, Quantification of the growth response to light quantity of greenhouse grown crops. In V International Symposium on Artificial Lighting in Horticulture 711 (pp. 97-104).

Marrou, H., Wéry, J., Dufour, L. and Dupraz, C., 2013. Productivity and radiation use efficiency of lettuces grown in the partial shade of photovoltaic panels. European Journal of Agronomy, 44, pp. 54-66.

Mccree, K. J. Action Spectrum, Absorptance and Quantum Yield of Photosynthesis in Crop Plants. Agric. Meteorol. 1972, 9 (3-4), 191-.216.

Meng, Q., Boldt, J. and Runkle, E.S., 2020. Blue radiation interacts with green radiation to influence growth and predominantly controls quality attributes of lettuce. Journal of the American Society for Horticultural Science, 145(2), pp. 75-87.

Meng, Q., Kelly, N. and Runkle, E.S., 2019. Substituting green or far-red radiation for blue radiation induces shade avoidance and promotes growth in lettuce and kale. Environmental and experimental botany, 162, pp. 383-391.

Proctor, K.W., Murthy, G.S. and Higgins, C.W., 2021. Agrivoltaics Align with Green New Deal Goals While Supporting Investment in the US'Rural Economy. Sustainability, 13(1), p. 137.

Ravishankar, E., Charles, M., Xiong, Y., Henry, R., Swift, J., Rech, J., Calero, J., Cho, S., Booth, R.E., Kim, T. and Balzer, A.H., 2021. Balancing crop production and energy harvesting in organic solar-powered greenhouses. Cell Reports Physical Science, 2(3), p. 100381.

Runkle, E.S. and Heins, R.D., 2001. Specific functions of red, far red, and blue light in flowering and stem extension of long-day plants. Journal of the American society for horticultural science, 126(3), pp. 275-282.

Runkle, E.S. and Heins, R.D., 2002. Stem extension and subsequent flowering of seedlings grown under a film creating a far-red deficient environment. Scientia Horticulturae, 96(1-4), pp. 257-265.

Sivakumar, M.V.K. and Virmani, S.M., 1984. Crop productivity in relation to interception of photosynthetically active radiation. Agricultural and Forest Meteorology, 31(2), pp. 131-141.

Suddard-Bangsund, J., Traverse, C.J., Young, M., Patrick, T.J., Zhao, Y. and Lunt, R.R., 2016. Organic Salts as a Route to Energy Level Control in Low Bandgap, High Open-Circuit Voltage Organic and Transparent Solar Cells that Approach the Excitonic Voltage Limit. Advanced Energy Materials, 6(1), p. 1501659.

Thompson, E.P., Bombelli, E.L., Shubham, S., Watson, H., Everard, A., D'Ardes, V., Schievano, A., Bocchi, S., Zand, N., Howe, C.J. and Bombelli, P., 2020. Tinted semi-transparent solar panels allow concurrent production of crops and electricity on the same cropland. Advanced Energy Materials, 10(35), p. 2001189.

Timmermans, G.H., Hemming, S., Baeza, E., Van Thoor, E.A., Schenning, A.P. and Debije, M.G., 2020. Advanced optical materials for sunlight control in greenhouses. Advanced Optical Materials, 8(18), p. 2000738.

Torres, A.P. and Lopez, R.G., 2011. Commercial greenhouse production. Measuring Daily Light Integral in a Greenhouse. West Lafayette, IN: Purdue Extension.

Traverse, C.J., Pandey, R., Barr, M.C. and Lunt, R.R., 2017. Emergence of highly transparent photovoltaics for distributed applications. Nature Energy, 2(11), pp. 849-860.

United States Department of Agriculture (USDA). 2021. Floriculture crops 2020 summary. National Agricultural Statistics Service, Washington, D.C.

Valle, B., Simonneau, T., Sourd, F., Pechier, P., Hamard, P., Frisson, T., Ryckewaert, M. and Christophe, A., 2017. Increasing the total productivity of a land by combining mobile photovoltaic panels and food crops. Applied energy, 206, pp. 1495-1507.

Waller, R., Kacira, M., Magadley, E., Teitel, M. and Yehia, I., 2021. Semi-Transparent Organic Photovoltaics Applied as Greenhouse Shade for Spring and Summer Tomato Production in Arid Climate. Agronomy, 11(6), p. 1152.

Walters, K.J., Lopez, R.G. and Behe, B.K., 2021. Leveraging controlled-environment agriculture to increase key basil terpenoid and phenylpropanoid concentrations: The effects of radiation intensity and CO2 concentration on consumer preference. Frontiers in Plant Science, 11, p. 1641.

Wang, D., Liu, H., Li, Y., Zhou, G., Zhan, L., Zhu, H., Lu, X., Chen, H. and Li, C.Z., 2021. High-performance and eco-friendly semi-transparent organic solar cells for greenhouse applications. Joule, 5(4), pp. 945-957.

Weselek, A., Bauerle, A., Zikeli, S., Lewandowski, I. and Högy, P., 2021. Effects on Crop Development, Yields and Chemical Composition of Celeriac (Apium graveolens L. var. rapaceum) Cultivated Underneath an Agrivoltaic System. Agronomy, 11(4), p. 733.

Winsor, C.P., 1932. The Gompertz curve as a growth curve. Proceedings of the National Academy of Sciences of the United States of America, 18(1), p. 1.

Yasin, M., E. Rosenqvist, S.M. Jensen, and C. Andreasen. 2019. The importance of reduced light intensity on the growth and development of six weed species. Weed Research, 59(2), pp. 130-144.

Zhang, T., Maruhnich, S.A. and Folta, K.M., 2011. Green light induces shade avoidance symptoms. Plant physiology, 157(3), pp. 1528-1536.

Zhen, S. and Bugbee, B., 2020a. Far-red photons have equivalent efficiency to traditional photosynthetic photons: Implications for redefining photosynthetically active radiation. Plant, cell & environment, 43(5), pp. 1259-1272.

Zhen, S. and Bugbee, B., 2020b. Substituting far-red for traditionally defined photosynthetic photons results in equal canopy quantum yield for CO2 fixation and increased photon capture during long-term studies: Implications for re-defining PAR. Frontiers in Plant Science, 11, p. 1433.

Zhen, S., van Iersel, M. and Bugbee, B., 2021. Why Far-Red Photons Should Be Included in the Definition of Photosynthetic Photons and the Measurement of Horticultural Fixture Efficacy. Frontiers in Plant Science, 12, p. 1158. Plant Responses to Extended Photosynthetically Active Radiation.

First Examination Report for Indian Patent Application No. 202447009699 dated Oct. 17, 2025, with English translation.

Japanese Office Action for JP Application 2024-506962 dated Sep. 30, 2025.

Australian Examination Report for AU Application 2022323006 dated Sep. 18, 2025.

Extended European Search Report for EP Application 22853969.8 dated Aug. 12, 2025.

Australian Examination Report for AU Application 2022323006 dated Jun. 27, 2025.

Sager, J.C., Smith, W.O., Edwards, J.L. and Cyr, K.L., 1988, Photosynthetic efficiency and phytochrome photoequilibria determination using spectral data, Transactions of the ASAE, 31(6), pp. 1882-1889.

Weselek, A. et al., 'Agrophotovoltaic systems: applications, challenges, and opportunities. A review', Agronomy for Sustainable Development, 2019, vol. 39, art. 35.

Yang, C. et al. "High-Performance Near-Infrared Harvesting Transparent Luminescent Solar Concentrators," Advanced Optical Materials, 2020, vol. 8, 1901536, pp. 1-6.

Brazilian Preliminary Examination Report for BR Application BR112024002355-9 dated Feb. 12, 2026.

* cited by examiner

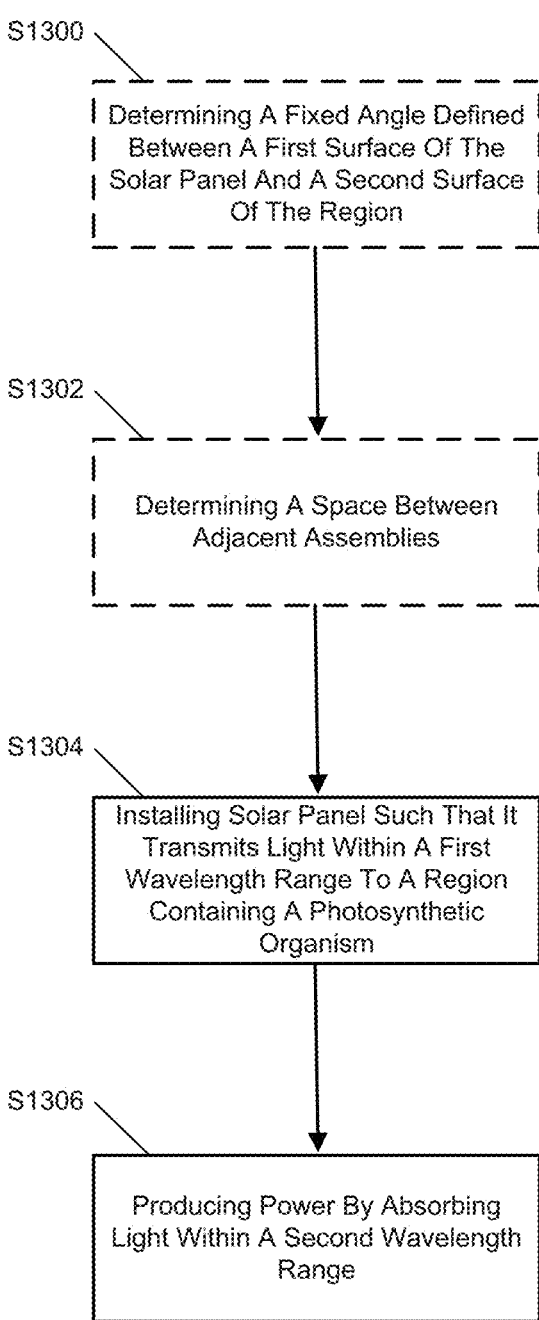

S1300

Determining A Fixed Angle Defined Between A First Surface Of The Solar Panel And A Second Surface Of The Region

S1302

Determining A Space Between Adjacent Assemblies

S1304

Installing Solar Panel Such That It Transmits Light Within A First Wavelength Range To A Region Containing A Photosynthetic Organism

S1306

Producing Power By Absorbing Light Within A Second Wavelength Range

FIG. 13

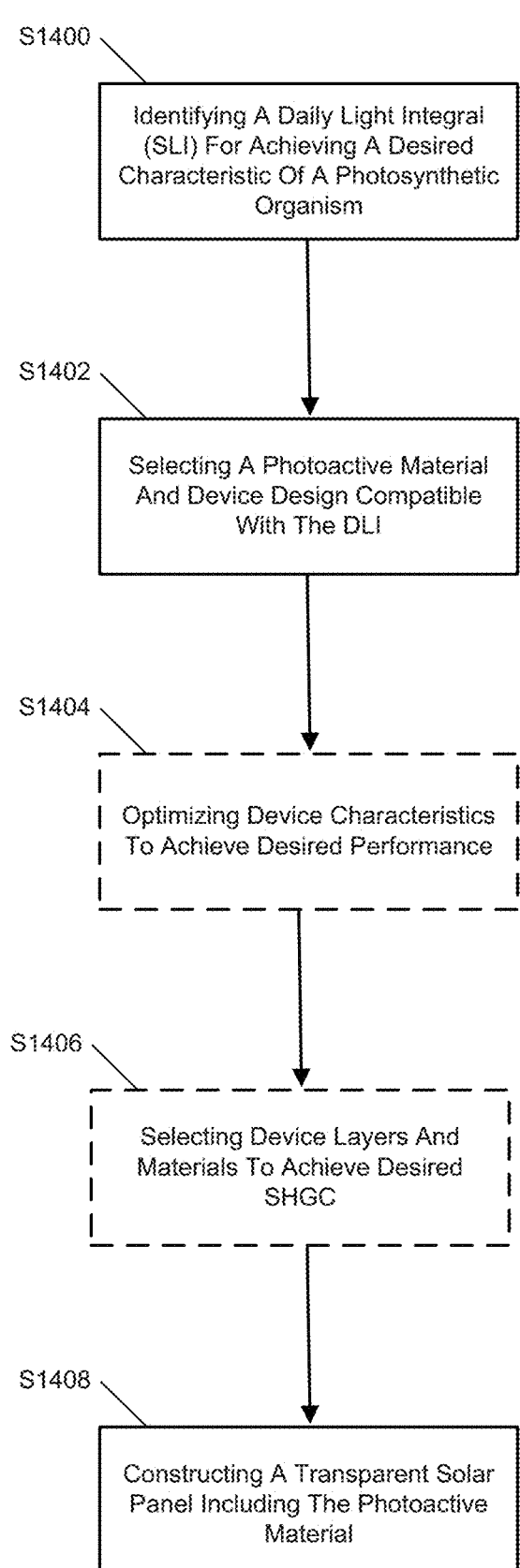

S1400

Identifying A Daily Light Integral (SLI) For Achieving A Desired Characteristic Of A Photosynthetic Organism

S1402

Selecting A Photoactive Material And Device Design Compatible With The DLI

S1404

Optimizing Device Characteristics To Achieve Desired Performance

S1406

Selecting Device Layers And Materials To Achieve Desired SHGC

S1408

Constructing A Transparent Solar Panel Including The Photoactive Material

FIG. 14

Glazing material: ▦ Control ● ND58 ▲ ND33 ◆ NIR770 ▦ NIR700 ✳ VIS600 ⊠ VIS500
FIG. 19A
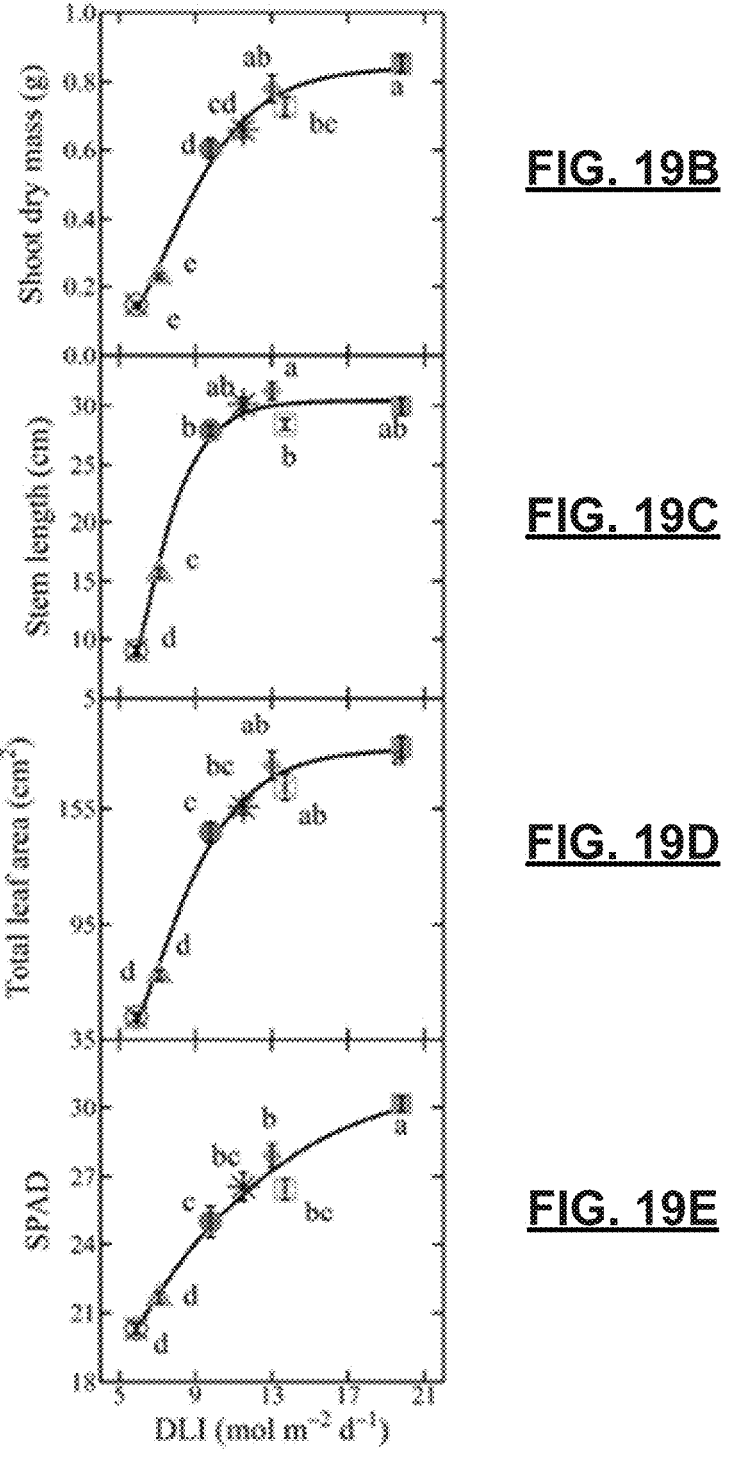
FIG. 19B
FIG. 19C
FIG. 19D
FIG. 19E

| Growth parameter | Regression type | Equation | $R^2$ |
|---|---|---|---|
| Leaf fresh mass (g) | Sigmoidal | $y = 6.90 * \exp(-20.8 * 0.647^X)$ | 0.92 |
| Leaf dry mass (g) | Sigmoidal | $y = 0.507 * \exp(-14.6 * 0.701^X)$ | 0.90 |
| Stem fresh mass (g) | Sigmoidal | $y = 4.22 * \exp(-81.4 * 0.556^X)$ | 0.90 |
| Stem dry mass (g) | Sigmoidal | $y = 0.267 * \exp(-43.4 * 0.615^X)$ | 0.89 |
| Total leaf area (cm$^2$) | Sigmoidal | $y = 106 * \exp(-15.9 * 0.670^X)$ | 0.91 |
| Individual leaf area (cm$^2$) | Quadratic | $y = 5.43 - 0.190x^2 - 12.7$ | 0.83 |
| Leaf length (cm) | Sigmoidal | $y = 9.80 * \exp(-9.91 * 0.575^X)$ | 0.72 |
| SPAD | Sigmoidal | $y = 32.5 * \exp(-1.11 * 0.855^X)$ | 0.81 |
| SLA (cm$^2$ g$^{-1}$) | Sigmoidal | $y = 276 * \exp(1.13 * 0.909^X)$ | 0.72 |
| Stem length (cm) | Sigmoidal | $y = 30.4 * \exp(-55.2 * 0.529^X)$ | 0.94 |
| Stem diameter (mm) | Sigmoidal | $y = 3.61 * \exp(-3.76 * 0.735^X)$ | 0.85 |
| Node no. | Sigmoidal | $y = 5.24 * \exp(-1.60 * 0.829^X)$ | 0.81 |
| Branch no. | Linear | $y = 0.0554x - 0.302$ | 0.27 |
| Compactness (g cm$^{-1}$) | Sigmoidal | $y = 0.0316 * \exp(-1.84 * 0.860^X)$ | 0.78 |

FIG. 20

| Growth parameter | Regression type | Equation | $R^2$ |
|---|---|---|---|
| Shoot fresh mass (g) | Sigmoidal | $y = 93.3 * exp(-53.2 * 0.565^x)$ | 0.88 |
| Shoot dry mass (g) | Sigmoidal | $y = 5.76 * exp(-26.1 * 0.629^x)$ | 0.90 |
| Leaf length (cm) | Sigmoidal | $y = 6.83 * exp(2.80 * 0.710^x)$ | 0.54 |
| Leaf width (cm) | Sigmoidal | $y = 3.51 * exp(1.47 * 0.858^x)$ | 0.60 |
| Leaf area (cm$^2$) | Sigmoidal | $y = 15.3 * exp(4.58 * 0.758^x)$ | 0.78 |
| SPAD | Linear | $y = 0.622x + 19.5$ | 0.47 |
| SLA (cm$^2$ g$^{-1}$) | Linear | $y = -6.64x + 304$ | 0.55 |
| Central stem length (cm) | Sigmoidal | $y = 13.6 * exp(3.31 * 0.862^x)$ | 0.89 |
| Longest branch (cm) | Sigmoidal | $y = 30.2 * exp(-1.13e^4 * 0.196^x)$ | 0.79 |
| Branch no. | Sigmoidal | $y = 8.81 * exp(-61.9 * 0.603^x)$ | 0.91 |
| Compactness (g cm$^{-3}$) | Sigmoidal | $y = 0.357 * exp(-22.2 * 0.718^x)$ | 0.84 |
| Time to visible bud (d) | Sigmoidal | $y = 15.0 * exp(54.5 * 0.373^x)$ | 0.38 |
| Time to flower (d) | Sigmoidal | $y = 24.6 * exp(1.53 * 0.649^x)$ | 0.34 |
| Total inflorescence no. | Sigmoidal | $y = 62.8 * exp(-17.6 * 0.703^x)$ | 0.93 |
| Nodes under first flower no. | Sigmoidal | $y = 7.51 * exp(104 * 0.407^x)$ | 0.43 |

FIG. 21

| Growth parameter | Regression type | Equation | $R^2$ |
|---|---|---|---|
| Shoot fresh mass (g) | Sigmoidal | $y = 116 * \exp(-4.92e^6 * 0.0566^x)$ | 0.33 |
| Shoot dry mass (g) | Rectangular hyperbola | $y = \dfrac{17.9 * x}{6.25 + x}$ | 0.19 |
| fruit fresh mass (g) | Linear | $y = 30.4x - 121$ | 0.80 |
| Fruit dry mass (g) | Sigmoidal | $y = 16.1 * \exp(-13.7 * 0.704^x)$ | 0.75 |
| Total fruit no. | Sigmoidal | $y = 30.6 * \exp(-34.0 * 0.593^x)$ | 0.75 |
| Ripe fruit no. | Linear | $y = 1.53x - 9.30$ | 0.64 |
| Unripe fruit no. | Sigmoidal | $y = 19.1 * \exp(-292 * 0.392^x)$ | 0.41 |
| Leaf length (cm) | - | NS | - |
| Leaf width (cm) | - | NS | - |
| Leaflet area (cm$^2$) | Linear | $y = 3.19x + 98.0$ | 0.14 |
| SPAD | Linear | $y = 0.252x + 31.5$ | 0.07 |
| PCA (cm$^2$) | Sigmoidal | $y = 6.38 * \exp(4.47 * 0.980^x)$ | 0.40 |
| SLA (cm$^2$ g$^{-1}$) | Linear | $y = -23.2x + 671$ | 0.67 |
| Stem length (cm) | Sigmoidal | $y = 6.09 * \exp(2.42 * 0.957^x)$ | 0.45 |
| Stem diameter (mm) | Sigmoidal | $y = 10.9 * \exp(-2.74 * 0.680^x)$ | 0.41 |
| Compactness (g cm$^{-3}$) | Linear | $y = 0.0409x - 0.0150$ | 0.64 |
| Flower time (d) | Sigmoidal | $y = 40.4 * \exp(11.0 * 0.529^x)$ | 0.68 |

FIG. 22

| Growth parameter | Glazing material | | | | | | |
|---|---|---|---|---|---|---|---|
| | ND91 | ND58 | ND33 | CO770 | CO700 | CO550a | CO550b |
| Leaf fresh mass (g) | 6.8 a | 5.5 c | 2.3 d | 6.7 a | 6.5 ab | 5.7 bc | 1.7 d |
| Leaf dry mass (g) | 0.51 a | 0.35 d | 0.14 e | 0.45 ab | 0.43 bc | 0.38 cd | 0.093 e |
| Stem fresh mass (g) | 4.0 ab | 3.3 c | 1.1 d | 4.4 a | 4.1 ab | 3.7 bc | 0.5 d |
| Stem dry mass (g) | 0.28 a | 0.20 c | 0.061 d | 0.26 ab | 0.23 bc | 0.22 bc | 0.027 d |
| Individual leaf area (cm²) | 20 c | 23 bc | 16 d | 27 a | 26 ab | 24 b | 13 d |
| Total leaf area (cm²) | 186 a | 143 c | 68 d | 177 ab | 166 ab | 156 bc | 47 d |
| Leaf length (cm) | 9.1 b | 9.9 a | 7.5 c | 10.0 a | 9.8 ab | 9.8 ab | 7.0 c |
| SPAD | 30.2 a | 25.0 c | 21.7 d | 27.9 b | 26.4 bc | 26.6 bc | 20.3 d |
| SLA (cm² g⁻¹) | 329 c | 414 b | 525 a | 407 b | 368 bc | 389 b | 509 a |
| Stem length (cm) | 29.9 ab | 27.9 b | 15.7 c | 31.2 a | 28.5 b | 30.1 ab | 9.0 d |
| Stem diameter (mm) | 3.4 a | 3.1 b | 2.1 c | 3.6 a | 3.5 a | 3.1 b | 2.1 c |
| Node no. | 5.2 a | 4.3 b | 3.4 c | 4.5 b | 4.3 b | 4.4 b | 3.1 c |
| Branch no. | 0.7 a | 0.3 ab | 0.0 b | 0.6 a | 0.4 ab | 0.4 ab | 0.0 b |
| Compactness (g cm⁻¹) | 0.029 a | 0.022 d | 0.015 e | 0.25 bc | 0.026 ab | 0.022 cd | 0.016 e |

FIG. 23

| Growth parameter | Treatment | | | | | | |
|---|---|---|---|---|---|---|---|
| | ND91 | ND58 | ND33 | CO770 | CO700 | CO550a | CO550b |
| Shoot fresh mass (g) | 81.1 cd | 74.6 d | 43.8 e | 102.8 a | 97.7 ab | 89.3 bc | 25.6 f |
| Shoot dry mass (g) | 5.5 ab | 4.5 c | 2.4 d | 5.9 a | 5.7 ab | 5.1 bc | 1.7 e |
| Leaf length (cm) | 6.9 b | 7.4 b | 8.6 a | 6.7 b | 7.2 b | 7.3 b | 9.2 a |
| Leaf width (cm) | 3.6 c | 4.3 bc | 5.8 a | 4.4 bc | 4.5 b | 4.5 b | 6.1 a |
| Leaf area (cm$^2$) | 14.7 b | 17.7 b | 28.7 a | 16.7 b | 18.3 b | 18.8 b | 32.1 a |
| SPAD | 30.8 ab | 24.5 d | 24.4 d | 28.1 bc | 31.4 a | 26.0 cd | 23.7 d |
| SLA (cm$^2$ g$^{-1}$) | 168 d | 251 a | 253 a | 215 bc | 198 cd | 242 ab | 247 a |
| Central stem length (cm) | 16.9 d | 28.9 c | 38.8 b | 18.2 d | 17.8 d | 27.0 c | 48.6 a |
| Longest branch (cm) | 27.3 bc | 31.2 ab | 23.7 c | 29.5 ab | 29.5 ab | 33.3 a | 10.7 d |
| Branch no. | 8.3 ab | 5.6 c | 3.0 d | 9.0 a | 8.7 ab | 7.8 b | 0.0 e |
| Compactness (g cm$^{-1}$) | 0.33 a | 0.16 b | 0.06 c | 0.33 a | 0.33 a | 0.19 b | 0.04 c |
| Time to visible bud (d) | 15.3 b | 14.9 b | 15.6 ab | 14.9 b | 15.0 b | 14.9 b | 16.4 a |
| Time to flower (d) | 24.4 cd | 25.0 bd | 26.4 ab | 24.6 cd | 25.9 ac | 23.9 d | 26.9 a |
| Inflorescence no. | 60.6 a | 39.0 c | 17.4 d | 53.9 ab | 58.1 ab | 49.9 b | 10.7 d |
| Nodes under first flower no. | 7.9 bd | 6.9 cd | 8.8 ab | 7.9 bd | 8.2 bc | 6.6 d | 10.1 a |

FIG. 25

| Growth parameter | Glazing material | | | | | | |
|---|---|---|---|---|---|---|---|
| | ND91 | ND58 | ND33 | CO770 | CO700 | CO550a | CO550b |
| Shoot fresh mass (g) | 119 a | 108 a | 103 a | 116 a | 122 a | 115 a | 70 b |
| Shoot dry mass (g) | 12.5 a | 10.7 ab | 9.9 ab | 11.8 a | 11.7 a | 11.4 a | 7.0 b |
| Fruit fresh mass (g) | 352 a | 182 c | 45 d | 263 b | 223 bc | 189 c | 36 d |
| Fruit dry mass (g) | 15.8 a | 9.6 b | 1.7 c | 13.0 ab | 12.3 ab | 10.5 b | 2.3 c |
| Total fruit no. | 31.1 a | 23.2 b | 6.4 c | 30.5 ab | 27.4 ab | 23.0 b | 5.6 c |
| Ripe fruit no. | 17.9 a | 4.9 bc | 0.6 cd | 8.5 b | 4.7 bd | 5.7 b | 0 d |
| Unripe fruit no. | 13.2 bc | 18.3 ab | 5.8 c | 22.0 ab | 22.7 a | 17.3 ab | 5.6 c |
| Leaf length (cm) | 20.7 a | 18.7 ab | 20.4 a | 17.1 b | 19.5 ab | 19.7 ab | 18.3 ab |
| Leaf width (cm) | 17.2 | 16.4 | 16.4 | 15.1 | 17.0 | 17.3 | 15.1 |
| Leaflet area (cm$^2$) | 159 a | 122 b | 125 ab | 111 b | 132 ab | 144 ab | 114 b |
| SPAD | 24.7 ab | 34.6 ab | 31.2 b | 35.0 ab | 35.8 a | 33.3 ab | 33.8 ab |
| PCA (cm$^2$) | 177 c | 291 ab | 382 a | 199 bc | 189 c | 237 bc | 293 ab |
| SLA (cm$^2$ g$^{-1}$) | 323 d | 372 bc | 367 ab | 551 d | 475 d | 446 c | 550 a |
| Stem length (cm) | 20.4 c | 29.8 bc | 44.6 a | 26.3 bc | 24.4 c | 28.6 bc | 35.7 ab |
| Stem diameter (mm) | 10.6 ab | 9.4 b | 9.2 b | 11.2 a | 10.9 ab | 9.9 ab | 7.4 c |
| Compactness (g cm$^{-1}$) | 0.61 a | 0.46 bc | 0.49 cd | 0.20 d | 0.37 ab | 0.40 b | 0.23 d |
| Flower time (d) | 39.1 b | 41.6 b | 50.7 a | 40.3 b | 42.1 b | 42.0 b | 55.1 a |

FIG. 26

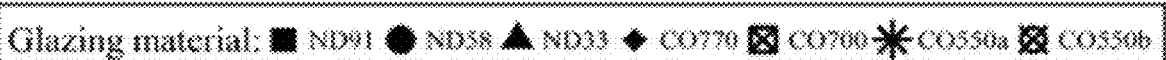
FIG. 27A
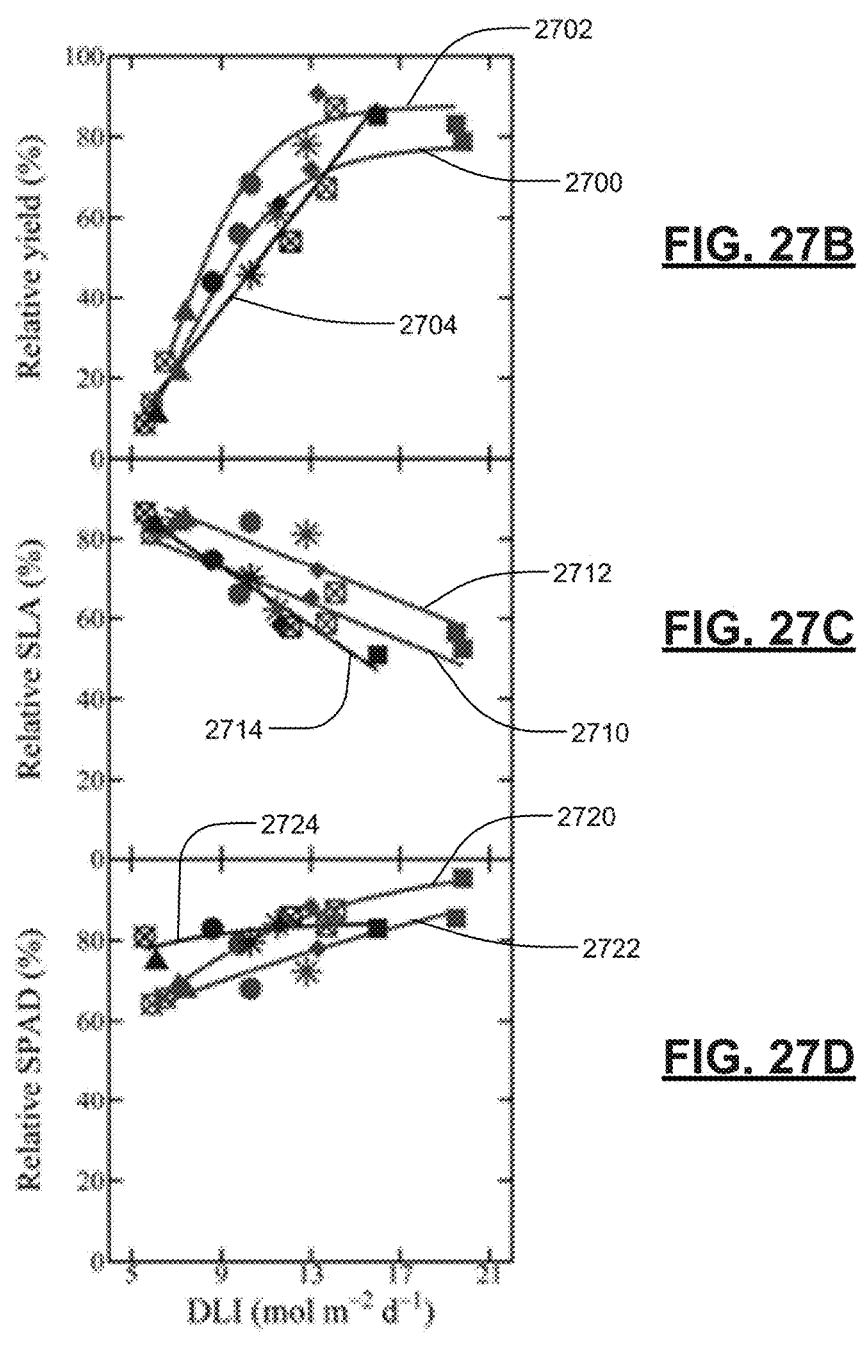
FIG. 27B
FIG. 27C
FIG. 27D

| TPV Efficiency (%) | Greenhouse energy output (TWh/year) | Farmland energy output (TWh/year) |
|---|---|---|
| 1 | 0.6 | 600 |
| 2 | 1 | 1200 |
| 5 | 3 | 3000 |
| 10 | 6 | 6000 |
| 15 | 10 | 9000 |

FIG. 28

Glazing material: ND91 ⬤ ND58 ▲ ND33 ◆ CO770 ⊠ CO700 ✳ CO550a ⊠ CO550b

| Glazing material | Air temperature (°C) | | | DLI (mol m⁻² d⁻¹) | | |
|---|---|---|---|---|---|---|
| | Basil | Petunia | Tomato | Basil | Petunia | Tomato |
| ND91 | 24.9 ± 2.2 | 26.6 ± 1.8 | 23.5 ± 2.1 | 19.8 ± 9.0 | 19.5 ± 7.0 | 16.0 ± 7.6 |
| ND58 | 24.7 ± 2.0 | 26.9 ± 1.8 | 23.6 ± 2.5 | 9.8 ± 4.2 | 10.3 ± 3.6 | 8.6 ± 4.3 |
| ND33 | 24.8 ± 2.2 | 26.7 ± 1.8 | 23.5 ± 2.3 | 7.1 ± 3.3 | 7.4 ± 2.7 | 6.1 ± 2.8 |
| CO770 | 24.8 ± 2.0 | 26.7 ± 1.8 | 23.6 ± 2.1 | 13.0 ± 5.8 | 13.3 ± 4.7 | 11.6 ± 5.5 |
| CO700 | 24.1 ± 2.0 | 25.7 ± 1.5 | 23.0 ± 2.1 | 13.7 ± 6.0 | 14.1 ± 4.9 | 12.1 ± 5.8 |
| CO550a | 24.9 ± 2.1 | 27.1 ± 1.8 | 23.9 ± 2.4 | 11.5 ± 5.0 | 12.8 ± 4.4 | 10.3 ± 4.8 |
| CO550b | 24.3 ± 2.0 | 26.3 ± 1.6 | 23.5 ± 2.2 | 5.9 ± 2.6 | 6.5 ± 2.2 | 5.6 ± 2.7 |

FIG. 31

| Growth parameter | Glazing material: | | | | | | | |
|---|---|---|---|---|---|---|---|---|
| | ND91 | CO850 | CO770 | CO700 | ND58 | CO575 | CO475 | ND33 |
| Fresh mass (g) | 80 a | 77 ac | 78 ab | 70 cd | 59 e | 72 bd | 67 d | 41 f |
| Dry mass (g) | 3.2 a | 3.2 a | 3.3 a | 2.8 b | 2.5 c | 2.8 b | 2.8 b | 1.7 d |
| Leaf number (no.) | 20 ac | 19 bc | 20 ab | 21 a | 17 d | 18 c | 16 d | 16 d |
| Leaf length (cm) | 17 cd | 17 d | 17 d | 17 d | 19 c | 19 d | 21 b | 22 a |
| Leaf width (cm) | 20 a | 18 ac | 19 ac | 17 bc | 18 bc | 19 ab | 18 ac | 15 d |
| L* | 42 ac | 42 ac | 41 ac | 41 bc | 44 ab | 44 a | 43 ac | 41 c |
| a* | −4.6 ac | −4.0 ab | −3.5 a | −3.9 ab | −5.1 bc | −5.5 cd | −5.5 c | −6.7 d |
| b* | 19 bc | 19 bc | 18 c | 18 c | 22 ab | 24 a | 25 a | 24 a |
| SPAD | 19 ab | 18 ab | 18 ab | 19 a | 17 b | 17 b | 17 bc | 16 c |
| Total leaf area (cm²) | 1297 a | 1236 ac | 1237 ab | 1188 ac | 1091 c | 1142 bc | 1127 bc | 917 d |
| Projected canopy area (cm²) | 415 ab | 370 b | 397 ab | 354 b | 449 a | 421 ab | 452 a | 390 ab |
| SLA (cm² g⁻¹) | 713 ac | 688 bd | 662 bd | 726 ab | 759 ab | 613 d | 626 cd | 806 a |
| RUE (g mol⁻¹) | 0.13 a | 0.17 bc | 0.18 bc | 0.16 c | 0.16 c | 0.25 a | 0.19 b | 0.24 a |
| Compactness (g m⁻¹) | 14.0 ab | 14.8 a | 14.6 ab | 13.2 bc | 10.3 e | 12.3 cd | 11.9 d | 7.8 f |

FIG. 34

| Growth parameter | Glazing material | | | | | | | |
|---|---|---|---|---|---|---|---|---|
| | ND91 | CO850 | CO770 | CO700 | ND58 | CO575 | CO475 | ND33 |
| Fresh mass (g) | 36 b | 32 c | 41 a | 35 bc | 23 e | 27 d | 26 d | 15 f |
| Dry mass (g) | 4.9 ab | 4.4 c | 5.2 a | 4.5 bc | 2.9 e | 3.3 d | 3.4 d | 1.7 f |
| Leaf length (cm) | 5.3 bc | 5.1 c | 5.7 a | 5.6 ab | 5.2 bc | 5.4 ac | 5.4 ac | 5.1 c |
| Leaf width (cm) | 1.8 ab | 1.6 d | 1.9 a | 1.8 ab | 1.6 cd | 1.8 ad | 1.7 bd | 1.8 ad |
| SPAD | 31 ab | 32 a | 30 ab | 32 a | 29 bc | 27 d | 26 d | 27 cd |
| Flowers (no.) | 45 a | 35 b | 44 a | 34 b | 21 de | 26 cd | 27 c | 17 e |
| Time to visible bud (days) | 40 c | 40 bc | 40 c | 40 b | 40 bc | 40 bc | 40 bc | 42 a |
| Time to flower (days) | 50 c | 51 bc | 52 bc | 52 b | 52 b | 52 b | 51 bc | 54 a* |
| Stem length (cm) | 23.0 ab | 22.0 b | 24.1 a | 22.2 b | 21.2 b | 22.8 ab | 24.4 a | 21.2 b |
| Stem diameter (mm) | 4.2 b | 4.2 b | 4.7 a | 4.6 a | 4.0 b | 3.8 bc | 3.4 d | 3.5 cd |
| Projected canopy area (cm²) | 235 bc | 205 cd | 271 a | 225 bc | 186 d | 238 b | 212 bd | 181 d |
| SLA (cm² g⁻¹) | 510 e | 499 e | 535 gg | 542 de | 598 cd | 659 b | 607 bc | 743 a |
| RUE (g mol⁻¹) | 0.27 e | 0.32 de | 0.35 cd | 0.28 e | 0.42 ab | 0.43 a | 0.38 bc | 0.45 a |
| Compactness (g m⁻²) | 21.5 ab | 20.2 b | 21.9 a | 20.3 ab | 13.8 c | 14.8 c | 14.2 c | 8.0 d |

FIG. 35

| Growth parameter | Glazing material | | | | | | | |
|---|---|---|---|---|---|---|---|---|
| | ND91 | CO850 | CO770 | CO700 | ND58 | CO575 | CO475 | ND33 |
| Fresh mass (g) | 11.7 a | 9.97 b | 8.64 bc | 8.29 c | 4.44 d | 5.83 d | 5.68 d | 1.31 e |
| Dry mass (g) | 0.94 a | 0.83 ab | 0.74 bc | 0.63 c | 0.37 d | 0.39 e | 0.47 d | 0.11 f |
| Node number (no.) | 5.13 a | 5.20 a | 4.74 ab | 4.33 b | 3.90 c | 4.40 b | 4.27 bc | 3.83 d |
| Leaf length (cm) | 13.8 a | 12.9 ac | 13.2 ab | 13.0 ab | 10.6 d | 11.9 bc | 11.7 cd | 6.8 e |
| Leaf width (cm) | 8.52 a | 8.04 ac | 8.67 a | 8.19 ab | 7.27 c | 8.12 ab | 7.62 bc | 4.60 d |
| L* | 39.4 de | 39.4 de | 38.8 e | 44.2 b | 41.8 c | 39.4 de | 40.8 cd | 47.8 a |
| a* | -9.08 a | -9.20 a | -9.04 a | -9.96 cd | -9.75 bc | -9.55 b | -9.68 bc | -10.25 d |
| b* | 19.8 de | 20.9 d | 18.9 e | 25.4 b | 24.4 bc | 23.7 c | 24.3 bc | 33.9 a |
| SPAD | 22.7 a | 21.4 ab | 21.7 ab | 21.0 b | 18.7 c | 18.4 c | 18.7 c | 15.8 d |
| Total leaf area (cm²) | 677 a | 550 b | 473 bc | 546 b | 258 d | 370 cd | 340 d | 122 e |
| Stem length (cm) | 30.2 a | 28.7 ab | 24.8 cd | 26.1 bc | 18.4 e | 21.6 de | 20.0 e | 10.6 f |
| Stem diameter (mm) | 4.23 a | 3.96 ab | 3.74 b | 3.71 b | 3.02 c | 3.09 c | 3.15 c | 1.93 d |
| SLA (cm² g⁻¹) | 596 e | 654 e | 674 de | 734 cd | 814 bc | 872 b | 747 cd | 1012 a |
| RUE (g mol⁻¹) | 0.102 e | 0.133 de | 0.140 cd | 0.107 de | 0.219 b | 0.118 de | 0.171 c | 0.268 a |
| Compactness (g m⁻¹) | 7.70 a | 7.09 a | 7.07 a | 5.70 b | 4.49 c | 2.88 d | 3.42 bc | 2.38 d |

FIG. 36

| Growth parameter | Glazing material | | | | | | | |
|---|---|---|---|---|---|---|---|---|
| | ND91 | CO850 | CO770 | CO700 | ND58 | CO575 | CO475 | ND33 |
| Fresh mass (g) | 13.1 a | 12.0 ab | 13.4 a | 12.6 a | 8.8 c | 11.1 b | 10.9 b | 6.3 d |
| Dry mass (g) | 1.69 a | 1.53 ab | 1.656 a | 1.54 ab | 1.14 c | 1.39 b | 1.38 b | 0.80 d |
| Leaf length (cm) | 10.4 a | 10.8 a | 11.0 a | 10.7 a | 10.4 a | 10.9 a | 10.7 a | 8.9 b |
| Leaf width (cm) | 7.32 ac | 7.30 ac | 7.75 ab | 7.32 ac | 7.21 bc | 7.85 a | 7.61 ab | 6.84 c |
| Stem length (cm) | 34.8 cd | 38.2 cd | 36.9 cd | 41.3 c | 56.4 b | 41.2 c | 33.4 d | 70.7 a |
| Stem diameter (cm) | 3.86 a | 3.67 ac | 3.91 a | 3.70 ab | 3.0 d | 3.42 c | 3.49 bc | 2.45 e |
| SPAD | 31.2 a | 31.2 a | 30.2 ab | 31.3 a | 27.3 ab | 26.1 bc | 30.1 ab | 22.6 c |
| Total leaf area (cm$^2$) | 532 ab | 512 ab | 567 a | 527 ab | 412 c | 534 ab | 470 bc | 324 d |
| Projected canopy area (cm$^2$) | 146 ab | 144 ab | 140 ac | 102 cd | 108 bd | 143 ac | 174 a | 83 d |
| SLA (cm$^2$ g$^{-1}$) | 507 d | 552 d | 555 d | 566 cd | 689 b | 659 bc | 590 cd | 870 a |
| RUE (g mol$^{-1}$) | 0.34 d | 0.36 d | 0.49 cd | 0.56 bc | 0.72 b | 0.67 b | 0.49 cd | 1.15 a |
| Compactness (g m$^{-1}$) | 4.88 a | 4.03 bc | 4.50 ab | 3.72 cd | 2.04 e | 3.40 d | 4.14 bc | 1.15 f |

FIG. 37

| Growth parameter | Glazing material: | | | | | | | |
|---|---|---|---|---|---|---|---|---|
| | ND91 | CO850 | CO770 | CO700 | ND58 | CO575 | CO475 | ND33 |
| Fresh mass (g) | 7.35 a | 5.91 b | 7.25 a | 7.60 a | 6.10 b | 5.41 b | 5.78 b | 2.16 c |
| Dry mass (mg) | 622 a | 433 b | 567 a | 624 a | 433 b | 402 b | 432 b | 139 c |
| Node number (no.) | 5.12 ab | 4.72 bc | 5.07 ab | 5.34 a | 4.88 bc | 4.53 c | 4.60 c | 3.73 d |
| Leaf length (cm) | 10.9 a | 10.2 ab | 11.0 a | 10.3 ab | 10.5 ab | 10.0 bc | 9.3 c | 6.8 d |
| Leaf width (cm) | 8.78 a | 8.63 ab | 9.10 a | 8.86 a | 8.90 a | 8.51 ab | 8.03 b | 5.37 c |
| L* | 38.1 b | 37.4 b | 37.1 b | 38.0 b | 37.9 b | 37.4 b | 37.0 b | 43.4 a |
| a* | -8.62 a | -8.79 a | -8.80 a | -8.66 a | -9.19 b | -8.88 ab | -8.71 a | -10.06 c |
| b* | 19.0 cd | 19.6 cd | 18.8 d | 18.5 d | 21.2 b | 20.5 bc | 18.7 bcd | 28.7 a |
| Chlorophyll content ($\mu$mol m$^{-2}$) | 221 abc | 238 ab | 212 abc | 239 ab | 189 cd | 249 a | 204 bcd | 168 d |
| Total leaf area (cm$^2$) | 152 abc | 128 cd | 169 a | 159 ab | 135 bcd | 121 d | 130 cd | 51.7 a |
| Stem length (cm) | 20.4 ab | 17.7 bc | 19.8 ab | 21.4 a | 18.9 abc | 15.9 c | 18.0 abc | 10.4 d |
| Stem diameter (mm) | 3.66 a | 3.53 ab | 3.57 ab | 3.60 a | 3.47 ab | 3.45 ab | 3.36 b | 2.31 c |
| SLA (cm$^2$ g$^{-1}$) | 475 cd | 532 bc | 528 bc | 457 d | 642 a | 556 b | 524 bc | 701 a |
| RUE (g mol$^{-1}$) | 1.24 a | 1.18 a | 1.20 a | 1.26 a | 1.12 a | 1.06 a | 1.25 a | 0.73 b |
| Compactness (g m$^{-1}$) | 3.06 a | 2.43 b | 2.88 a | 2.94 a | 2.26 b | 2.50 b | 2.41 b | 1.32 c |

FIG. 39

| Growth parameter | Glazing material | | | | | | | |
| --- | --- | --- | --- | --- | --- | --- | --- | --- |
| | ND91 | CO850 | CO770 | CO700 | ND58 | CO575 | CO475 | ND33 |
| Fresh fruit (no.) | 15.2 b | 15.5 b | 19.4 a | 18.8 a | 15.5 b | 12.9 bc | 13.0 bc | 11.8 c |
| Branch (no.) | 3.50 a | 2.50 b | 3.30 a | 3.45 a | 2.30 b | 2.35 b | 2.00 b | 0.50 c |
| Stem diameter (cm) | 5.02 b | 4.38 c | 3.89 d | 4.48 c | 3.97 d | 5.59 a | 4.65 c | 2.67 e |

FIG. 40

| PTB7-Th Thickness (nm) | APT (%) | $J_{SC}$ (mA cm$^{-2}$) | $V_{OC}$ (V) | FF | PCE (%) | LUE* |
|---|---|---|---|---|---|---|
| 5 | 47.7 | 1.7 | 0.29 | 0.34 | 0.17 | 0.08 |
| 10 | 45.1 | 5.4 | 0.694 | 0.51 | 1.9 | 0.86 |
| 20 | 39.5 | 14.8 | 0.701 | 0.63 | 6.5 | 2.57 |
| 40 | 32.8 | 19.6 | 0.702 | 0.61 | 8.4 | 2.76 |
| 60 | 26.1 | 20.4 | 0.702 | 0.54 | 7.7 | 2.01 |
| 85 | 19.8 | 16.9 | 0.696 | 0.42 | 4.9 | 0.97 |

FIG. 42

| Composition | APT (%) | SHGC* | $J_{SC}$ (mA cm$^{-2}$) | $V_{OC}$ (V) | FF | PCE (%) | LUE* |
|---|---|---|---|---|---|---|---|
| NC 2mg/mL | 79.8 | 0.79 | -1.216 | 1.00 | 0.836 | 1.01 | 0.80 |
| NC 5mg/mL | 80.1 | 0.79 | -1.556 | 1.01 | 0.836 | 1.31 | 1.05 |
| NC 20mg/mL | 66.3 | 0.67 | -2.096 | 1.02 | 0.843 | 1.80 | 1.19 |
| NC 40mg/mL | 65.6 | 0.67 | -1.924 | 1.01 | 0.841 | 1.64 | 1.08 |
| NC 80+40 mg/mL | 44.4 | - | - | - | - | - | - |
| NC2 COi 0.075mg/mL | 70.9 | 0.73 | -1.136 | 1.00 | 0.834 | 0.95 | 0.67 |
| NC5 COi 0.075mg/mL | 61.0 | 0.64 | -1.624 | 1.01 | 0.841 | 1.38 | 0.84 |
| NC5 COi 0.15mg/mL | 61.2 | 0.65 | -1.644 | 1.01 | 0.818 | 1.36 | 0.83 |

FIG. 44

| Composition | APT (%) | SHGC* | $J_{SC}$ (mA cm$^{-2}$) | $V_{OC}$ (V) | FF | PCE (%) | LUE* |
|---|---|---|---|---|---|---|---|
| COi 0.075mg/mL | 68.5 | 0.73 | -0.552 | 0.98 | 0.822 | 0.44 | 0.29 |
| COi 0.15mg/mL | 61.8 | 0.68 | -0.644 | 0.98 | 0.826 | 0.52 | 0.32 |
| IR775 TPFB 0.2mg/mL | 70.7 | 0.69 | -0.460 | 0.97 | 0.823 | 0.37 | 0.26 |
| IR775 0.3mg/mL | 65.1 | 0.65 | -0.536 | 0.97 | 0.829 | 0.43 | 0.28 |
| Cy 0.2mg/mL | 76.9 | 0.70 | -0.480 | 0.97 | 0.820 | 0.38 | 0.29 |
| Cy 0.3mg/mL | 76.2 | 0.68 | -0.448 | 0.97 | 0.825 | 0.36 | 0.27 |

FIG. 45

| Composition | APT (%) | SHGC* | $J_{SC}$ (mA cm$^{-2}$) | $V_{OC}$ (V) | FF | PCE (%) | LUE* |
|---|---|---|---|---|---|---|---|
| COi 0.075mg/mL | 68.5 | 0.73 | -0.98 | 0.45 | 0.579 | 0.25 | 0.17 |
| COi 0.15mg/mL | 61.8 | 0.68 | -0.89 | 0.45 | 0.574 | 0.23 | 0.14 |
| IR775 TPFB 0.2mg/mL | 70.7 | 0.69 | -0.76 | 0.43 | 0.566 | 0.18 | 0.13 |
| IR775 0.3mg/mL | 65.1 | 0.65 | -0.78 | 0.42 | 0.565 | 0.19 | 0.12 |
| Cy 0.2mg/mL | 76.9 | 0.70 | -0.756 | 0.42 | 0.567 | 0.18 | 0.14 |
| Cy 0.3mg/mL | 76.2 | 0.68 | -0.628 | 0.41 | 0.556 | 0.14 | 0.11 |
| NC 2mg/mL | 79.8 | 0.79 | -0.516 | 0.42 | 0.56 | 0.12 | 0.10 |
| NC 5 mg/mL | 80.1 | 0.79 | -0.788 | 0.40 | 0.55 | 0.17 | 0.14 |
| NC 20mg/mL | 66.3 | 0.67 | -0.1232 | 0.47 | 0.59 | 0.34 | 0.22 |

FIG. 46

| Composition | APT (%) | SHGC* | $J_{SC}$ (mA cm$^{-2}$) | $V_{OC}$ (V) | FF | PCE (%) | LUE* |
|---|---|---|---|---|---|---|---|
| COi 0.075mg/mL | 32.9 | 0.20 | -1.012 | 0.45 | 0.580 | 0.26 | 0.08 |
| COi 0.15mg/mL | 30.0 | 0.19 | -1.228 | 0.46 | 0.585 | 0.33 | 0.10 |
| IR775 TPFB 0.2mg/mL | 34.0 | 0.20 | -0.800 | 0.42 | 0.57 | 0.19 | 0.06 |
| IR775 0.3mg/mL | 31.6 | 0.18 | -0.836 | 0.42 | 0.56 | 0.20 | 0.06 |
| Cy 0.2mg/mL | 36.8 | 0.21 | -0.766 | 0.42 | 0.56 | 0.18 | 0.07 |
| Cy 0.3mg/mL | 36.7 | 0.20 | -0.66 | 0.41 | 0.56 | 0.15 | 0.05 |
| NC 2mg/mL | 37.9 | 0.23 | -0.576 | 0.42 | 0.57 | 0.14 | 0.05 |
| NC 5mg/mL | 38.1 | 0.23 | -0.912 | 0.45 | 0.58 | 0.24 | 0.09 |
| NC 20mg/mL | 31.5 | 0.18 | -0.145 | 0.48 | 0.59 | 0.41 | 0.13 |
| NC 40mg/mL | 31.0 | 0.18 | - | - | - | - | - |

FIG. 48

| Composition | APT (%) | SHGC* | $J_{SC}$ (mA cm$^{-2}$) | $V_{OC}$ (V) | FF | PCE (%) | LUE* |
|---|---|---|---|---|---|---|---|
| COi 0.075mg/mL | 55.1 | 0.50 | -1.112 | 0.45 | 0.58 | 0.29 | 0.15 |
| COi 0.15mg/mL | 49.8 | 0.47 | -1.156 | 0.45 | 0.58 | 0.30 | 0.15 |
| IR775 TPFB 0.2mg/mL | 56.9 | 0.48 | -0.760 | 0.42 | 0.57 | 0.18 | 0.10 |
| IR775 0.3mg/mL | 52.5 | 0.44 | -0.808 | 0.42 | 0.56 | 0.19 | 0.10 |
| Cy 0.2mg/mL | 61.8 | 0.49 | -0.94 | 0.41 | 0.50 | 0.19 | 0.12 |
| Cy 0.3mg/mL | 61.4 | 0.48 | -0.648 | 0.40 | 0.56 | 0.14 | 0.08 |
| NC 2mg/mL | 64.1 | 0.55 | -0.556 | 0.42 | 0.56 | 0.13 | 0.08 |
| NC 5mg/mL | 64.3 | 0.55 | -0.924 | 0.45 | 0.59 | 0.24 | 0.15 |
| NC 20mg/mL | 53.2 | 0.46 | -1.304 | 0.47 | 0.59 | 0.36 | 0.19 |
| NC 40mg/mL | 52.6 | 0.46 | - | - | - | - | - |
| NC 60mg/mL | 40.1 | 0.36 | - | - | - | - | - |

FIG. 49

TRANSPARENT SOLAR CELLS FOR AGRIVOLTAICS

CROSS-REFERENCE TO RELATED APPLICATIONS

This application is a continuation of PCT International Patent Application No. PCT/US2022/039604, filed on Aug. 5, 2022, which claims priority to U.S. Provisional Application No. 63/230,319, filed on Aug. 6, 2021. The entire disclosures of the above applications are incorporated herein by reference.

GOVERNMENT RIGHTS

This invention was made with government support under 1702591 awarded by the National Science Foundation. The government has certain rights in the invention.

FIELD

The present disclosure relates to transparent solar panels for use photosynthetic organisms, such as plants including transparent over photovoltaics (TPV) and transparent luminescent solar concentrators (TLSC).

BACKGROUND

This section provides background information related to the present disclosure which is not necessarily prior art.

Incorporating building-integrated photovoltaics (BIPV) with agriculture offers a practical solution to address both increased food insecurity and energy demand. Agrivoltaics is the utilization of sunlight for both plant production and solar energy harvesting. These two fields are often seen as competitive rather than cooperative because they can both occupy large areas of land to increase or maximize sunlight utilization. Despite this, photovoltaics have potential synergistic benefits with greenhouse and open-field agricultural crop production.

SUMMARY

This section provides a general summary of the disclosure, and is not a comprehensive disclosure of its full scope or all of its features.

In at least one example embodiment, the current technology provides a transparent solar panel. The transparent solar panel includes a transparent photovoltaic (TPV) or a transparent luminescent solar concentrator (TLSC). The TPV or TLSC is configured to selectively absorb and transmit light based on wavelength. The TPV or TLSC is configured to be placed between one or more photosynthetic organisms (e.g., plants) and a light source (e.g., the sun).

At least one example embodiment relates to a transparent solar panel.

In at least one example embodiment, the transparent solar panel includes a transparent substrate and a transparent photoactive material. An average photosynthetic transmittance (APT) of the entire transparent solar panel is greater than or equal to about 45%. The transparent solar panel is configured to transmit light to a region containing a plant at a daily light integral (DLI) of greater than or equal to about $10 \text{ mol} \cdot \text{m}^{-2} \cdot \text{d}^{-1}$.

In at least one example embodiment, the transparent solar panel is a transparent photovoltaic (TPV). The TPV includes a first transparent electrode, the transparent photoactive material, and a second transparent electrode. The first transparent electrode is on the transparent substrate. The transparent photoactive material is between the first transparent electrode and the second transparent electrode.

In at least one example embodiment, the transparent solar panel is a transparent luminescent solar concentrator (TLSC). The TLSC includes the transparent substrate, a luminophore, and a photovoltaic device. The transparent substrate includes a first surface, a second surface opposite the first surface, and an edge surface. The luminophore is configured to absorb light at within a first wavelength range and emit light within a second wavelength range. The luminophore is (i) embedded in the transparent substrate, (ii) in a layer on the first surface, the second surface or both the first surface and the second surface, or (iii) both (i) and (ii). The photovoltaic device is coupled to the edge surface. The photovoltaic device is configured to absorb light within the second wavelength range. In at least one example embodiment, the transparent solar panel has an APT of greater than or equal to about 65%.

In at least one example embodiment, the transparent solar panel is configured to transmit light to the region is at an extended daily light integral (eDLI) of greater than or equal to about $12 \text{ mol} \cdot \text{m}^{-2} \cdot \text{d}^{-1}$.

In at least one example embodiment, the transparent solar panel is configured to transmit light to the region is at a yield photon flux density (YPFD) of greater than or equal to about $9 \text{ mol} \cdot \text{m}^{-2} \cdot \text{d}^{-1}$.

In at least one example embodiment, the transparent photoactive material has a peak absorbance of less than about 450 nm or greater than about 725 nm.

In at least one example embodiment, the transparent photoactive material has a wavelength cutoff of 700 nm.

In at least one example embodiment, the entire transparent solar panel is greater than or equal to about 65% transparent to light at a wavelength of 470 nm.

In at least one example embodiment, the entire transparent solar panel is greater than or equal to about 65% transparent to light at a wavelength of 530 nm.

In at least one example embodiment, the entire transparent solar panel is greater than or equal to about 65% transparent to light at all wavelengths of 500-550 nm.

In at least one example embodiment, the entire transparent solar panel is greater than or equal to about 65% transparent to light at a wavelength of 620 nm.

In at least one example embodiment, the entire transparent solar panel is greater than or equal to about 65% transparent to light at all wavelengths of 550-650 nm.

In at least one example embodiment, the transparent solar panel has a solar heat gain coefficient (SHGC) of less than or equal to about 0.5.

In at least one example embodiment, the transparent solar panel has a power conversion efficiency (PCE) of greater than or equal to about 0.9%.

In at least one example embodiment, the transparent solar panel has a light utilization efficiency (LUE*) that is a product of a power conversion efficiency (PCE) of the transparent solar panel and an average photosynthetic transmittance (APT) of the transparent solar panel. The LUE* is greater than or equal to about 1%.

In at least one example embodiment, the transparent solar panel is bifacial.

In at least one example embodiment, the solar panel further includes a frame. The frame at least partially surrounds the transparent substrate. A color of the frame has an R, G, B decimal code. R is greater than or equal to about 150 to less than or equal to about 255. G is greater than or equal to about 150 to less than or equal to about 255. B is greater than or equal to about 150 to less than or equal to about 255.

At least one example embodiment relates to an agricultural field array.

In at least one example embodiment, the agricultural field array includes a support structure the transparent solar panel. The transparent solar panel is coupled to the support structure.

At least one example embodiment relates to a structure.

In at least one example embodiment, the structure includes a side wall and a roof. At least one of the side wall and the roof includes the transparent solar panel. The structure is fully enclosed.

At least one example embodiment relates to an agricultural assembly. The agricultural assembly includes a piece of agricultural equipment and the transparent solar panel. The transparent solar panel is coupled to the piece of equipment.

In at least one example embodiment, the piece of agricultural equipment is selected from an irrigation system, a fertilizer system, a seeding system, a harvesting system, a $CO_2$ enrichment system, or a combination thereof.

At least one example embodiment relates to an agricultural field array. The agricultural field array includes a plurality of transparent solar panels and a support structure. Each of the plurality of transparent solar panels includes a transparent substrate, and a transparent photoactive material. The support structure supports the plurality of transparent solar panels to be configured to transmit light to a field region containing a plant. An average photosynthetic transmittance (APT) of each of the plurality of transparent solar panels is greater than or equal to about 45%.

In at least one example embodiment, the plurality of transparent solar panels defines a linear array.

In at least one example embodiment, the transparent substrate defines a planar first surface. An angle between the planar first surface and a second surface of the field region is fixed.

In at least one example embodiment, the angle is about 90°.

In at least one example embodiment, the angle is about 0°.

In at least one example embodiment, the angle is within about 5° of a latitude at which the agricultural field array is disposed.

In at least one example embodiment, the transparent substrate defines a planar first surface. An angle between the planar first surface and a second surface of the field region is adjustable. The angle is configured to track a position of the sun.

In at least one example embodiment, the agricultural field array defines a height between a surface defining the field region and a closest edge of the plurality of transparent solar panels of greater than or equal to about 4.5 m.

In at least one example embodiment, the agricultural field array further includes a plurality of support structures including the support structure. Each of the plurality of support structures includes a portion of the plurality of transparent solar panels. Each of the plurality of support structures being spaced apart from other of the plurality of support structures by a distance of greater than or equal to about 10 feet to less than or equal to about 100 feet.

In at least one example embodiment, each of the plurality of transparent solar panels is spaced by a distance of greater than or equal to about 2 mm to less than or equal to about 10 cm.

At least one example embodiment relates to a photovoltaic (PV) and irrigation system.

In at least one example embodiment, the PV and irrigation system includes a transparent solar panel, a support structure, electrical wiring, and tubing. The transparent solar panel includes a transparent substrate and a wavelength selective transparent photoactive material. The support structure supports the transparent solar panel to be configured to transmit light to a field region containing a plant. The support structure defines an interior region. The electrical wiring is at least partially within the interior region. The tubing is coupled to the support structure. The tubing defines a conduit configured to transfer water from a water source to the plant.

In at least one example embodiment, the support structure includes a partition in the interior region. The partition divides the interior region into a first portion and a second portion. The electrical wiring is at least partially within the first portion. The tubing is at least partially within the second portion.

At least one example embodiment relates to method of photovoltaic power generation.

In at least one example embodiment, the method includes installing a wavelength-selective transparent solar panel such that the wavelength-selective transparent solar panel transmits light within a first wavelength range to a region containing a photosynthetic organism. The method further includes producing power by absorbing light within a second wavelength range.

In at least one example embodiment, the photosynthetic organism is a plant. A crop yield of the plant grown under the light within the first wavelength range transmitted by the wavelength-selective transparent solar panel is reduced by less than or equal to 25% compared to a plant grown under full spectrum light in otherwise identical conditions.

In at least one example embodiment, the plant is a fruit-bearing plant. An average photosynthetic transmittance (APT) of the entire transparent solar panel is greater than or equal to about 65%. The wavelength-selective transparent solar panel is configured to transmit light at a daily light integral of 15 mol·m$^{-2}$·d$^{-1}$.

In at least one example embodiment, the plant is a leafy plant or a grain plant. An average photosynthetic transmittance (APT) of the entire transparent solar panel is greater than or equal to about 45%. The wavelength-selective transparent solar panel is configured to transmit light at a daily light integral of 10 mol·m$^{-2}$·d$^{-1}$.

In at least one example embodiment, the method further includes, prior to the installing, determining a fixed angle defined between a first surface of the transparent solar panel and a second surface of the region based on latitude.

In at least one example embodiment, the installing includes installing a plurality of transparent solar panels including the transparent solar panel. The method further comprises determining a spacing between the plurality of transparent solar panels based on reduction or minimization of shadow during midday solstice, water penetration between adjacent transparent solar panels, or a combination thereof.

In at least one example embodiment, the region includes land.

In at least one example embodiment, the region includes water.

At least one example embodiment relates to a method of making a transparent solar panel for use in a region containing a plant.

In at least one example embodiment, the method includes determining a daily light integral (DLI) to achieve a desired characteristic of the plant. The method further includes selecting a photoactive material compatible with the DLI. The method further includes constructing the transparent solar panel including the photoactive material. The transparent solar panel is configured to transmit light to the region containing the plant.

In at least one example embodiment, the method further includes prior to the constructing, selecting materials for the transparent solar panel to achieve a desired solar heat gain coefficient (SHGC).

In at least one example embodiment, the transparent solar panel is a transparent luminescent solar concentrator (TLSC) and the photoactive material is a luminophore. The method further includes determining a concentration of the luminophore compatible with the DLI.

In at least one example embodiment, the transparent solar panel is a transparent photovoltaic (TPV). The method further includes determining a thickness of the active layer, the entire TPV, or both the active layer and the TPV, such that the thickness is compatible with the DLI.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 1A is a graph depicting solar photon flux and relative plant action as a function of wavelength (nm) according to at least one example embodiment.

FIG. 1B is a schematic of the design of solar concentrator plates to modulate the neutral density and wavelength selective transmission to plants according to at least one example embodiment. A focus of at least this example embodiment is to look at plant growth and productivity as a function of cutoffs of VIS and near infra-red wavebands and of overall transmission using neutral-density treatments. The horizontal lines represents shifting the DLI with a neutral density absorption profile that can shift up or down. The vertical line represents shifting a wavelength selective absorption profile left/right that can alternatively shift the DLI. Once the selective absorption is shifted far enough into the IR it no longer shifts the DLI.

FIG. 2 is a schematic illustration of a transparent photovoltaic (TPV) in accordance with at least one example embodiment.

FIGS. 3A-3B are schematic illustrations of a transparent luminescent solar concentrator (TLSC) in accordance with at least one example embodiment. FIG. 3A depicts the TLSC. FIG. 3B shows light interacting with the TLSC of FIG. 3A in accordance with at least one example embodiment.

FIG. 4 is a schematic illustration of an enclosed structure including a transparent solar panel, the structure including an interior region for growing photosynthetic organisms, such as plants, according to at least one example embodiment.

FIGS. 5A-5B are schematic illustrations of configuring flat transparent solar panels over photosynthetic organisms, such as plants, in land or water according to at least one example embodiment. FIG. 5A is a front top perspective view of a fixed angle horizontal array. FIG. 5B is a side schematic view of the fixed angle horizontal array of FIG. 5A.

FIGS. 6A-6B are schematic illustrations of configuring fixed angle transparent solar panels over photosynthetic organisms, such as plants, in land or water according to at least one example embodiment. FIG. 6A is a front view of a fixed angle array. FIG. 6B is a side schematic view of a fixed angle array of FIG. 6A.

FIGS. 7A-7B are schematic illustrations of configuring fixed angle, single-pole support, transparent solar panels over photosynthetic organisms, such as plants, in land or water according to at least one example embodiment. FIG. 7A is a front view of a plurality of pole assemblies. FIG. 7B is a side schematic view of a single one of the pole assemblies of FIG. 7A.

FIGS. 8A-8B are schematic illustrations of configuring fixed angle vertical transparent solar panels over photosynthetic organisms, such as plants, in land or water according to at least one example embodiment. FIG. 8A is a front view of a vertical pole assembly. FIG. 8B is a side schematic view of the vertical pole assembly of FIG. 8A.

FIGS. 9A-9B are schematic illustrations of configuring three-axis tracking transparent solar panel assemblies over photosynthetic organisms, such as plants, in land or water according to at least one example embodiment. FIG. 9A depicts an assembly in a first orientation. FIG. 9B depicts the assembly of FIG. 9A in a second orientation different from the first orientation.

FIG. 10 is a schematic illustration of a bifacial transparent solar array ground mount that harvests solar albedo according to at least one example embodiment.

FIGS. 11A-11B are schematic illustrations of a transparent solar array integrated with an irrigation (spray) system. FIG. 11A is a perspective view of the system. FIG. 11B is a detail view of a support of the system of FIG. 11A.

FIG. 13 is a flowchart illustrating a method of photovoltaic power generation according to at least one example embodiment.

FIG. 14 is a flowchart illustrating a method of designing and making a transparent solar panel is provided.

Figures 16A, 16B:
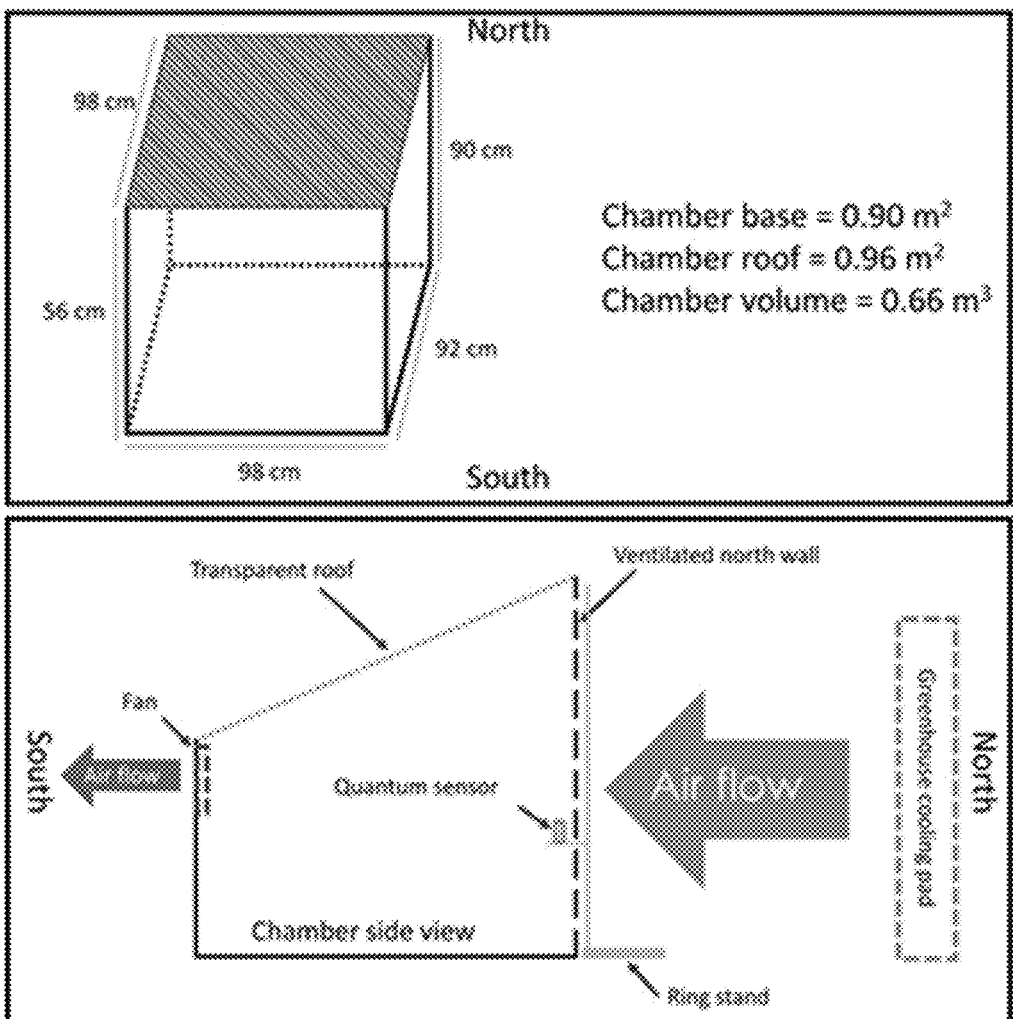

FIGS. 16A-16B relate to experimental chamber design and dimension according to at least the embodiments of Example 1. FIG. 16A is a schematic illustration showing experimental chamber dimensions. FIG. 16B is a schematic illustration showing greenhouse orientation.

Figures 17A, 17B:

FIGS. 17A-17B are visual representations of glazing materials and chambers inside a greenhouse according to according to at least the embodiments of Example 1. FIG. 17A is a schematic showing the different materials used. "ND" stands for neutral density profile and "CO" stands for the wavelength selective cutoff. ND91 (91% transmission, clear), ND58 (58% transmission, light grey), and ND33 (33% transmission, dark grey) were acrylic sheets with different PPFD transmissions. CO770 (clear), CO700 (light blue), and CO550b (dark blue) were experimental wavelength selective photoactive layers (e.g. TLSC) with different transmission cutoffs. The CO550a (pink/red) panel contained a fluorophore dye that absorbed blue and green photons and fluoresced red and far-red photons. FIG. 17B is a photograph showing experimental chambers that were roofed the various experimental glazing materials inside a Michigan State University research greenhouse.

Figures 18A, 18B, 18C:
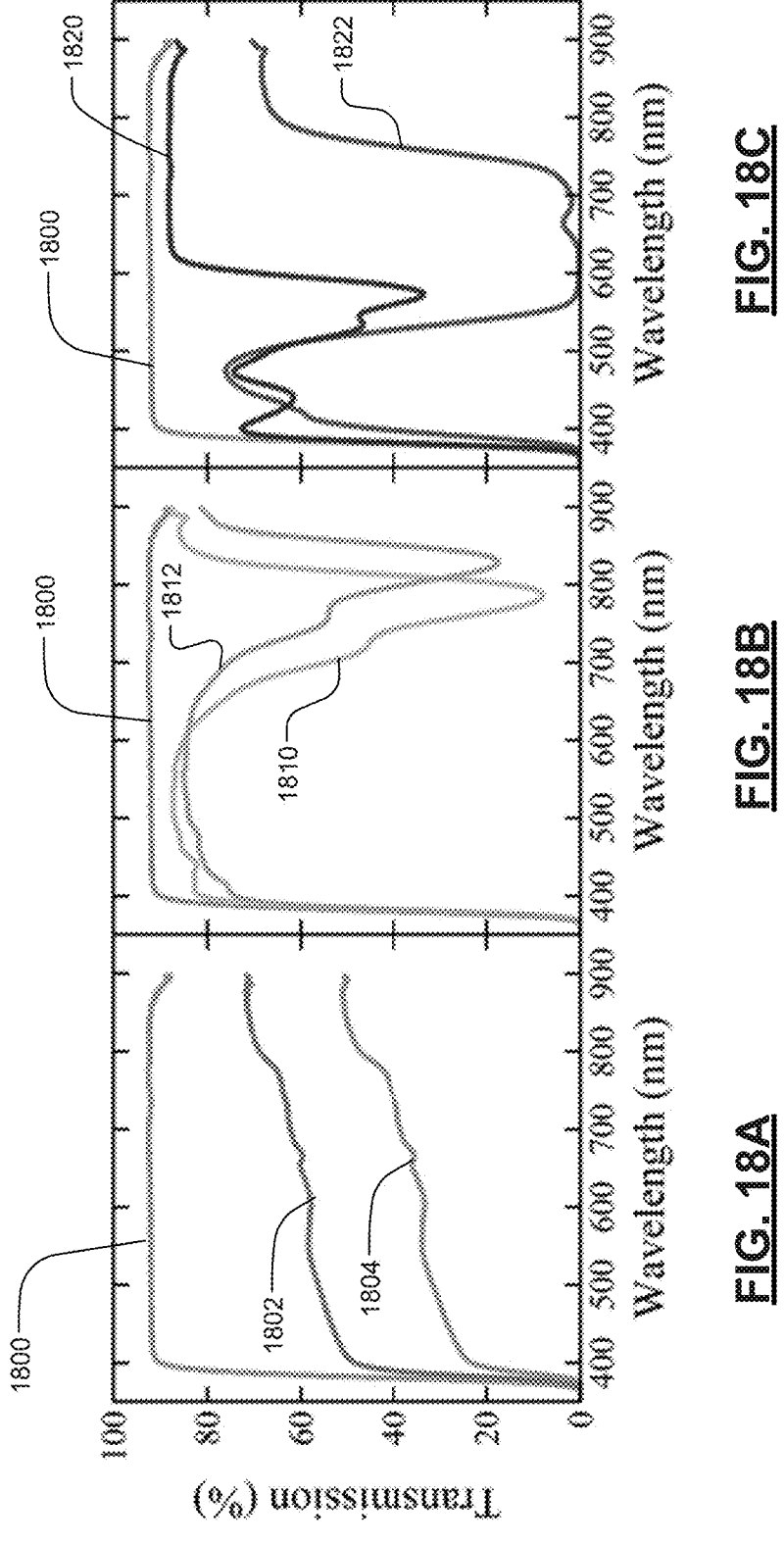

FIGS. 18A-18C are graphs depicting transmitted photon spectra of various wavelength-selective (also referred to as photoselective) and neutral absorbing glazing materials according to at least the embodiments of Example 1. The wavelength-selective glazing materials have different wavelength transmission cutoffs in the PAR (photons between 400 nm and 700 nm) and the near-infrared (NIR) wavebands. Measurements were made inside chambers covered with various glazing materials with different spectral transmissions on a clear day around solar noon. FIG. 16A illustrates ND91 (91% transmission), ND58 (58% transmission), and ND33 (33% transmission). FIG. 16B illustrates CO770, CO700. FIG. 16C illustrates CO550a and CO550b.

Figures 19F, 19G, 19H, 19I:
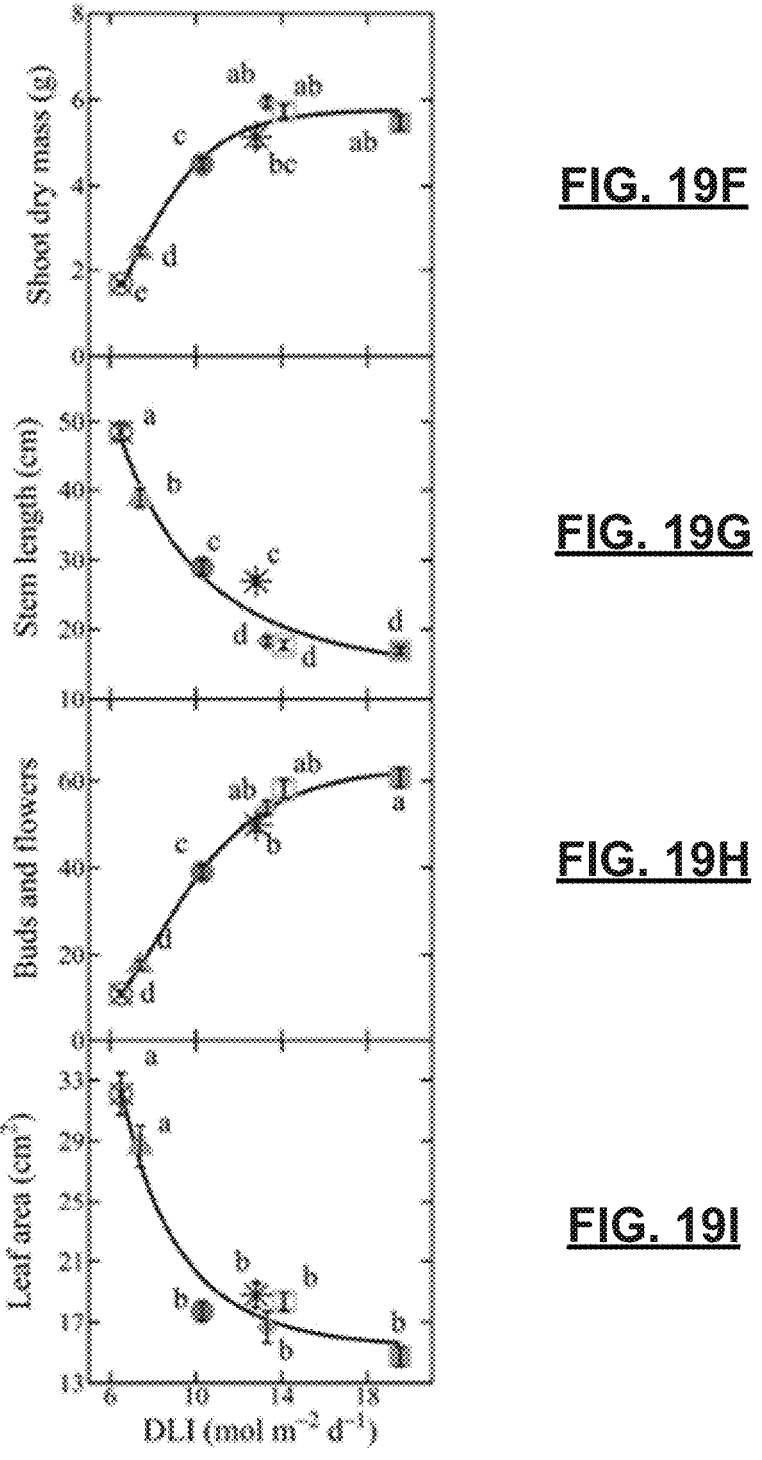
Figures 19J, 19K, 19L, 19M:
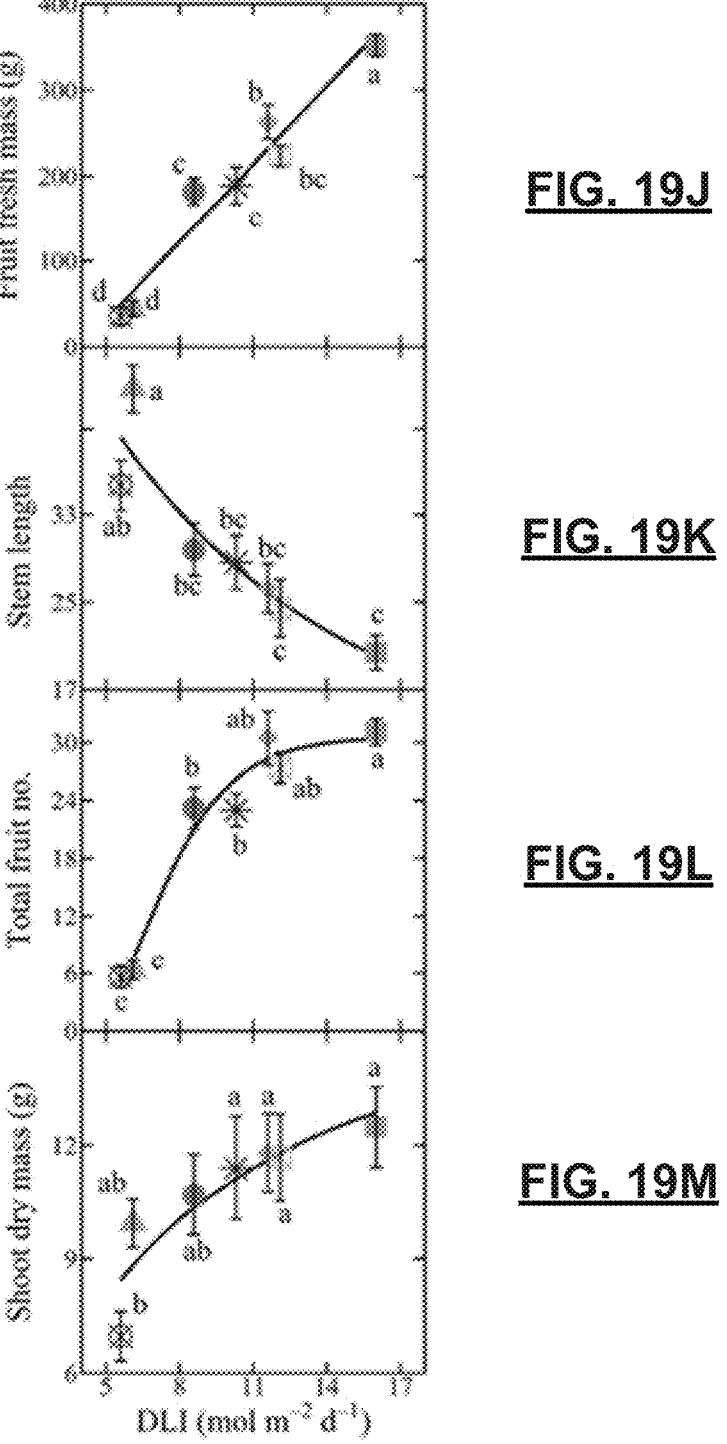

FIGS. 19A-19M relate to selected growth response regressions from basil, petunia, and tomato according to at least the embodiments of Example 1. FIG. 19A is a legend and FIGS. 19B-19M illustrate growth parameters under various glazing materials with different spectral transmissions (see FIGS. 18A-18C). FIG. 19B is a graph illustrating shoot dry mass for basil as a function of daily light integral (DLI). FIG. 19C is a graph illustrating stem length for basil as a function of DLI. FIG. 19D is a graph illustrating total leaf area for basil as a function of DLI. FIG. 19E is a graph illustrating relative chlorophyll content (SPAD) for basil as a function of DLI. FIG. 19F is a graph illustrating shoot dry mass for petunia as a function of DLI. FIG. 19G is a graph illustrating stem length for petunia as a function of DLI. FIG. 19H is a graph illustration buds and flowers for petunia as a function of DLI. FIG. 19I is a graph illustrating leaf area for petunia as a function of DLI. FIG. 19J is a graph illustrating fruit fresh mass for tomato as a function of DLI. FIG. 19K is a graph illustrating stem length for tomato as a function of DLI. FIG. 19L is a graph illustrating total fruit number for tomato as a function of DLI. FIG. 19M is a graph illustrating shoot dry mass for tomato as a function of DLI. Shoot dry mass for basil and tomato refers to both leaves and stems. Data represent means±SE with ten samples. Means with different letters are significant according to Tukey's honestly significant difference test (P<0.05). Regression equations for basil, petunia, and tomato are presented in Table S1-S3, respectively FIG. 20 is a table showing basil growth response regressions, and specifically regression analysis of basil growth parameters (y) as a function of DLI (mol $m^{-2}d^{-1}$; 400-700 nm) (x) according to at least the embodiments of Example 1. The regression type with the highest $R^2$ value was selected to describe the data. Sigmoidal regressions were always Gompertz functions (Equation 5, below). Specific leaf area (SLA) was calculated by dividing leaf area ($cm^2$) by leaf mass (g). Compactness was calculated by dividing the total above-ground dry mass by stem length (cm).

FIG. 21 is a table showing petunia growth response regressions, and specifically regression analysis of petunia growth parameters (y) as a function of DLI (mol $m^{-2}d^{-1}$; 400-700 nm) (x) according to at least the embodiments of Example 1. The regression type with the highest $R^2$ value was selected to describe the data. Sigmoidal regressions were always Gompertz functions (Equation 5, below). Time to flower was recorded as the number of days from seed sow to first open flower. SLA is calculated by dividing leaflet area ($cm^2$) by leaf mass (g). Compactness is calculated by dividing the total above-ground dry mass by central stem length (cm). Sigmoidal regressions were Gompertz functions (Equation 5, below).

FIG. 22 is a table showing tomato growth response regressions, and specifically regression analysis for various tomato growth parameters (y) as a function of DLI (mol $m^{-2}d^{-1}$; 400-700 nm) (x) according to at least the embodiments of Example 1. The regression type with the highest $R^2$ value was selected to describe the data. Sigmoidal regressions were always Gompertz functions (Equation 5, below). Projected canopy area (PCA) was measured perpendicular to the top of the canopy. Time to flower was recorded as the number of days from seed sow to first open floret. SLA was calculated by dividing leaflet area ($cm^2$) by leaf mass (g). Compound leaflets from a representative leaf of each sample were excised from the petiole before the area and dry mass were measured. Compactness was calculated by dividing the total above-ground dry mass by central stem length (cm). Sigmoidal regressions were Gompertz functions (Equation 5, below).

FIG. 23 is a table reporting basil growth under various glazing materials according to at least the embodiments of Example 1. Materials had differing photosynthetic photon flux densities (PPFDs; 400-700 nm) transmissions and photon distributions. SLA was calculated by dividing the leaf area ($cm^2$) by leaf mass (g) of a representative leaf. Compactness is calculated by dividing the total above-ground dry mass by stem length (cm). Data represent means with ten samples. Means with different letters are significant according to Tukey's honestly significant difference test (P<0.05) and correspond to each row. Darker shaded cells correspond to each parameter's highest values, and lighter shaded cells the lowest values and reflect pair-wise comparisons.

Figure 24:
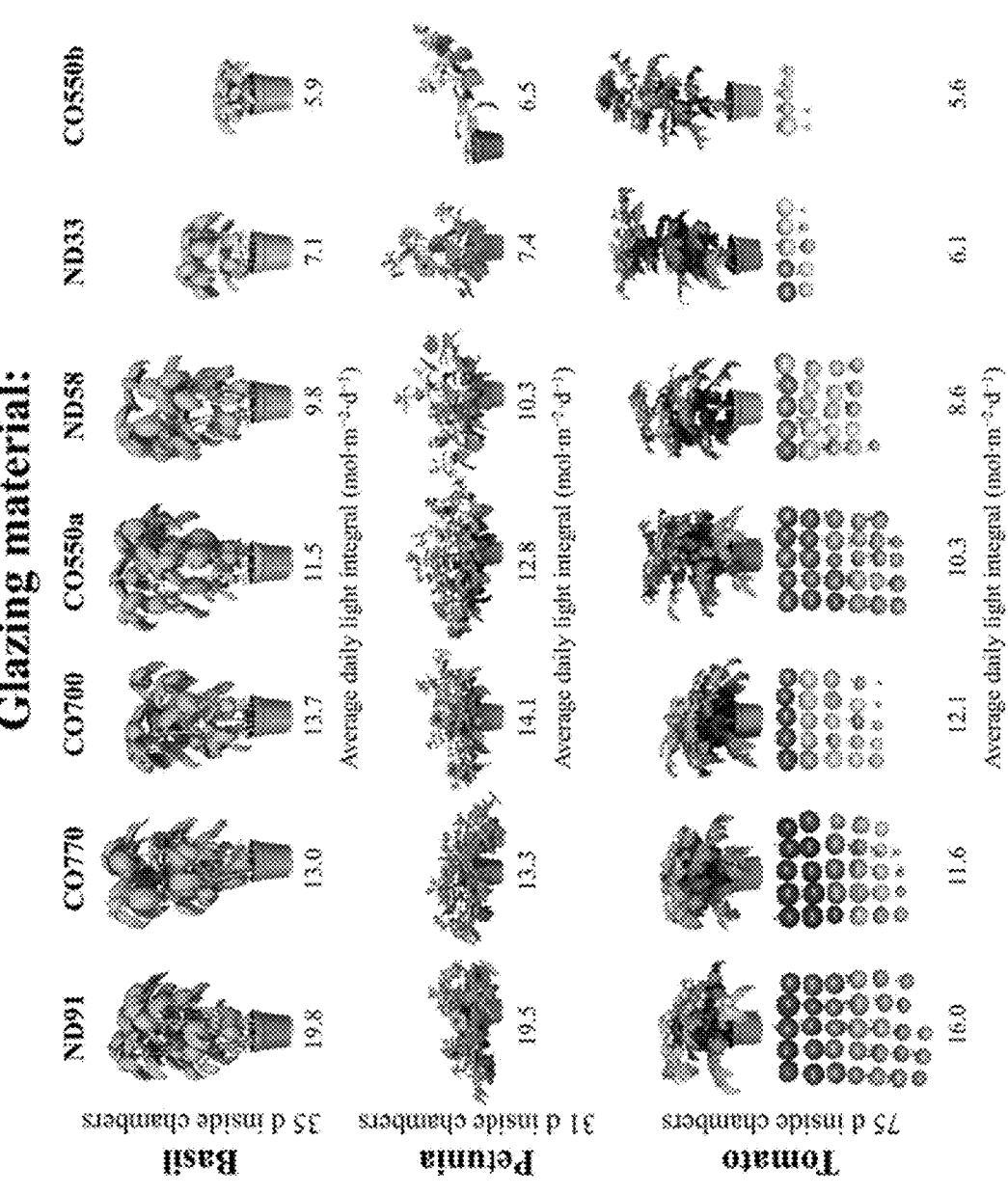

FIG. 24 is a chart including photographs of representative plants under each glazing material according to the embodiments of Example 1. Photographs were taken of basil, petunia, and tomato plants representative of those grown under various experimental glazing materials on 16 Jun. 2020, 21 Jul. 2020, and 13 Oct. 2020, respectively. The transmission spectra for the different glazing materials are given in FIGS. 18A-18C.

FIG. 25 is a table reporting petunia growth response under various glazing materials according to at least the embodiments of Example 1. Glazing materials has differing photosynthetic photon flux densities (PPFDs; 400-700 nm) transmissions and photon distributions. Time to flower was recorded as the number of days from seed sow to first open flower. SLA is calculated by dividing leaflet area ($cm^2$) by leaf mass (g). Compactness is calculated by dividing the total above-ground dry mass by central stem length (cm). Data represent means with ten samples. Means with different letters are significant according to Tukey's honestly significant difference test (P<0.05) and correspond to each row. Darker shaded cells correspond to each parameter's highest values, and lighter shaded cells the lowest values and reflect pair-wise comparisons.

FIG. 26 is a table reporting tomato growth response under various glazing materials according to at least the embodiments of Example 1. Glazing materials had differing photosynthetic photon flux densities (PPFDs; 400-700 nm) transmissions and photon distributions. PCA was measured perpendicular to the top of the canopy. Time to flower was recorded as the number of days from seed sow to first open floret. SLA is calculated by dividing leaflet area ($cm^2$) by leaf mass (g). Compound leaflets from a representative leaf of each sample were excised from the petiole before the area, and dry mass was measured. Compactness is calculated by dividing the total above-ground dry mass by central stem length (cm). Data represent means with ten samples. Means with different letters are significant according to Tukey's honestly significant difference test (P<0.05) and correspond to each row. Darker shaded cells correspond to each parameter's highest values, and lighter shaded cells the lowest values and reflect pair-wise comparisons.

Figures 27E, 27F, 27G:
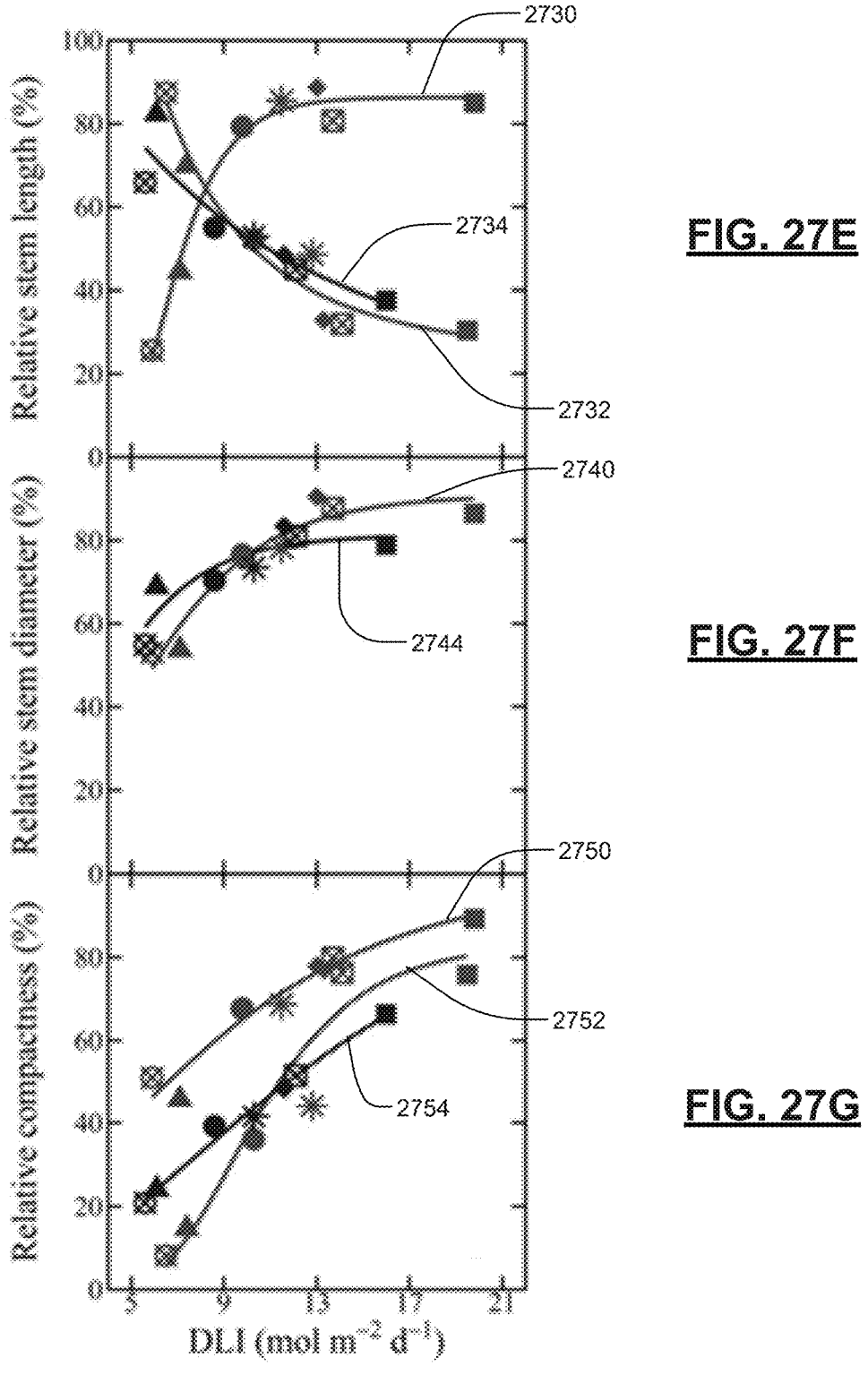

FIGS. 27A-27G relate to relative growth response of basil, petunia, and tomato according to at least the embodiments of Example 1. Relative growth of basil, petunia, and tomato under various glazing materials with different spectral characteristics. The transmission spectra for the different glazing materials are given in FIGS. 18A-18C. Each growth parameter is relative to the maximum observation according to species and represents the average of ten samples. FIG. 27A is a legend. FIG. 27B illustrates relative yield as a function of DLI, where relative yield refers to basil and petunia shoot dry mass (leaves and stems) and tomato fresh fruit mass. FIG. 27C is a graph illustrating relative SLA as a function of DLI, where SLA was calculated by dividing leaf area ($cm^2$) by leaf mass. FIG. 27D is a graph illustrating relative SPAD as a function of DLI, where SPAD reflects the relative chlorophyll concentration of leaves. FIG. 27E is a graph illustrating relative stem length, where stem length was measured from the substrate surface to the apical meristem. FIG. 27F is a graph illustrating relative stem diameter, where Stem diameter was measured at the substrate surface. FIG. 27G is a graph illustrating relative compactness, where compactness was calculated by dividing the total above-ground dry mass (g) by stem length (cm).

FIG. 28 is a table relating to potential energy output of agrivoltaic systems in the US according to at least the embodiments of Example 1. Land-area availability was approximated where agrivoltaic greenhouses account for 50% of covered growing area in the US and 1% of farmland area is covered for agrivoltaics purposes. The average daily solar insolation in the US (4.5 $kWh/m^2$/day) was used as the incident power on the TPV modules, which were assigned efficiencies based on current and prospective TPV benchmarks.

Figure 29:
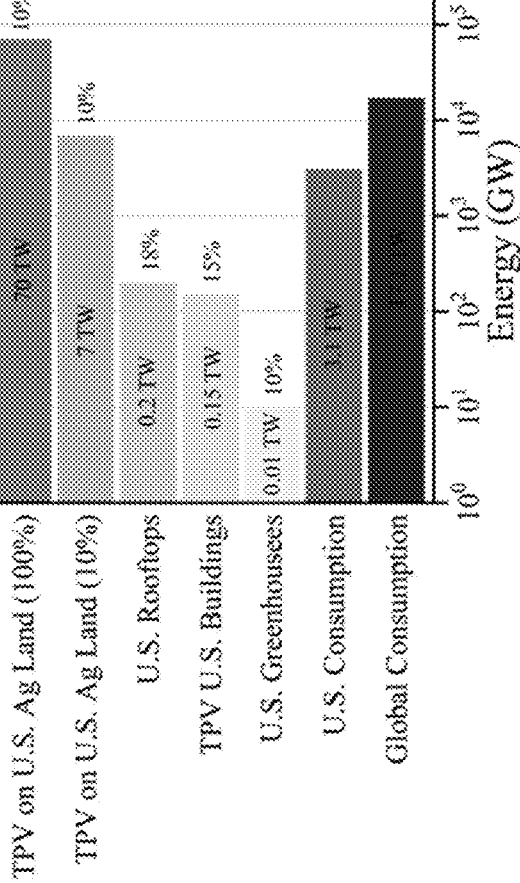

FIG. 29 is a graph relating to potential energy output of agrivoltaics according to at least the embodiments of Example 1. The potential energy output of agrivoltaics on US agricultural land significantly surpasses the energy generation of rooftop solar and other integrated solar approaches. Agrivoltaics with 10%-efficient panels would produce more than double the US energy consumption, with only 10% coverage of US agricultural land, and more than quadruple the global energy consumption, with 100% coverage of US agricultural land.

Figures 30A, 30B, 30C:
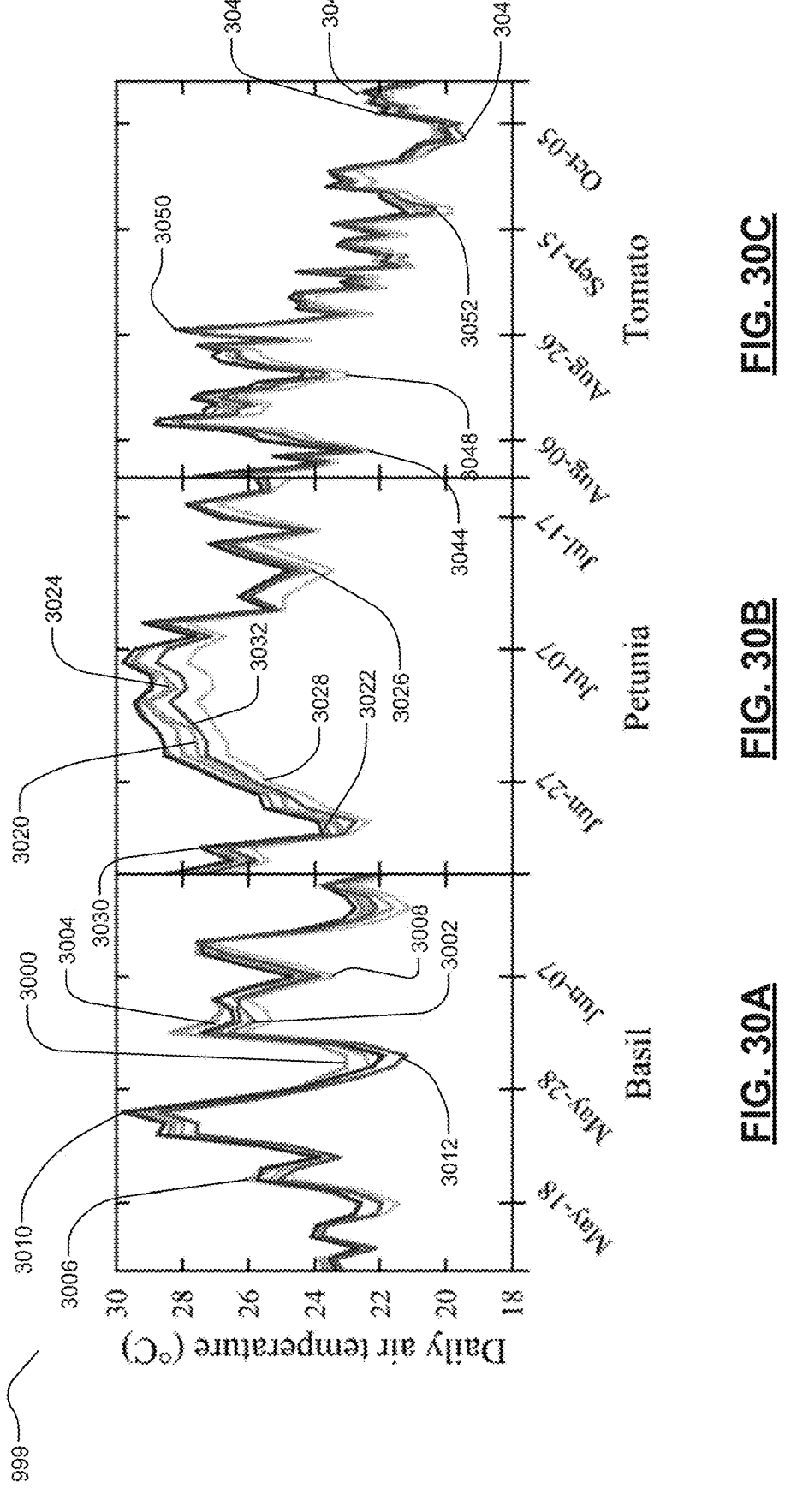
Figures 30D, 30E, 30F, 30G:
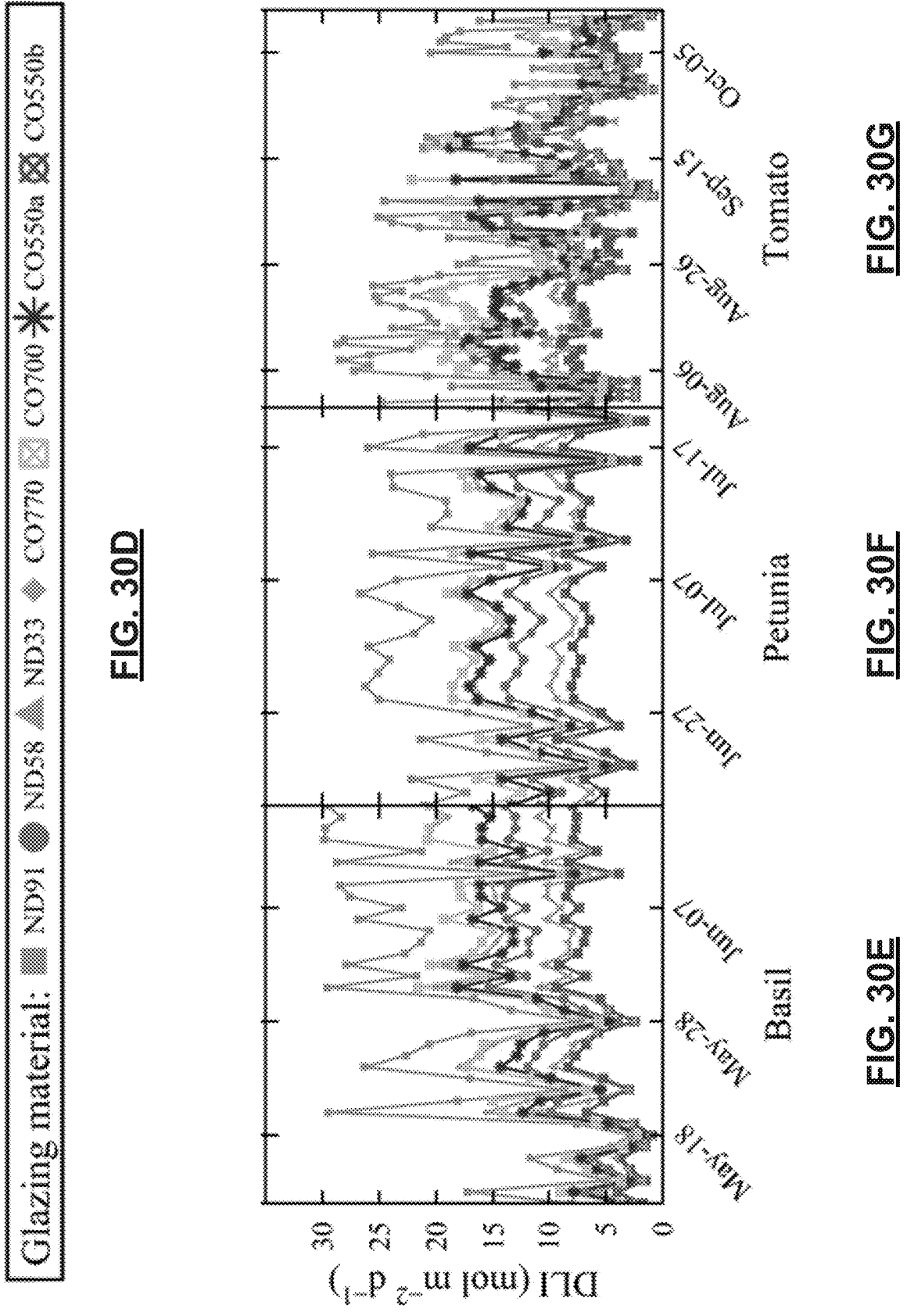

FIGS. 30A-30G relate to environmental conditions of chambers roofed with experimental glazing materials according to at least the embodiments of Example 1. FIG. 30A is a graph illustrating average daily air temperature by date for basil chambers. 30B is a graph illustrating average daily air temperature by date for petunia chambers. 30A is a graph illustrating average daily air temperature by date for tomato chambers. FIG. 30D is a legend of different glazing materials for FIGS. 30E-30G. FIG. 30E is a graph illustrating DLI (400-700 nm) for basil chambers. FIG. 30F is a graph illustrating DLI for petunia chambers. FIG. 30G is a graph illustrating DLI for tomato chambers. Instantaneous photosynthetic photon flux density (400-700 nm) was measured at canopy height every minute and integrated over 24 h to calculate DLI. Differences between chamber DLIs reflect differences between experimental glazing transmissions that ranged from 91% (ND91) to 34% (VIS550b) of incident sunlight directly above the chambers.

FIG. 31 is a table related to environmental conditions inside chambers roofed with experimental glazing materials according to at least the embodiments of Example 1. Values represent daily averages±SD for basil, petunia, and tomato grown inside each chamber.

Figures 32A, 32B, 32C, 32D, 32E:
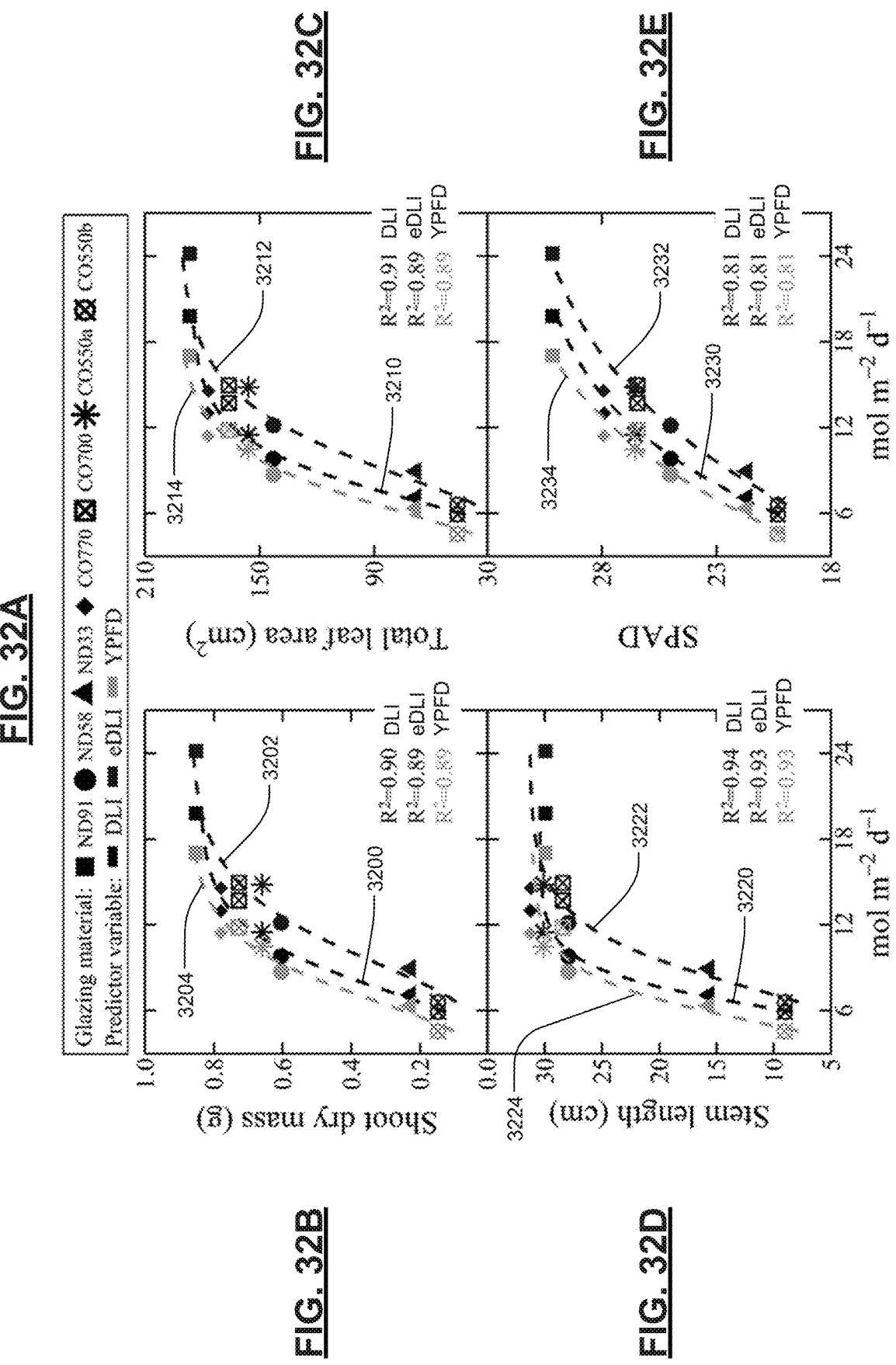

FIGS. 32A-32E relate to basil growth parameters as a function of three predictor variables according to at least the embodiments of Example 1: DLI (400-700 nm), extended daily light integral (eDLI; 400-750 nm) and average photosynthetic transmission (APT; synonymous with yield photon flux density according to McCree, 1972). Average treatment DLI was recorded throughout the duration of the experiment and then transformed into eDLI and APT using spectroradiometric data. Typically, APT values are lower and eDLI values are greater than DLI. FIG. 32A is a legend for FIGS. 32B-32E. FIG. 32B is a graph illustrating shoot dry mass as a function of the three parameters above. FIG. 32C is a graph illustrating total leaf area as a function of the three parameters above. FIG. 32D is a graph illustrating stem length as a function of the three parameters above. FIG. 32E is a graph illustrating SPAD as a function of the tree parameters above.

Figure 33:
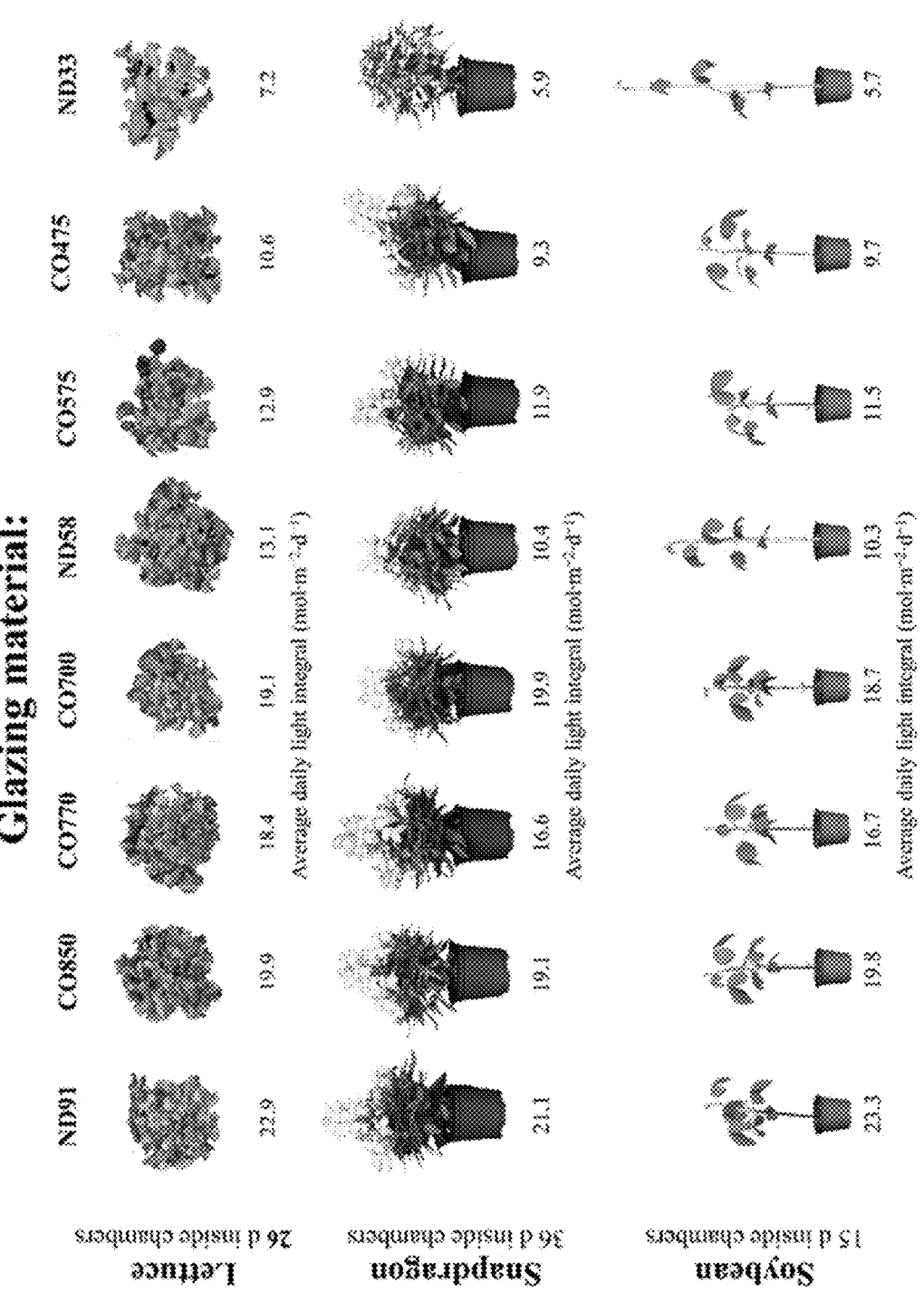

FIG. 33 is a chart including photographs of representative plants under various glazing materials according to at least the embodiments of Example 2.

FIG. 34 is a table reporting growth parameters of lettuce 'Rouxai' in 2021 according to at least the embodiments of Example 2.

FIG. 35 is a table reporting growth parameters of snapdragon 'Snapshot yellow' in 2021 according to at least the embodiments of Example 2.

FIG. 36 is a table reporting growth parameters of basil 'Genovese' in 2021 according to at least the embodiments of Example 2.

FIG. 37 is a table reporting growth parameters of soybean during 2021 according to at least the embodiments of Example 2.

Figure 38:
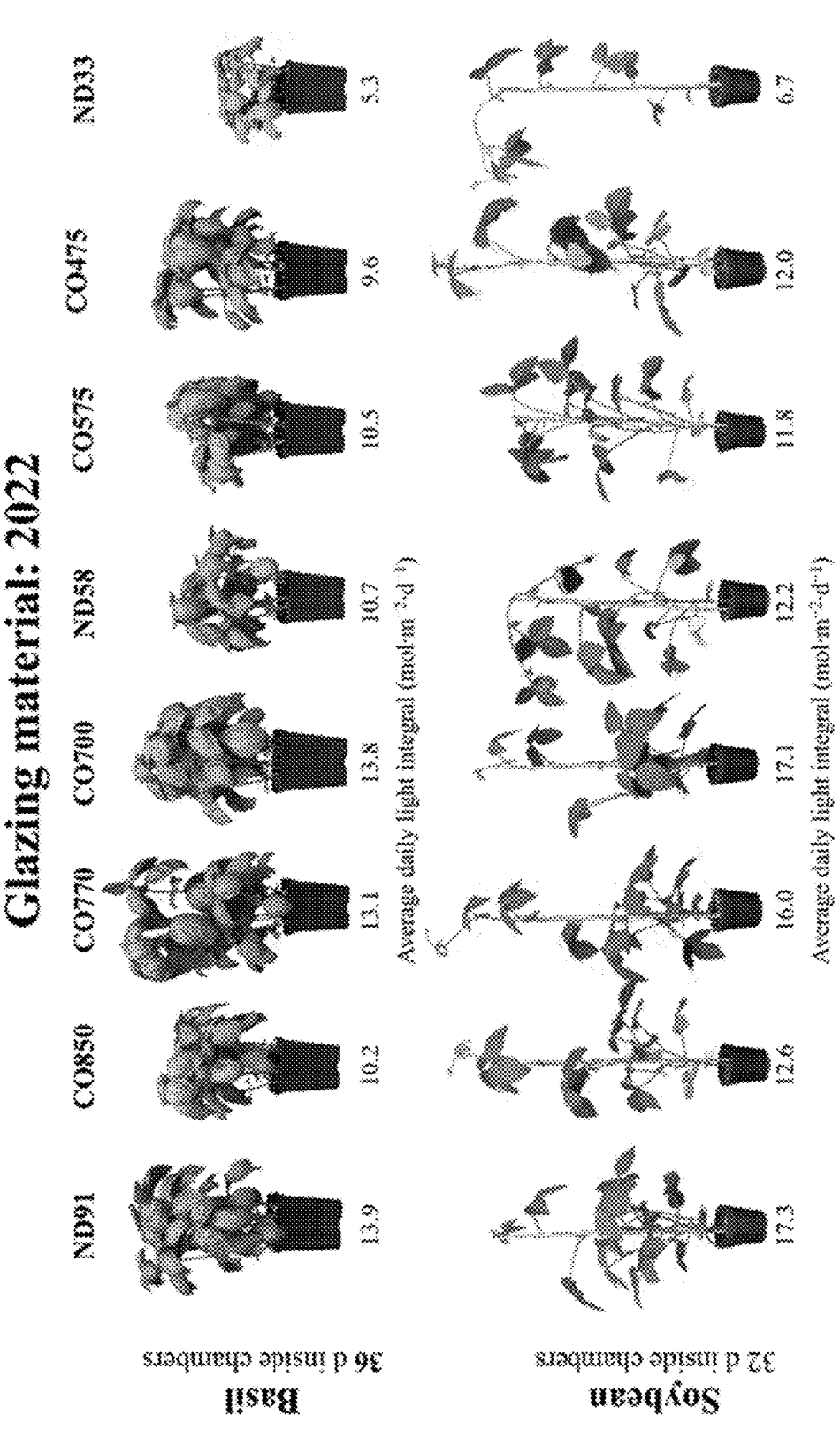

FIG. 38 is a chart including photographs of representative plants under each glazing material in 2022 according to at least the embodiments of Example 3.

FIG. 39 is a table reporting growth of basil 'Genovese' during 2022 according to at least the embodiments of Example 3.

FIG. 40 is a table reporting growth of soybean during 2022 according to at least the embodiment of Example 3.

Figures 41A, 41B:
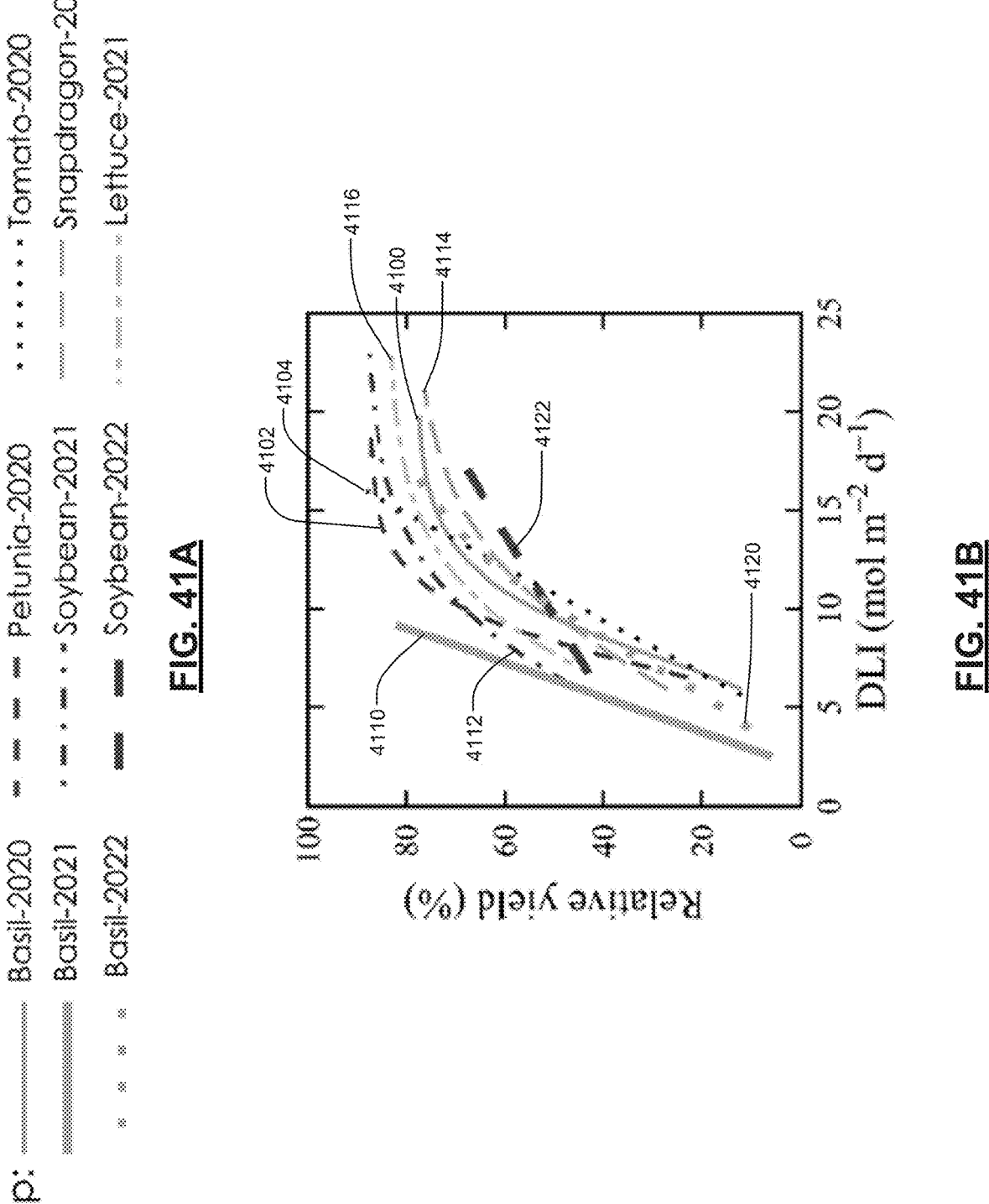
Figures 41C, 41D:
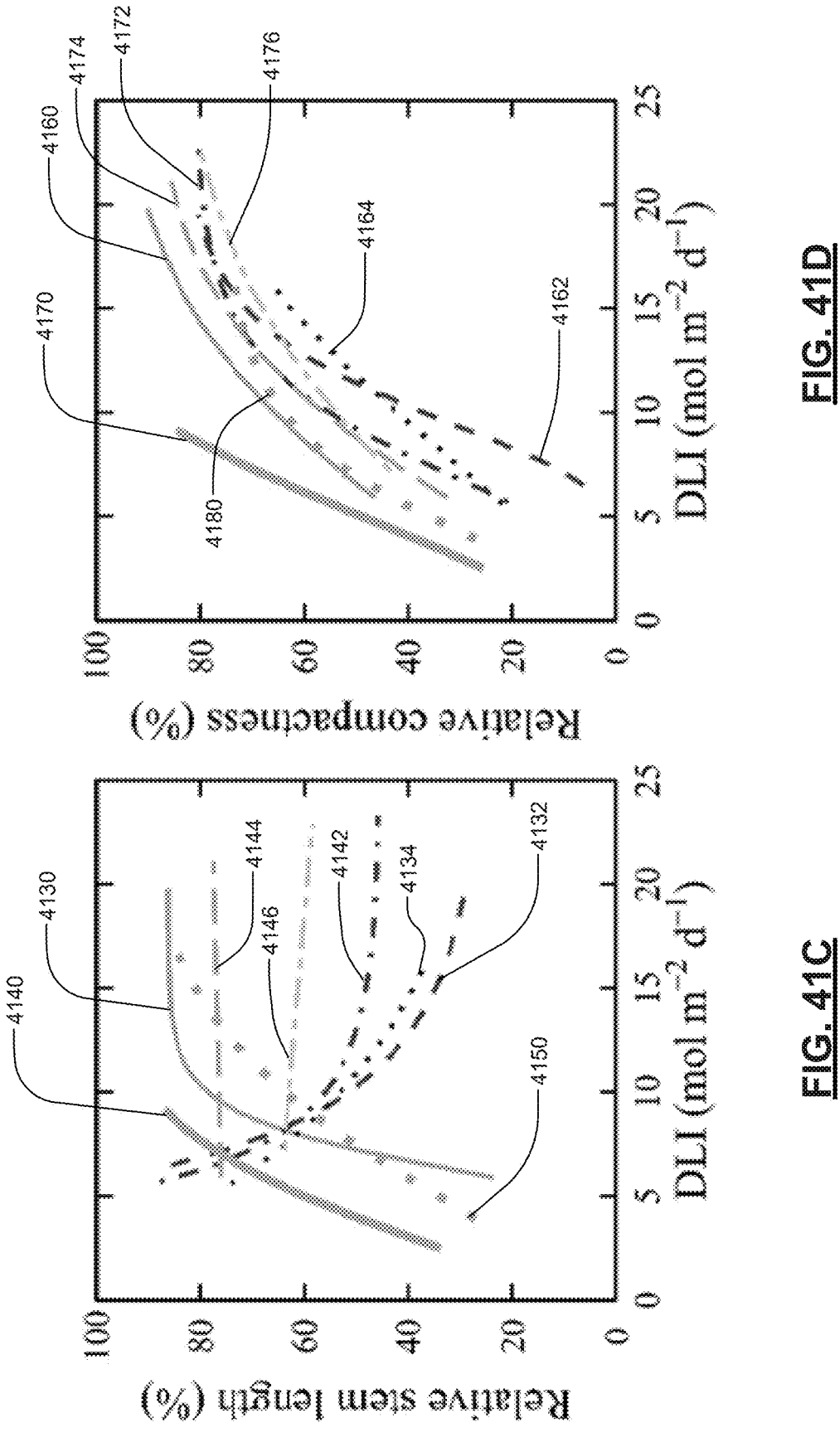

FIGS. 41A-41D depict relative growth response of crops grown in between 2020 and 2022 according to at least the embodiments of Examples 1-3. FIG. 41A is a legend for FIGS. 41B-41D. FIG. 41B is a graph illustrating relative yield (%) as a function of DLI ($mol \cdot m^{-2} \cdot d^{-1}$). FIG. 41C is a graph illustrating relative stem length (%) as a function of DLI ($mol \cdot m^{-2} \cdot d^{-1}$). FIG. 41D is a graph illustrating relative compactness (%) as a function of DLI ($mol \cdot m^{-2} \cdot d^{-1}$).

FIG. 42 is a table reporting experimentally-determined optical (APT) and electronic ($J_{SC}$, $V_{OC}$, fill factor (FF), PCE, LUE*) values of bilayer TPV devices with fixed IEICO-4F thickness and variable PTB7-Th thickness indicated in the table according to at least the embodiments of Example 4.

Figure 43A:
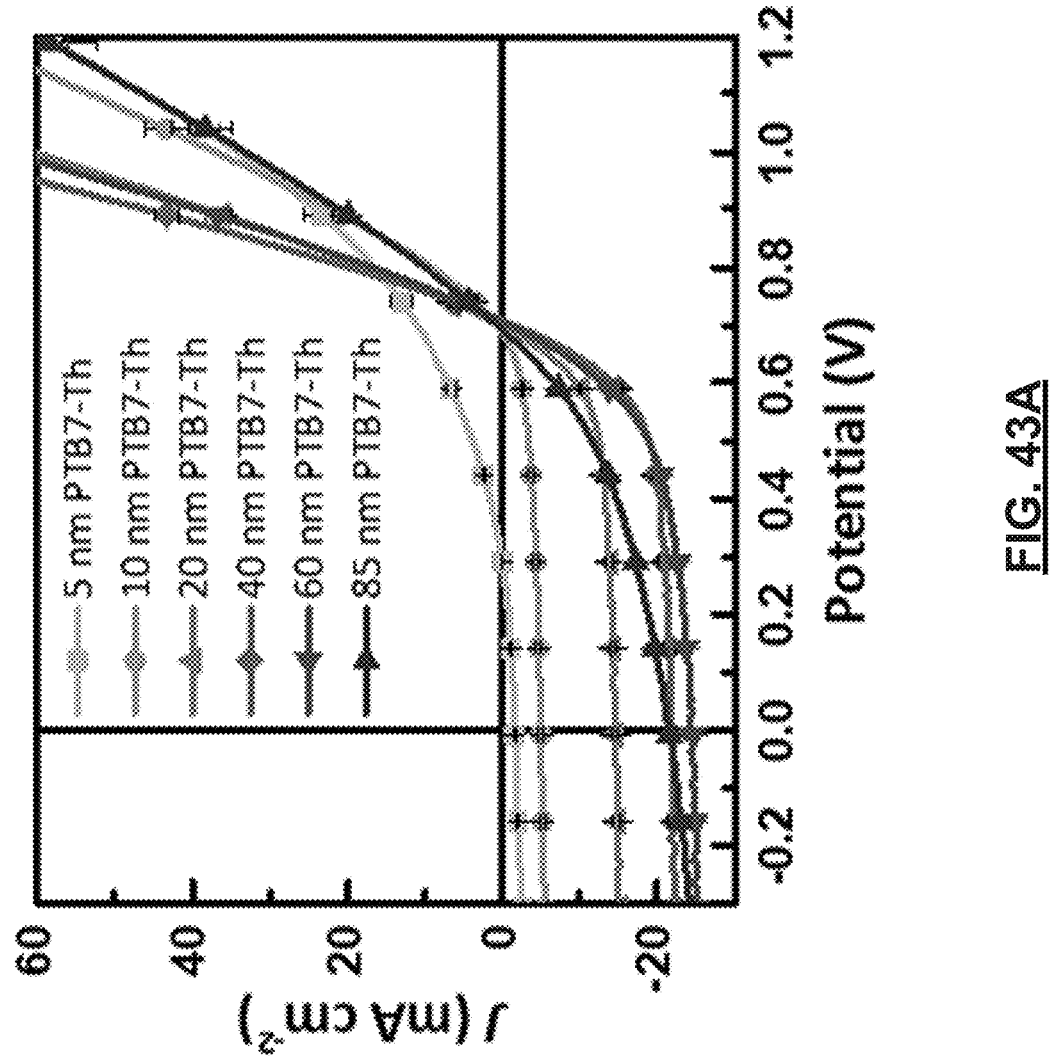
Figure 43C:
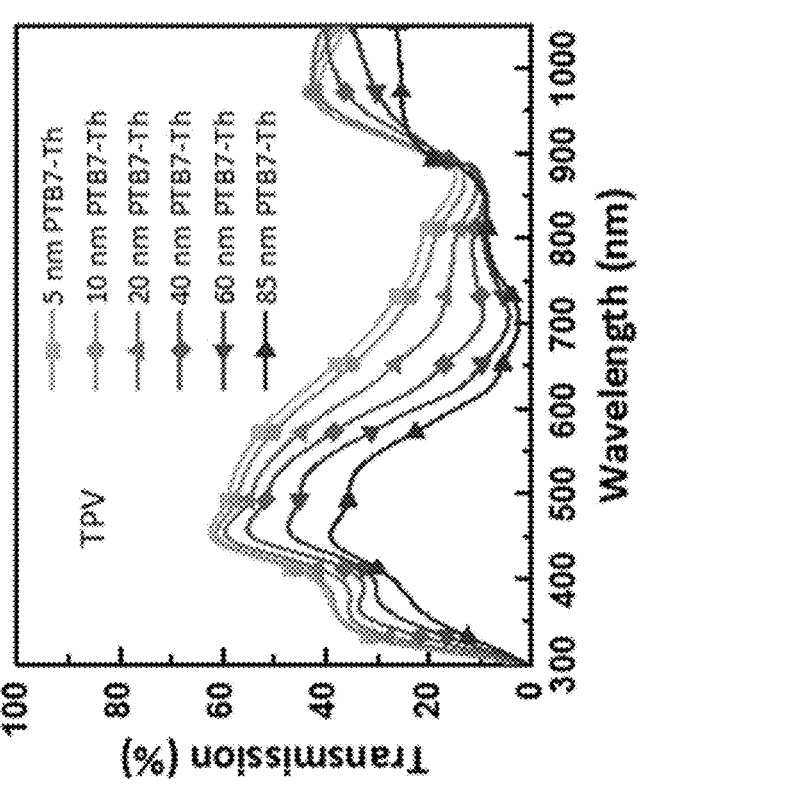
Figure 43B:
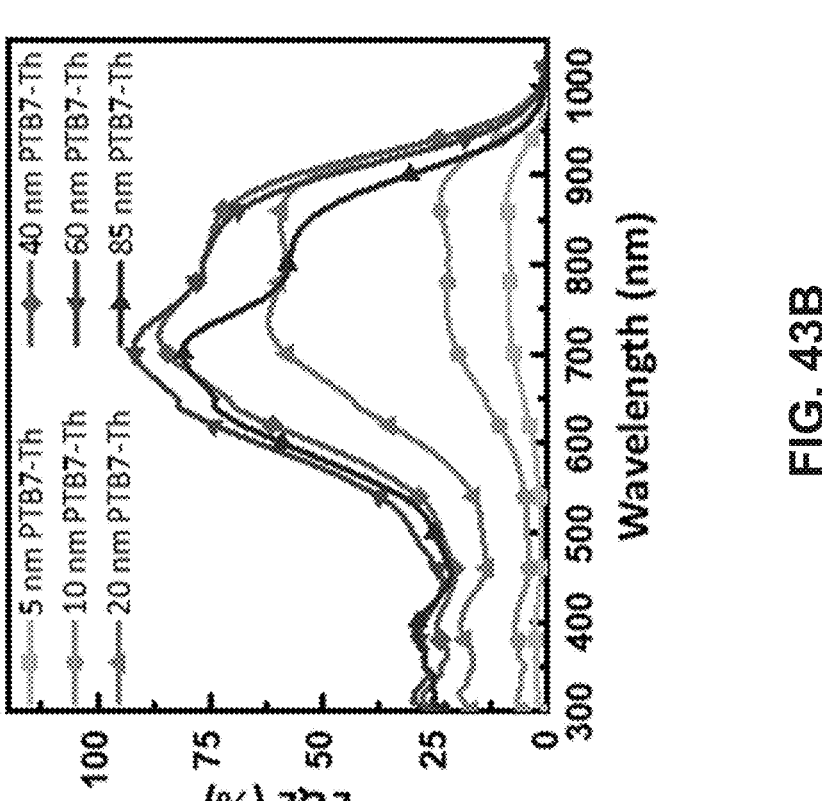

FIGS. 43A-43C relate to polymer thickness optimization for TPVs having different PTb7-Th thickness according to at least the embodiments of Example 4. FIG. 43A is a graph illustrating current-voltage (J-V) curves. FIG. 43B is a graph illustrating external quantum efficiency (EQE). FIG. 43C is a graph illustrating transmission.

FIG. 44 is a table reporting experimentally-determined optical (APT, SHGC*) and electronic ($J_{SC}$, $V_{OC}$, FF, PCE, LUE*) values of the nanocluster-based devices include edge-mounted GaAs according to at least the embodiments of Example 5.

FIG. 45 is a table reporting experimentally-determined optical (APT, SHGC*) and electronic ($J_{SC}$, $V_{OC}$, FF, PCE, LUE*) values of the NIR-absorbing dye devices with edge-mounted GaAs according to at least the embodiments of Example 5.

FIG. 46 is a table reporting experimentally-determined optical (APT, SHGC*) and electronic ($J_{SC}$, $V_{OC}$, FF, PCE, LUE*) values of select devices with an edge-mounted Si cell according to at least the embodiments of Example 5.

Figure 47:
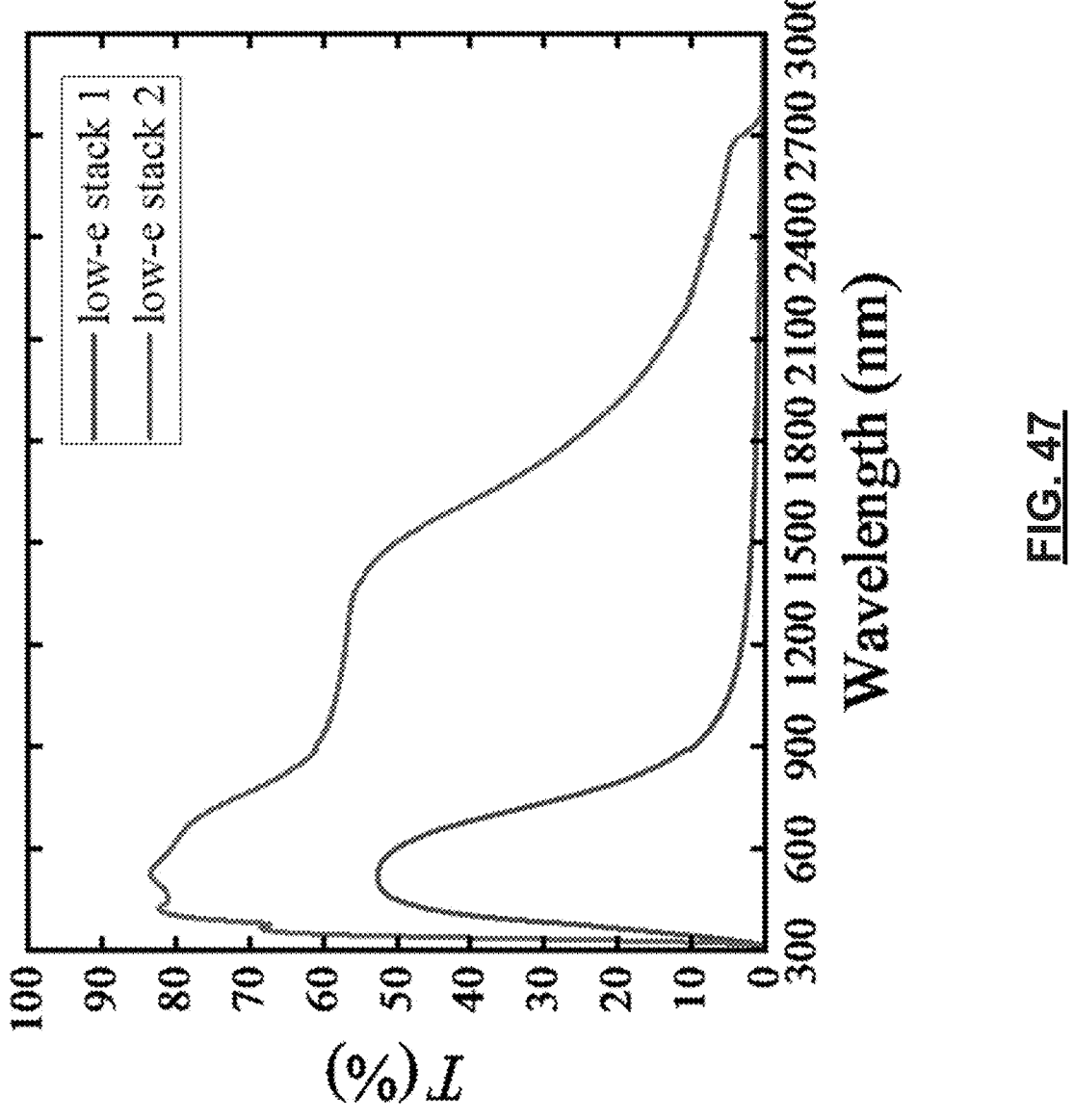

FIG. 47 is a graph illustrating transmittance of low-e stack samples according to at least the embodiments of Example 5.

FIG. 48 is a table reporting experimentally-determined optical (APT, SHGC*) and electronic ($J_{SC}$, $V_{OC}$, FF, PCE, LUE*) values of select devices with an edge-mounted Si cell and low-e stack 1 placed below the devices bottom surface according to at least the embodiments of Example 5.

FIG. 49 is a graph illustrating experimentally-determined optical (APT, SHGC*) and electronic ($J_{SC}$, $V_{OC}$, FF, PCE, LUE*) values of select devices with an edge-mounted Si cell and low-e stack 2 placed below the devices bottom surface according to at least the embodiments of Example 5.

Figure 50A:
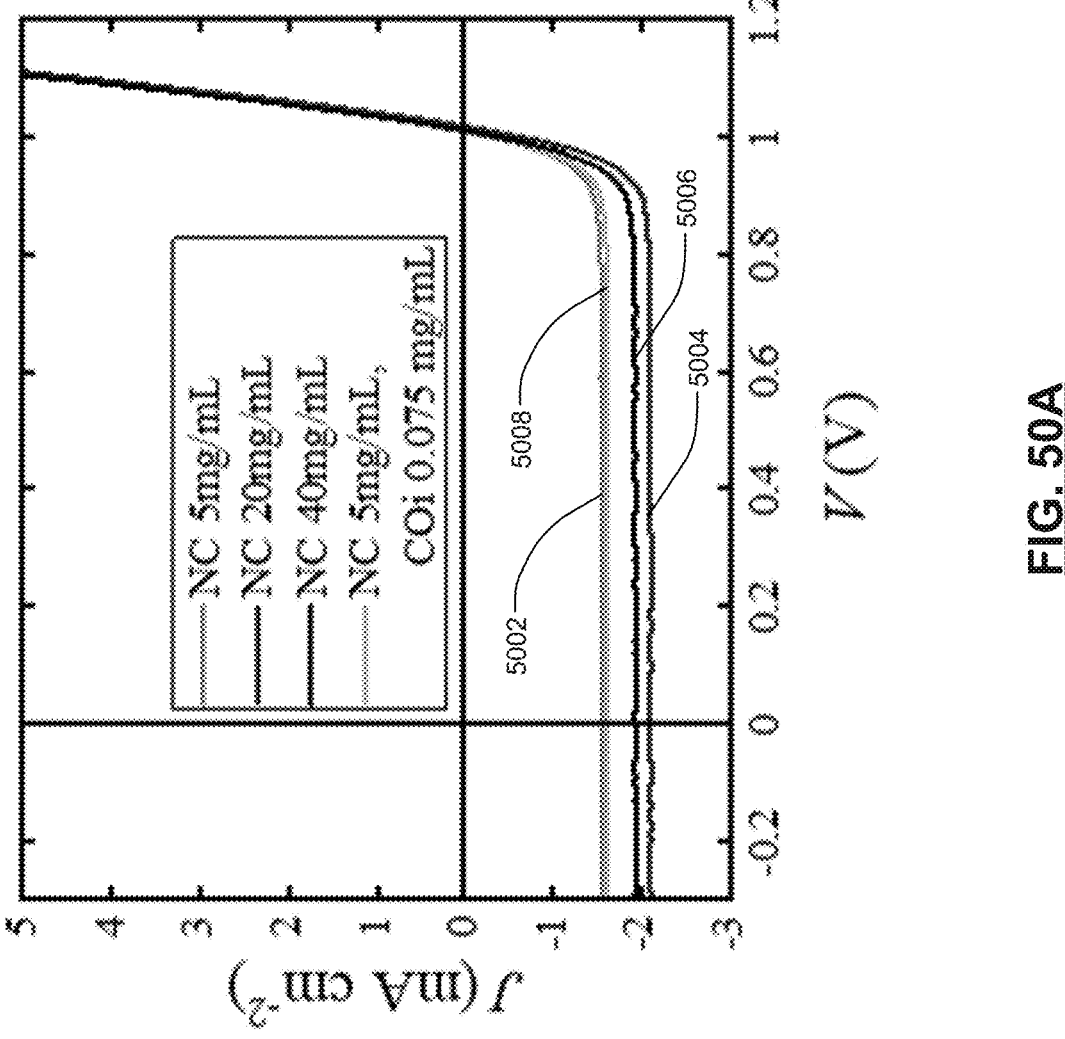
Figure 50B:
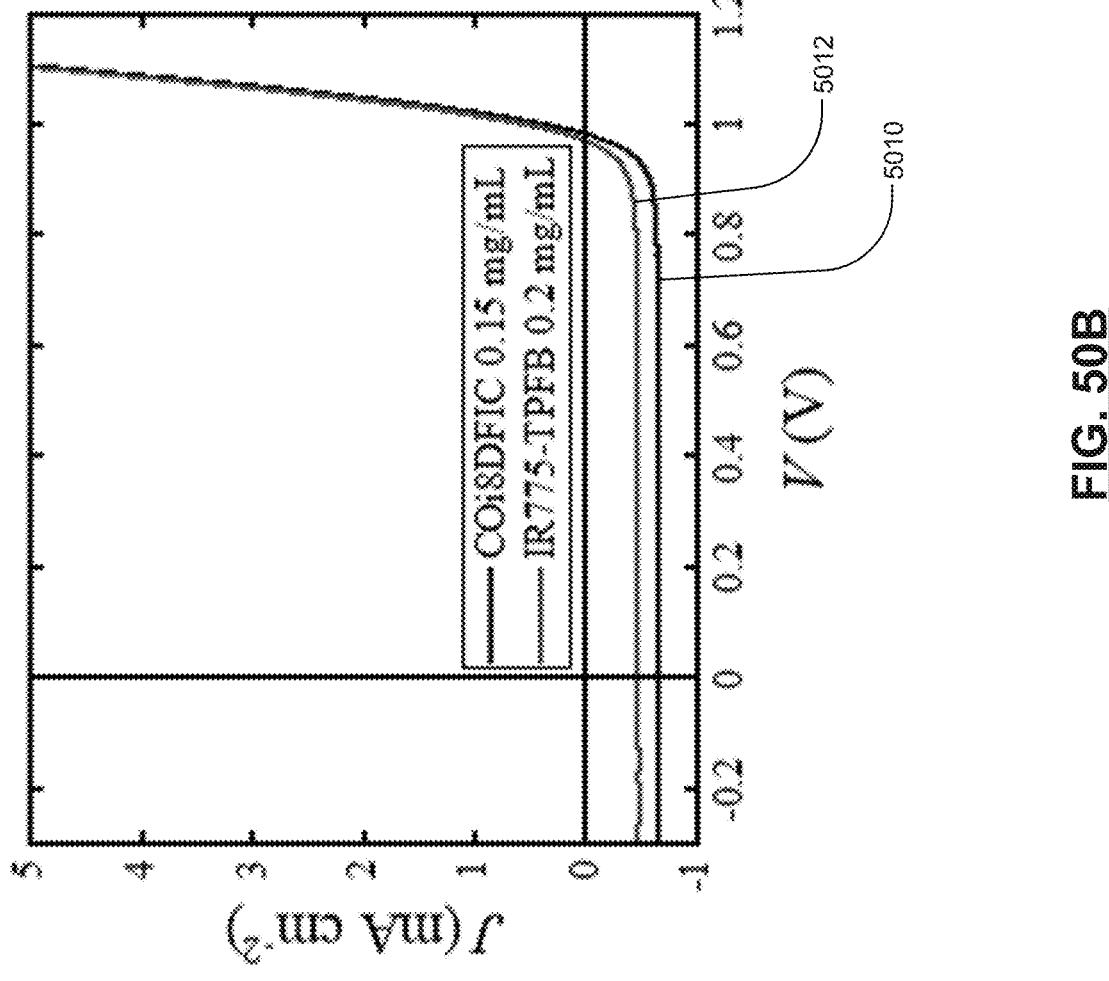
Figure 50C:
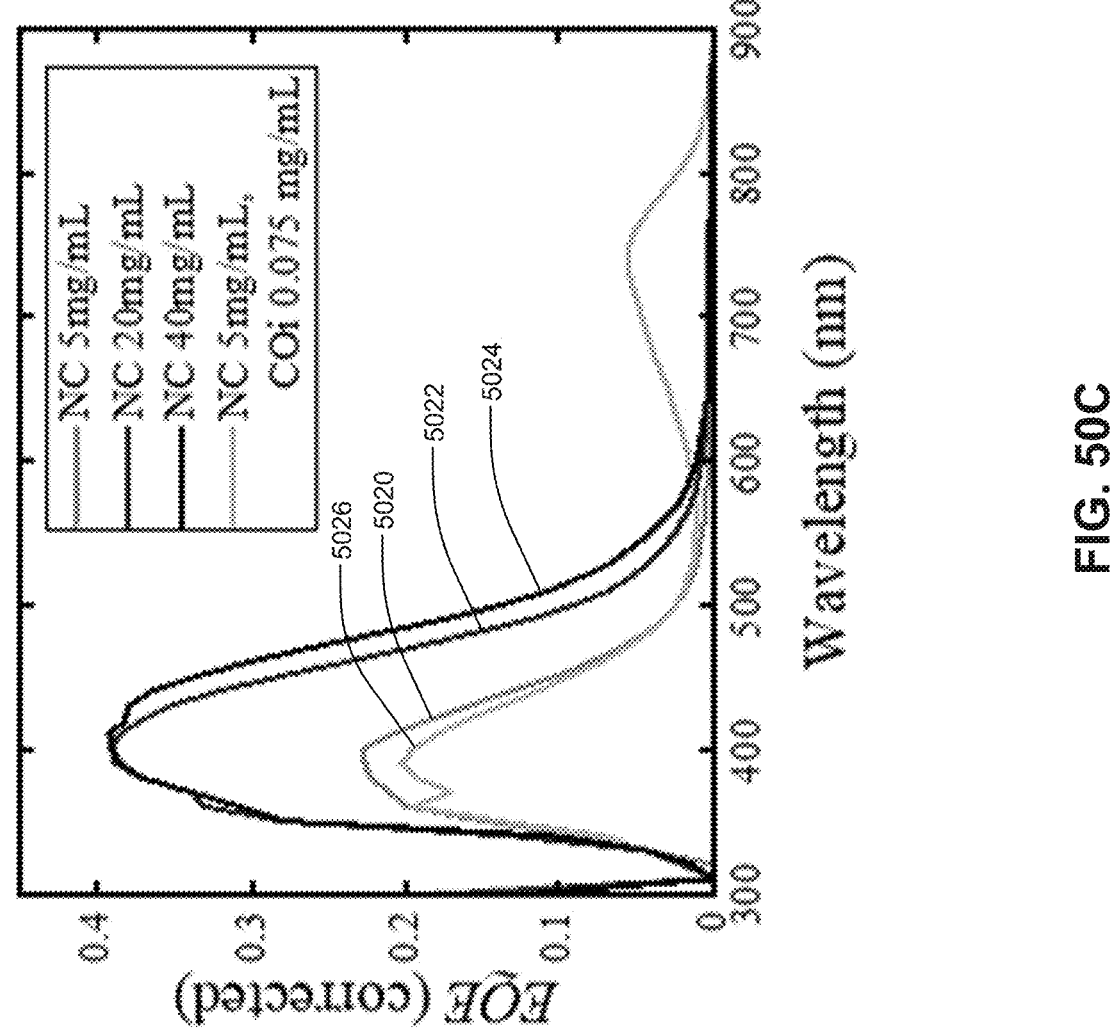
Figure 50D:
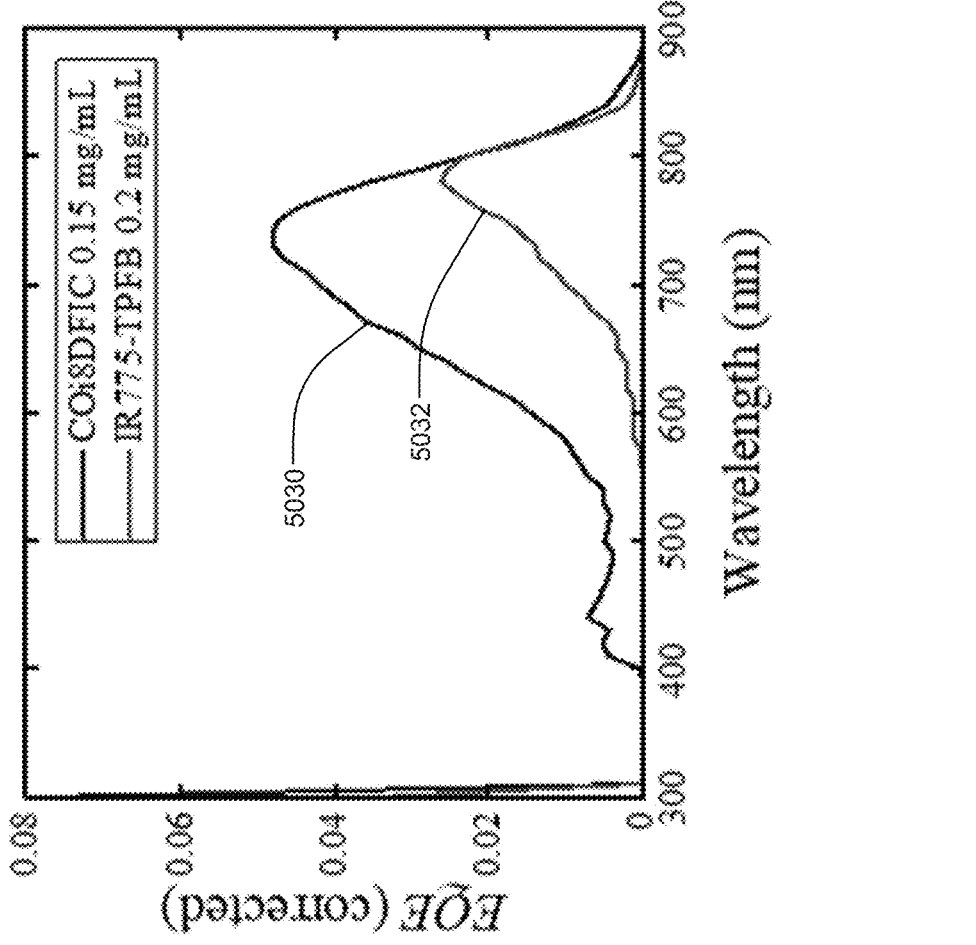

FIGS. 50A-50D are graphs showing current density voltage and EQE according to at least the embodiments of Example 5. FIG. 50A is a graph illustrating J-V curves for NC and COi at the indicated concentrations. FIG. 50B is a graph illustrating J-V curves for COi8DFIC at 0.15 mg/ml and IR775-TPFB at 0.2 mg/mL. FIG. 50C is a graph illustrating EQE as a function of wavelength for NC and COi at the indicated concentrations. FIG. 50D is a graph illustrating EQE as a function of wavelength for COi8DFIC at 0.15 mg/mL and IR775-TPFB at 0.2 mg/mL.

Corresponding reference numerals indicate corresponding parts throughout the several views of the drawings.

DETAILED DESCRIPTION

Example embodiments are provided so that this disclosure will be thorough, and will fully convey the scope to those who are skilled in the art. Numerous specific details are set forth such as examples of specific compositions, components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, elements, compositions, steps, integers, operations, and/or components, but do not preclude the presence or addition of one or more other features, integers, steps, operations, elements, components, and/or groups thereof. Although the open-ended term "comprising," is to be understood as a non-restrictive term used to describe and claim various embodiments set forth herein, in certain aspects, the term may alternatively be understood to instead be a more limiting and restrictive term, such as "consisting of" or "consisting essentially of." Thus, for any given embodiment reciting compositions, materials, components, elements, features, integers, operations, and/or process steps, the present disclosure also specifically includes embodiments consisting of, or consisting essentially of, such recited compositions, materials, components, elements, features, integers, operations, and/or process steps. In the case of "consisting of," the alternative embodiment excludes any additional compositions, materials, components, elements, features, integers, operations, and/or process steps, while in the case of "consisting essentially of," any additional compositions, materials, components, elements, features, integers, operations, and/or process steps that materially affect the basic and novel characteristics are excluded from such an embodiment, but any compositions, materials, components, elements, features, integers, operations, and/or process steps that do not materially affect the basic and novel characteristics can be included in the embodiment.

Any method steps, processes, and operations described herein are not to be construed as necessarily requiring their performance in the particular order discussed or illustrated, unless specifically identified as an order of performance. It is also to be understood that additional or alternative steps may be employed, unless otherwise indicated.

When a component, element, or layer is referred to as being "on," "engaged to," "connected to," or "coupled to" another element or layer, it may be directly on, engaged, connected or coupled to the other component, element, or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various steps, elements, components, regions, layers and/or sections, these steps, elements, components, regions, layers and/or sections should not be limited by these terms, unless otherwise indicated. These terms may be only used to distinguish one step, element, component, region, layer or section from another step, element, component, region, layer or section. Terms such as "first," "second," and other numerical terms when used herein do not imply a sequence or order unless clearly indicated by the context. Thus, a first step, element, component, region, layer or section discussed below could be termed a second step, element, component, region, layer or section without departing from the teachings of the example embodiments.

Spatially or temporally relative terms, such as "before," "after," "inner," "outer," "beneath," "below," "lower," "above," "upper," and the like, may be used herein for ease of description to describe one element or feature's relationship to another element(s) or feature(s) as illustrated in the figures. Spatially or temporally relative terms may be intended to encompass different orientations of the device or system in use or operation in addition to the orientation depicted in the figures.

Throughout this disclosure, the numerical values represent approximate measures or limits to ranges to encompass minor deviations from the given values and embodiments having about the value mentioned as well as those having exactly the value mentioned. Other than in the working examples provided at the end of the detailed description, all numerical values of parameters (e.g., of quantities or conditions) in this specification, including the appended claims, are to be understood as being modified in all instances by the term "about" whether or not "about" actually appears before the numerical value. "About" indicates that the stated numerical value allows some slight imprecision (with some approach to exactness in the value; approximately or reasonably close to the value; nearly). If the imprecision provided by "about" is not otherwise understood in the art with this ordinary meaning, then "about" as used herein indicates at least variations that may arise from ordinary methods of measuring and using such parameters. For example, "about" may comprise a variation of less than or equal to 5%, optionally less than or equal to 4%, optionally less than or equal to 3%, optionally less than or equal to 2%, optionally less than or equal to 1%, optionally less than or equal to 0.5%, and in certain aspects, optionally less than or equal to 0.1%.

In addition, disclosure of ranges includes disclosure of all values and further divided ranges within the entire range, including endpoints and sub-ranges given for the ranges.

Example embodiments will now be described more fully with reference to the accompanying drawings.

The current technology provides a transparent solar panel for use in a system, such as an agrivoltaic system. The agrivoltaic system may be an enclosed structure (e.g., a greenhouse, a phytotron, a phytobiotron, and/or a hoop house), an unenclosed structure (e.g., an array over land and/or water), and/or integrated into equipment, such as agricultural equipment. The transparent solar panel may be configured to be disposed between one or more photosynthetic organisms (e.g., plants) and a source of light (e.g., the sun), such as above the photosynthetic organism.

In addition to generating electricity to power local load, lights, and/or other equipment, the solar panels can help regulate a greenhouse environment by decreasing the incoming radiation, reducing the need for cooling during periods of excess radiation and, therefore, decreasing water use. Moreover, the ability to more fully harvest the solar spectrum to efficiently generate crop growth and generate solar electricity can better utilize the large greenhouse, agricultural land area, and other regions including land and/or water.

The transparent solar panel may be a transparent photovoltaic (TPV) or a transparent luminescent solar concentrator (TLSC). Unless otherwise specified, "transparent solar panel" or "solar panel" as used herein refers to a TPV and/or TLSC. The transparent solar panel is configured to selectively and predominantly absorb and transmit light based on wavelength. More specifically, the solar panel may be configured to transmit light that is beneficial to the photosynthetic organism, such as growth and/or quality in the case of plants. In at least one example embodiment, the current technology also provides structures and/or equipment including the transparent solar panel. Both photosynthetic organism responses and PV power generation are considerations in designing an system according to the principles of the present disclosure. In at least one example embodiment, an agrivoltaic system is configured to maintain plant yield and/or quality by reducing or minimizing PV impact on transmission of photons with having wavelengths that are beneficial to plants. In at least one example embodiment, the current technology reduces or minimizes PV impact on wavelengths between 400 nm and 700 nm, which is often referred to as photosynthetically active radiation (PAR).

As discussed above, solar cells according to at least one example embodiment of the current disclosure may be used in conjunction with cultivation of plants and/or other photosynthetic organisms. Quantum sensors are used to measure the photosynthetic photon flux density (PPFD) having a unit of $\mu mol \cdot m^{-2} \cdot s^{-1}$. From a plant growth and productivity perspective, the daily average integrated value, referred to as the daily light integral or DLI having a unit of $mol \cdot m^{-2} \cdot d^{-1}$, is more appropriate. The extended daily light integral or eDLI is similar to the DLI, also having a unit of $mol \cdot m^{-2} \cdot d^{-1}$, but considers wavelengths in the extended PAR (ePAR) of 400-750 nm rather than in the PAR.

Definitions for PPFD and DLI assume any photon with a wavelength between 400 nm and 700 nm equally powers photosynthesis (i.e., it has the same quantum yield). However, photons can have different quantum efficiencies (see, e.g., the YPFD curve 108 in FIG. 1) based on their relative action and leaf absorption. Thus, a weighted description of PAR is created to give a more accurate representation of the instantaneous photosynthetic rate based on the spectral distribution of a light source, which is termed yield photo flux density (YPFD), as described in Sager, J. C., Smith, W. O., Edwards, J. L. and Cyr, K. L., 1988, Photosynthetic efficiency and phytochrome photoequilibria determination using spectral data, *Transactions of the ASAE*, 31 (6), pp. 1882-89, incorporated herein by reference in its entirety. In this case, YPFD is not restricted to just PAR; photons <400 nm and >700 nm are included, although their efficacy decreases rapidly as photon wavelengths decrease below 400 nm and increase above 700 nm.

Recently, there has been a proposed definition change of PAR to consider photons between 400 and 750 nm, which could be termed extended PAR or ePAR (as described by Zhen, S. and Bugbee, B., 2020a. Far-red photons have equivalent efficiency to traditional photosynthetic photons: Implications for redefining photosynthetically active radiation, *Plant, cell & environment*, 43 (5), pp. 1259-1272; and Zhen, S. and Bugbee, B., 2020b. Substituting far-red for traditionally defined photosynthetic photons results in equal canopy quantum yield for $CO_2$ fixation and increased photon capture during long-term studies: Implications for re-defining PAR, *Frontiers in Plant Science*, 11, p. 1433, both of which are incorporated herein by reference in their entireties). ePAR is relevant to at least one example embodiment because whether panels begin to cutoff around 700 nm or closer to 750 nm could impact plant growth as well as energy generation. Regardless of which quantum unit is used to describe photometric transmission of a photovoltaic material, reporting at least one of these plant-centric parameters is required to appropriately characterize the plant environment, and to make comparisons among studies meaningful.

Translating semitransparent and transparent modules to photosynthetic living organisms, such as plant- and agriculture-based applications requires re-defining important metrics. Typically for transparent solar panels in the window industry, it is the average visible transparency that is reported and most important. Average visible transmittance (AVT) is a measure of how much light passes through the panel or window quantified by the solar photon flux and the average response of the human eye—also known as the photopic response.

To provide context into how PV panels may perform in agrivoltaics systems, the present disclosure introduces a new metric, the average photosynthetic transmittance (APT) that draws analogy to AVT from the window industry. Replacing the photopic response, we utilize the relative quantum efficiency of plants from, which is defined as the instantaneous $CO_2$ consumption rate per photon that is averaged among 22 varieties of plants and remains the broadest plant quantum efficiency study to date (described in Mccree, K. J.

Action Spectrum, Absorptance and Quantum Yield of Photosynthesis in Crop Plants. *Agric. Meteorol.* 1972, 9 (3-4), 191-., which is incorporated by reference herein in its entirety). Thus, APT is defined as:

$$APT = \frac{\int T(\lambda)S(\lambda)P(\lambda)d\lambda}{\int S(\lambda)P(\lambda)d\lambda}, \qquad \text{(Equation 1)}$$

where $S(\lambda)$ is the AM1.5G photon flux, $T(\lambda)$ is the photon transmittance of the panel, and $P(\lambda)$ is the average photosynthetic quantum yield, as defined by McCree, above. Thus, APT is a property of the panels placed over the plants that ultimately impacts and imparts a particular quantum unit (e.g., DLI, YPFD, etc.) based on the location and position-dependent solar flux.

Figure 1A:
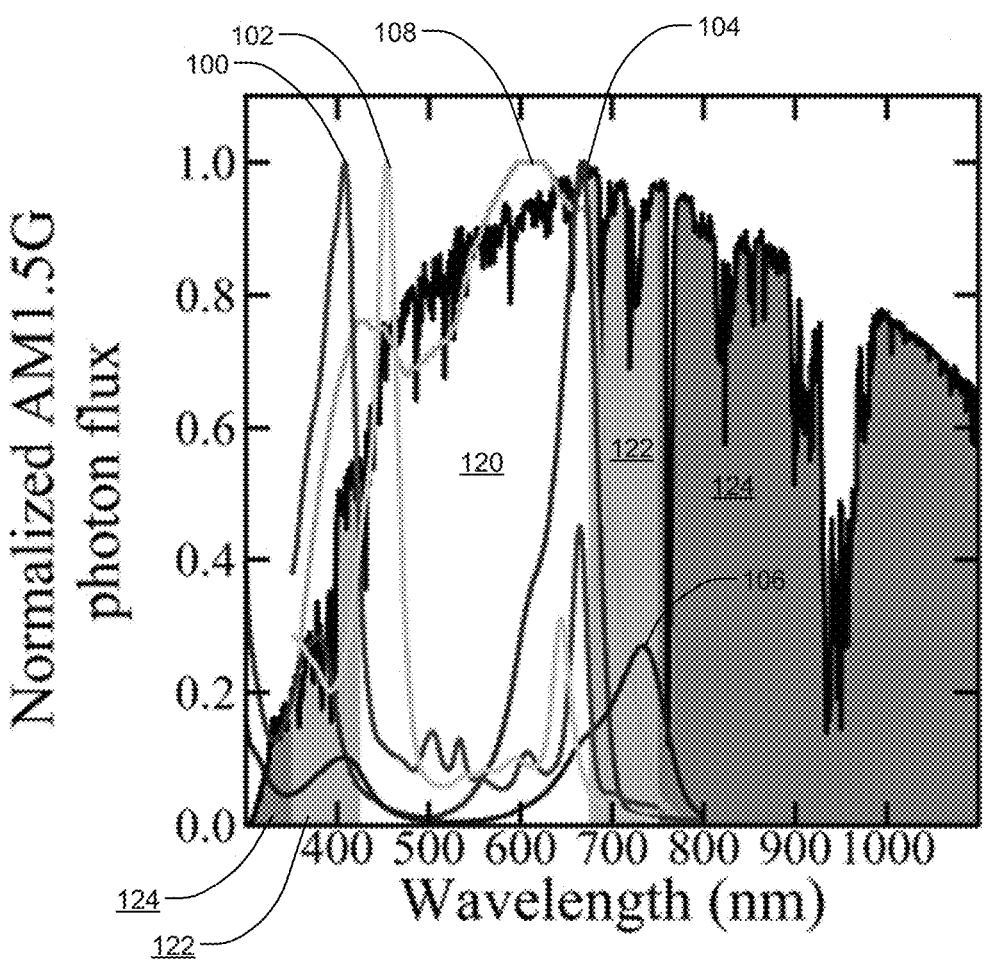
Figure 1B:
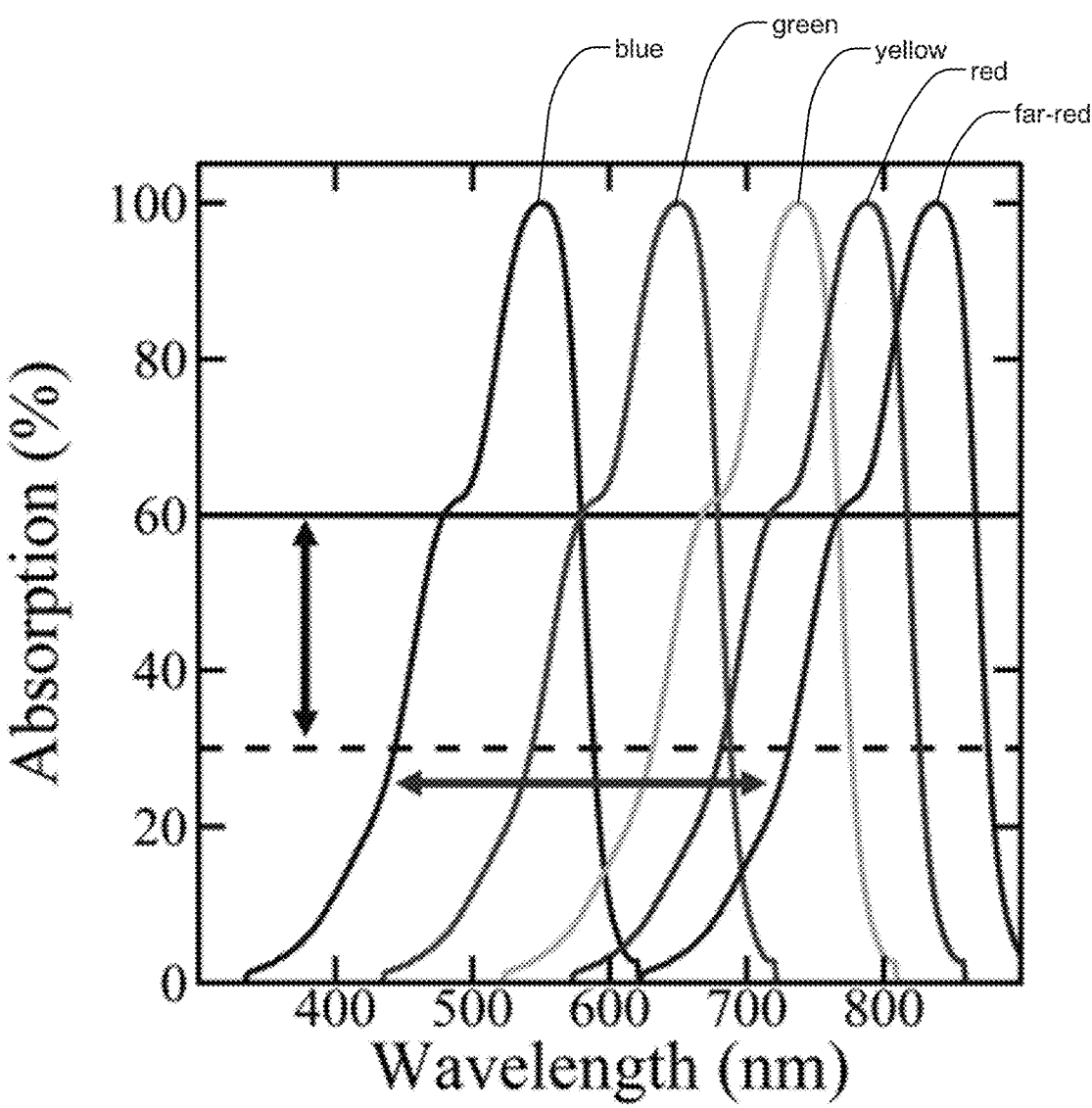

With reference to FIG. 1A, normalized photo flux is shown as a function of wavelength. chlorophyll a (Chl a) is shown at 100, chlorophyll b (Chl b) is shown at 102, red-absorbing phytochrome (Pr) is shown at 104, far-red-absorbing phytochrome (Pfr) is shown at 106, and averaged quantum yield in mol $CO_2$ fixed per mol photon absorbed as a function of wavelength, denoted as McCree, is shown at 108. In at least one example embodiment, wavelengths within a first range 120 (shown in white) are most important, wavelengths within second ranges 122 (shown in light gray) are moderately important, and wavelengths within third ranges 124 (shown in dark gray) are least important. Having a high photosynthetically active radiation (PAR) transmission is important because plants use photons from this waveband for photosynthesis and as signals for photomorphogenesis. To characterize this window, absorption spectra of chlorophyll (Chl) a and b, red-absorbing phytochrome (Pr) and far-red-absorbing phytochrome (Pfr), and the averaged quantum yield (mol $CO_2$ fixed per mol photon absorbed as a function of wavelength; denoted as McCree) of many plants are plotted. Absorbing VIS would be energetically advantageous for BIPV panels but could negatively influence greenhouse crop growth and development.

PAR can be divided into three wavebands: blue light (400-500 nm), green light (500-600 nm), and red light (600-700 nm). Each waveband independently and interactively regulates plant growth and development, as shown in FIG. 1A, with additional contributions coming from the UV (280-400 nm) and the near-infrared (NIR) or far-red (700-750 nm). Of these, blue and far-red light strongly regulate plant morphology and development, altering characteristics such as leaf area, stem length, and flowering. Although there can be benefits to decreasing incoming solar radiation in some cases (e.g., reducing water consumption or soil temperature), adoption of this hybrid field will may on being broadly applicable by transmitting as much PAR as possible, particularly in temperate climates.

In some agrivoltaic approaches, green light has been considered to have a negligible impact on plant yield because of low absorption by chlorophyll and carotenoids, causing it to be a target wavelength for absorption in PVs in greenhouses. However, as shown in FIG. 1A, metrics such as relative action and quantum yield show that plants surprisingly and unexpectedly utilize green light quite efficiently in photosynthesis. Green light is particularly useful in penetrating deeper into leaves under high-light conditions and reaching leaves that are shaded by others. Thus, spectral manipulation by absorbing specific wavebands within PAR (FIG. 1B) will alter plant growth and yield, which will vary between different species of plants. Allowing growers to maintain control of how plants grow and develop while still providing the benefits of agrivoltaics will be important to facilitate future widespread adoption.

In at least one example embodiment, a solar panel according to the present disclosure may be transparent or semi-transparent. The terms "transparent" or "visibly transparent" commonly refer to solar panels that have an AVT of greater than or equal to about 45% (e.g., greater than or equal to about 50%, greater than or equal to about 60%, greater than or equal to about 75%, greater than or equal to about 80%, or greater than or equal to about 90%). The terms "opaque" or "visibly opaque" commonly refer to devices that have an average visible transparency, weighted by the photopic response of an eye of 10% or less for specular transmission. Devices that have an AVT, weighted by the photopic response of an eye, of between 10%-50% are commonly referred to as being "semitransparent."

Because AVT is more related to human vision than plant vision, at least one example embodiment uses a different parameter, APT, for plants as described above. As used herein the terms "transparent," "photosynthetically transparent," or "plant transparent" refer to solar panels that have an APT of greater than or equal to about 45% (e.g., greater than or equal to about 50%, greater than or equal to about 60%, greater than or equal to about 65%, greater than or equal to about 70%, greater than or equal to about 75%, greater than or equal to about 80%, greater than or equal to about 85%, or greater than or equal to about 90%). As used herein, the terms "semitransparent," "photosynthetically semitransparent," or "plant semitransparent" refer to solar panels that have an APT of 1-45%.

As described above, the transparent solar panel may include a TPV or a TLSC. Transparent solar panels according to the current technology may differ from other standalone or non-agrivoltaic TPVs and TLSCs at least in absorption and transmission wavelength ranges. More specifically, TPVs and TLSCs according to the current technology are tailored or optimized to transmit light used to stimulate growth and/or quality of photosynthetic organisms, such as plants, rather than visible light (although ranges of transmitted wavelengths may partially overlap), and harvest light that is less useful for stimulation of organism growth and quality for energy production.

In at least one example embodiment, the solar panel may be transparent or semitransparent and have an APT of greater than or equal to about 20% (e.g., greater than or equal to about 25%, greater than or equal to about 30%, greater than or equal to about 35%, greater than or equal to about 40%, greater than or equal to about 45%, greater than or equal to about 50%, greater than or equal to about 55%, greater than or equal to about 60%, greater than or equal to about 65%, greater than or equal to about 70%, greater than or equal to about 75%, greater than or equal to about 80%, greater than or equal to about 85%, or greater than or equal to about 90%). The APT may be less than or equal to about 100% (e.g., less than or equal to about 95%, less than or equal to about 90%, less than or equal to about 85%, less than or equal to about 80%, less than or equal to about 75%, less than or equal to about 70%, less than or equal to about 65%, less than or equal to about 60%, less than or equal to about 55%, or less than or equal to about 50%).

The solar panel may be configured to transmit light to a region containing one or more plants. In at least one example embodiment, the region may be configured to receive light, via the solar panel, at a DLI of greater than or equal to about 5 mol·m$^{-2}$·d$^{-1}$ (e.g., greater than or equal to about 6 mol·m$^{-}$ $_2 \cdot d^{-1}$, greater than or equal to about 7 mol·m$^{-2}$·d$^{-1}$, greater than or equal to about 8 mol·m$^{-2}$·d$^{-1}$, greater than or equal to about 9 mol·m$^{-2}$·d$^{-1}$, greater than or equal to about 10 mol·m$^{-2}$·d$^{-1}$, greater than or equal to about 11 mol·m$^{-2}$·d$^{-1}$, greater than or equal to about 12 mol·m$^{-2}$·d$^{-1}$, greater than or equal to about 13 mol·m$^{-2}$·d$^{-1}$, greater than or equal to about 14 mol·m$^{-2}$·d$^{-1}$, greater than or equal to about 15 mol·m$^{-2}$·d$^{-1}$, greater than or equal to about 16 mol·m$^{-2}$·d$^{-1}$, greater than or equal to about 17 mol·m$^{-2}$·d$^{-1}$, greater than or equal to about 18 mol·m$^{-2}$·d$^{-1}$, greater than or equal to about 19 mol·m$^{-2}$·d$^{-1}$, greater than or equal to about 20 mol·m$^{-2}$·d$^{-1}$, greater than or equal to about 21 mol·m$^{-2}$·d$^{-1}$, greater than or equal to about 22 mol·m$^{-2}$·d$^{-1}$, greater than or equal to about 23 mol·m$^{-2}$·d$^{-1}$, greater than or equal to about 24 mol·m$^{-2}$·d$^{-1}$, greater than or equal to about 25 mol·m$^{-2}$·d$^{-1}$, greater than or equal to about 30 mol·m$^{-2}$·d$^{-1}$, greater than or equal to about 35 mol·m$^{-2}$·d$^{-1}$, greater than or equal to about 40 mol·m$^{-2}$·d$^{-1}$, or greater than or equal to about 45 mol·m$^{-2}$·d$^{-1}$). The DLI may be less than or equal to about 50 mol·m$^{-2}$·d$^{-1}$ (e.g., less than or equal to about 45 mol·m$^{-2}$·d$^{-1}$, less than or equal to about 40 mol·m$^{-2}$·d$^{-1}$, less than or equal to about 35 mol·m$^{-2}$·d$^{-1}$, less than or equal to about 30 mol·m$^{-2}$·d$^{-1}$, less than or equal to about 25 mol·m$^{-2}$·d$^{-1}$ or less than or equal to about 20 mol·m$^{-2}$·d$^{-1}$).

In an at least one example embodiment, the region may be configured to receive light, via the solar panel, at an eDLI of greater than or equal to about 5 mol·m$^{-2}$·d$^{-1}$ (e.g., e.g., greater than or equal to about 6 mol·m$^{-2}$·d$^{-1}$, greater than or equal to about 7 mol·m$^{-2}$·d$^{-1}$, greater than or equal to about 8 mol·m$^{-2}$·d$^{-1}$, greater than or equal to about 9 mol·m$^{-2}$·d$^{-1}$, greater than or equal to about 10 mol·m$^{-2}$·d$^{-1}$, greater than or equal to about 11 mol·m$^{-2}$·d$^{-1}$, greater than or equal to about 12 mol·m$^{-2}$·d$^{-1}$, greater than or equal to about 13 mol·m$^{-2}$·d$^{-1}$, greater than or equal to about 14 mol·m$^{-2}$·d$^{-1}$, greater than or equal to about 15 mol·m$^{-2}$·d$^{-1}$, greater than or equal to about 16 mol·m$^{-2}$·d$^{-1}$, greater than or equal to about 17 mol·m$^{-2}$·d$^{-1}$, greater than or equal to about 18 mol·m$^{-2}$·d$^{-1}$, greater than or equal to about 19 mol·m$^{-2}$·d$^{-1}$, greater than or equal to about 20 mol·m$^{-2}$·d$^{-1}$, greater than or equal to about 21 mol·m$^{-2}$·d$^{-1}$, greater than or equal to about 22 mol·m$^{-2}$·d$^{-1}$, greater than or equal to about 23 mol·m$^{-2}$·d$^{-1}$, greater than or equal to about 24 mol·m$^{-2}$·d$^{-1}$, greater than or equal to about 25 mol·m$^{-2}$·d$^{-1}$, greater than or equal to about 30 mol·m$^{-2}$·d$^{-1}$, greater than or equal to about 35 mol·m$^{-2}$·d$^{-1}$, greater than or equal to about 40 mol·m$^{-2}$·d$^{-1}$, or greater than or equal to about 45 mol·m$_2$·d$^{-1}$, or greater than or equal to about 50 mol·m$^{-2}$·d$^{-1}$, or greater than or equal to about 55 mol·m$^{-2}$·d$^{-1}$). The eDLI may be less than or equal to about 60 mol·m$^{-2}$·d$^{-1}$ (e.g., less than or equal to about 55 mol·m$^{-2}$·d$^{-1}$, less than or equal to about 50 mol·m$^{-2}$·d$^{-1}$, less than or equal to about 45 mol·m$^{-2}$·d$^{-1}$, less than or equal to about 40 mol·m$^{-2}$·d$^{-1}$, less than or equal to about 35 mol·m$^{-2}$·d$^{-1}$, less than or equal to about 30 mol·m$^{-2}$·d$^{-1}$, less than or equal to about 25 mol·m$^{-2}$·d$^{-1}$, or less than or equal to about 20 mol·m$^{-2}$·d$^{-1}$).

In at least one example embodiment, the region may be configured to receive light, via the solar panel, at a YPFD of greater than or equal to about 2 mol·m$^{-2}$·d$^{-1}$ (e.g., greater than or equal to about 5 mol·m$^{-2}$·d$^{-1}$, greater than or equal to about 10 mol·m$^{-2}$·d$^{-1}$, greater than or equal to about 11 mol·m$^{-2}$·d$^{-1}$ greater than or equal to about 12 mol·m$^{-2}$·d$^{-1}$, greater than or equal to about 13 mol·m$^{-2}$·d$^{-1}$, greater than or equal to about 14 mol·m$^{-2}$·d$^{-1}$, greater than or equal to about 15 mol·m$^{-2}$·d$^{-1}$, greater than or equal to about 16 mol·m$^{-2}$·d$^{-1}$, greater than or equal to about 17 mol·m$^{-2}$·d$^{-1}$, greater than or equal to about 18 mol·m$^{-2}$·d$^{-1}$, greater than or equal to about 19 mol·m$^{-2}$·d$^{-1}$, greater than or equal to about 20 mol·m$^{-2}$·d$^{-1}$, greater than or equal to about 21 mol·m$^{-2}$·d$^{-1}$, greater than or equal to about 22 mol·m$^{-2}$·d$^{-1}$, greater than or equal to about 23 mol·m$^{-2}$·d$^{-1}$, greater than or equal to about 24 mol·m$^{-2}$·d$^{-1}$, greater than or equal to about 25 mol·m$^{-2}$·d$^{-1}$, greater than or equal to about 30 mol·m$^{-2}$·d$^{-1}$, greater than or equal to about 35 mol·m$^{-2}$·d$^{-1}$, or greater than or equal to about 40 mol·m$^{-2}$·d$^{-1}$). The YPFD may be less than or equal to about 45 mol·m$^{-2}$·d$^{-1}$ (e.g., less than or equal to about 40 mol·m$^{-2}$·d$^{-1}$, less than or equal to about 35 mol·m$^{-2}$·d$^{-1}$, less than or equal to about 30 mol·m$^{-2}$·d$^{-1}$, less than or equal to about 25 mol·m$^{-2}$·d$^{-1}$, or less than or equal to about 20 mol·m$^{-2}$·d$^{-1}$).

As used herein, "substantially absorbent" means that the light absorbing material (e.g., the solar panel) absorbs greater than or equal to about 50% of light of a particular wavelength (e.g., greater than or equal to about 60%, greater than or equal to about 70%, greater than or equal to about 80%, or greater than or equal to about 90% of the light having the particular wavelength). In at least one example embodiment, the solar cell may be substantially absorbent to light having a wavelength of greater than or equal to about 700 nm, greater than or equal to about 710 nm, greater than or equal to about 720 nm, greater than or equal to about 730 nm, greater than or equal to about 740 nm, greater than or equal to about 750 nm, greater than or equal to about 760 nm, greater than or equal to about 770 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 860 nm, greater than or equal to about 870 nm, greater than or equal to about 880 nm, greater than or equal to about 890 nm, or greater than or equal to about 900 nm. The solar cell may be substantially absorbent to light having a wavelength of less than or equal to about 450 nm, less than or equal to about 440 nm, less than or equal to about 430 nm, less than or equal to about 420 nm, less than or equal to about 410 nm, less than or equal to about 400 nm, less than or equal to about 390 nm, less than or equal to about 380 nm, less than or equal to about 370 nm, less than or equal to about 360 nm, or less than or equal to about 350 nm, less than or equal to about 340 nm, less than or equal to about 330 nm, less than or equal to about 320 nm, less than or equal to about 310 nm, less than or equal to about 300 nm, less than or equal to about 290 nm, or less than or equal to about 280 nm.

In at least one example embodiment, the solar cell may have a largest peak absorption (also referred to as a "primary absorption peak") that is greater than any absorption peak in the PAR (or alternatively, ePAR). The largest peak absorption may occur at a wavelength of greater than or equal to about 700 nm (e.g., greater than or equal to about 710 nm, greater than or equal to about 720 nm, greater than or equal to about 730 nm, greater than or equal to about 740 nm, greater than or equal to about 750 nm, greater than or equal to about 760 nm, greater than or equal to about 770 nm greater than or equal to about 760 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 860 nm, greater than or equal to about 870 nm, greater than or equal to about 880 nm, greater than or equal to about 890 nm, or greater than or equal to about 900 nm). The largest peak absorption may occur at a wavelength of less than or equal to about 1200 nm (e.g., less than or equal to about 1100 nm, less than or equal to about 1050 nm, less than or equal to about 1000 nm, or less than or equal to about 950 nm).

In at least one other example embodiment, the solar cell may have a largest peak absorption at a wavelength of less than or equal to about 450 nm (e.g., less than or equal to about 440 nm, less than or equal to about 430 nm, less than or equal to about 420 nm, less than or equal to about 410 nm, less than or equal to about 400 nm, less than or equal to about 390 nm, less than or equal to about 380 nm, less than or equal to about 370 nm, less than or equal to about 360 nm, or less than or equal to about 350 nm, less than or equal to about 340 nm, less than or equal to about 330 nm, less than or equal to about 320 nm, less than or equal to about 310 nm, less than or equal to about 300 nm, less than or equal to about 290 nm, or less than or equal to about 280 nm). The largest peak absorption may occur at a wavelength of greater than or equal to about 200 nm (e.g., greater than or equal to about 250 nm, greater than or equal to about 300 nm, greater than or equal to about 350 nm, or greater than or equal to about 400 nm).

In at least one example embodiment, the solar cell may have a second largest peak absorption (also referred to as a "secondary absorption peak"). The secondary absorption peak may occur at a wavelength of greater than or equal to about 700 nm (e.g., greater than or equal to about 710 nm, greater than or equal to about 720 nm, greater than or equal to about 730 nm, greater than or equal to about 740 nm, greater than or equal to about 750 nm, greater than or equal to about 760 nm, greater than or equal to about 770 nm greater than or equal to about 760 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 860 nm, greater than or equal to about 870 nm, greater than or equal to about 880 nm, greater than or equal to about 890 nm, or greater than or equal to about 900 nm). The secondary absorption peak may occur at a wavelength of less than or equal to about 1200 nm (e.g., less than or equal to about 1100 nm, less than or equal to about 1050 nm, less than or equal to about 1000 nm, or less than or equal to about 950 nm).

In at least one other example embodiment, the solar cell may have a secondary absorption peak at a wavelength of less than or equal to about 450 nm (e.g., less than or equal to about 440 nm, less than or equal to about 430 nm, less than or equal to about 420 nm, less than or equal to about 410 nm, less than or equal to about 400 nm, less than or equal to about 390 nm, less than or equal to about 380 nm, less than or equal to about 370 nm, less than or equal to about 360 nm, or less than or equal to about 350 nm, less than or equal to about 340 nm, less than or equal to about 330 nm, less than or equal to about 320 nm, less than or equal to about 310 nm, less than or equal to about 300 nm, less than or equal to about 290 nm, or less than or equal to about 280 nm). The secondary absorption peak may occur at a wavelength of greater than or equal to about 200 nm (e.g., greater than or equal to about 250 nm, greater than or equal to about 300 nm, greater than or equal to about 350 nm, or greater than or equal to about 400 nm).

In at least one example embodiment, the transparent solar cell may have an transmission cutoff (also referred to as an "absorption cutoff" or a "wavelength cutoff") which is a 1-transmission (or absorption) of approximately 5%, 10%, or 15%, or 20% of the peak 1-transmission (or absorption). The transmission cutoff can be at a wavelength of greater than or equal to about 700 nm, greater than or equal to about 710 nm, greater than or equal to about 720 nm, greater than or equal to about 730 nm, greater than or equal to about 740 nm, greater than or equal to about 750 nm, greater than or equal to about 760 nm, greater than or equal to about 770 nm greater than or equal to about 760 nm, greater than or equal to about 780 nm, greater than or equal to about 790 nm, greater than or equal to about 800 nm, greater than or equal to about 810 nm, greater than or equal to about 820 nm, greater than or equal to about 830 nm, greater than or equal to about 840 nm, greater than or equal to about 850 nm, greater than or equal to about 860 nm, greater than or equal to about 870 nm, greater than or equal to about 880 nm, greater than or equal to about 890 nm, or greater than or equal to about 900 nm. In at least one example embodiment, the transparent solar cell may have a transmission cutoff of less than or equal to about 450 nm (e.g., less than or equal to about 440 nm, less than or equal to about 430 nm, less than or equal to about 420 nm, less than or equal to about 410 nm, less than or equal to about 400 nm, less than or equal to about 390 nm, less than or equal to about 380 nm, less than or equal to about 370 nm, less than or equal to about 360 nm, or less than or equal to about 350 nm, less than or equal to about 340 nm, less than or equal to about 330 nm, less than or equal to about 320 nm, less than or equal to about 310 nm, less than or equal to about 300 nm, less than or equal to about 290 nm, or less than or equal to about 280 nm).

The solar panel may be at least partially transparent to blue light. In at least one example embodiment, the solar panel is greater than or equal to about 50% (e.g., greater than or equal to about 55%, greater than or equal to about 60%, greater than or equal to about 65%, greater than or equal to about 70%, greater than or equal to about 75%, greater than or equal to about 80%, or greater than or equal to about 85%) transparent to blue light having a wavelength of having a wavelength of about 400-500 nm (including at all wavelengths 400-450 nm, at all wavelengths 425-475 nm, at all wavelengths 450-480 nm, and/or at all wavelengths 450-500 nm, and at wavelengths of 410 nm, 420 nm, 430 nm, 440 nm, 450 nm, 460 nm, 470 nm, 480 nm, and/or 490 nm by way of example). The solar panel may be less than or equal to about 100% (e.g., less than or equal to about 95%, less than or equal to about 90%, less than or equal to about 85%, less than or equal to about 80%, less than or equal to about 75%, or less than or equal to about 70%) transparent to blue light having a wavelength of having a wavelength of about 400-500 nm (including at all wavelengths 400-450 nm, at all wavelengths 425-475 nm, at all wavelengths 450-480 nm, and/or at all wavelengths 450-500 nm, and at wavelengths of 410 nm, 420 nm, 430 nm, 440 nm, 450 nm, 460 nm, 470 nm, 480 nm, and/or 490 nm by way of example).

The solar panel may be at least partially transparent to green light. In at least one example embodiment, the solar panel is greater than or equal to about 50% (e.g., greater than or equal to about 55%, greater than or equal to about 60%, greater than or equal to about 65%, greater than or equal to about 70%, greater than or equal to about 75%, greater than or equal to about 80%, or greater than or equal to about 85%) transparent to green light having a wavelength of 500-600 nm (including at all wavelengths 500-550 nm, at all wavelengths 520-540 nm, at all wavelengths 525-575 nm, at all wavelengths 550-600 nm, and wavelengths of 510 nm, 520 nm, 530 nm, 540 nm, 550 nm, 560 nm, 570 nm, 580 nm, and/or 590 nm, by way of example). The solar panel may be less than or equal to about 100% (e.g., less than or equal to about 95%, less than or equal to about 90%, less than or equal to about 85%, less than or equal to about 80%, less than or equal to about 75%, or less than or equal to about 70%) transparent to green light having a wavelength of about 500-600 nm (including at all wavelengths 500-550 nm, at all wavelengths 520-540 nm, at all wavelengths 525-575 nm, at all wavelengths 550-600 nm, and wavelengths of 510 nm, 520 nm, 530 nm, 540 nm, 550 nm, 560 nm, 570 nm, 580 nm, and/or 590 nm, by way of example).

The solar panel may be at least partially transparent to red light. In at least one example embodiment, the solar panel is greater than or equal to about 50% (e.g., greater than or equal to about 55%, greater than or equal to about 60%, greater than or equal to about 65%, greater than or equal to about 70%, greater than or equal to about 75%, greater than or equal to about 80%, or greater than or equal to about 85%) transparent to red light having a wavelength of 600-700 nm (including at all wavelengths 600-650 nm, at all wavelengths 620-640 nm, at all wavelengths 625-675 nm, and/or at all wavelengths 650-700 nm, and wavelengths of 610 nm, 620 nm, 630 nm, 640 nm, 650 nm, 660 nm, 670 nm, 680 nm, and/or 690 nm, by way of example). The solar panel may be less than or equal to about 100% (e.g., less than or equal to about 95%, less than or equal to about 90%, less than or equal to about 85%, less than or equal to about 80%, less than or equal to about 75%, or less than or equal to about 70%) transparent to red light having a wavelength of about 600-700 nm (including at all wavelengths 600-650 nm, at all wavelengths 620-640 nm, at all wavelengths 625-675 nm, and/or at all wavelengths 650-700 nm, and wavelengths of 610 nm, 620 nm, 630 nm, 640 nm, 650 nm, 660 nm, 670 nm, 680 nm, and/or 690 nm, by way of example).

The solar panel may be at least partially transparent to far-red light. In at least one example embodiment, the solar panel is greater than or equal to about 50% (e.g., greater than or equal to about 55%, greater than or equal to about 60%, greater than or equal to about 65%, greater than or equal to about 70%, greater than or equal to about 75%, greater than or equal to about 80%, or greater than or equal to about 85%) transparent to far-red light having a wavelength of 700-750 nm (including at all wavelengths 700-725 nm, at all wavelengths 700-720 nm, at all wavelengths 700-710 nm, and/or at all wavelengths 725-750 nm, and wavelengths of 710, 720, 730, and/or 740, by way of example). The solar panel may be less than or equal to about 100% (e.g., less than or equal to about 95%, less than or equal to about 90%, less than or equal to about 85%, less than or equal to about 80%, less than or equal to about 75%, or less than or equal to about 70%) transparent to far-red light having a wavelength of about 700-750 nm (including at all wavelengths 700-725 nm, at all wavelengths 700-720 nm, at all wavelengths 700-710 nm, and/or at all wavelengths 725-750 nm, and wavelengths of 710, 720, 730, and/or 740, by way of example).

Another non-obvious, but important metric in at least one example embodiment is the solar heat gain coefficient (SHGC). The SHGC is the ratio of transmitted solar radiation to incident solar radiation of the entire solar panel or device. The SHGC is utilized in the window industry to quantitatively assess how much the window blocks heat caused by sunlight (including UV, VIS, NIR, and IR). The SHGC is controlled based on structure (e.g., by addition of layers), for example in the electrode as a compound electrode (single-silver or multilayer silver), on the waveguide, and/or adjacent to the waveguide, as described in greater detail below.

In at least one example embodiment, the SHGC may be less than or equal to about 0.7 (e.g., less than or equal to about 0.65, less than or equal to about 0.6, less than or equal to about 0.55, less than or equal to about 0.5, less than or equal to about 0.45, less than or equal to about 0.4, less than or equal to about 0.35, less than or equal to about 0.3, less than or equal to about 0.25, less than or equal to about 0.2, or less than or equal to about 0.15).

The SHGC is important to buildings because it impacts the energy efficiency of the building and dictates the cooling load needed. The lower the SHGC, the more solar heat that is blocked. The SHGC is defined as:

$$SHGC = \frac{\int T(\lambda)S(\lambda)d\lambda}{\int S(\lambda)d\lambda} + \frac{\int A*(\lambda)S(\lambda)d\lambda}{\int S(\lambda)d\lambda}, \qquad \text{(Equation 2)}$$

where A* is the absorption spectra of the transparent agrivoltaic solar cell from the contribution of energy that is transmitted into the room (not the entire absorption flux, since some of this energy is radiated outward away from the window).

The SHGC will also be important in agricultural applications as it can be used to reduce the heat load to plants that reduce water evaporation rates reduce irrigation demand, reduce heat-related loss of crops, and/or improve crop resiliency, and in enclosed applications, reduce the cooling demand/load. In the case of open field deployment, the SHGC can be modified as:

$$SHGC^* = \frac{\int T(\lambda)S(\lambda)d\lambda}{\int S(\lambda)d\lambda}, \qquad \text{(Equation 3)}$$

where the absorption term is removed, since the absorption component will not be translated to the plants directly and there is a free-flow of air around (above and below) the panel array.

Low-e coatings are one approach to achieving a low SHGC with a simultaneously high AVT. They reflect (or reject) portions of the UV, NIR, and/or IR light. An uncoated piece of glass typically has a SHGC of around 0.818 while high quality low-e windows typically have a SHGC from 0.5-0.2. Low-e coatings can be made with thin or ultrathin metals such as Ag, Au, and/or Cu. There are three common types of Ag based low-e coatings: single-silver, double-silver, or triple-silver in configurations such as [MO/metal/]$_x$/MO, [organic/Metal/]$_x$/organic, or [base/seed/metal/blocker/seed]$_x$top layer, where x (the number of repeating layers)=1, 2, 3, and so on.

Examples of the metal oxide (MO) include $MoO_3$, $Bi_2O_3$, $SnO_2$, ZnO, $TiO_2$, $SiO_2$, $Zn_2SnO_4$, $Si_3N_4$, indium-doped tin oxide (ITO), and aluminum-doped zinc oxide (AZO), or any combination thereof. The MO can range in thickness from greater than or equal to about 10 nm to less than or equal to about 50 nm. Examples of the organic include bathocuproine, alpha-NPD, $Alq_3$, or any combination thereof. Examples of the metal include Ag, Au, and Cu and range in thickness from greater than or equal to about 2 nm to less than or equal to about 20 nm. As an example, a silver stack layout from PPG products has a base of $Zn_2SnO_4$, a seed of ZnO, a metal of Ag, a blocker of Ti, and a top layer of $TiO_2$ with x=2 and the zinc stannate layer in the middle has a thickness roughly equal to the total thickness of the base and the top layer of the single silver. Low-e stacks can be integrated into either TPVs or TLSC device stacks but in different ways. In the case of TPVs (see, e.g., the TPV 200 of FIG. 2), the low-e stack can be synergistically utilized to replace the top transparent electrode and a function as a conductive transparent electrode (due to presence of the thin metal) and a low-e layer simultaneously. In this case, the resistance of the electrode and the optical transmittances are increased and decreased, respectively, with increasing Ag thickness so that there is an optimum Ag thickness (e.g., 5 nm, 7 nm, 10 nm, or 12 nm). In the case of the TLSC (see, e.g., the TLSC 300 of FIGS. 3A-3B), the low-e stack can be coated monolithically on the backside of the waveguide or integrated polylithically.

As used herein, "transmission haze" means the diffuse transmittance (i.e., the amount of light that gets scattered in a device, but that still transmits through) divided by the total transmittance (i.e., the total amount of light that gets trough, whether scattered or not). The solar panel may have a transmission haze of less than or equal to about 100% (e.g., less than or equal to about 90%, less than or equal to about 80%, less than or equal to about 70%, less than or equal to about 60%, less than or equal to about 50%, less than or equal to about 40%, less than or equal to about 30%, less than or equal to about 20%, less than or equal to about 10%, less than or equal to about 5%, less than or equal to about 2%, or less than or equal to about 1%), including a haze of about 20%, about 18%, about 16%, about 14%, about 12%, about 10%, about 8%, about 6%, about 4%, about 2%, about 1%, and less. The solar panel may be substantially free of haze. As used herein, the term "substantially free of haze" means that a device has less than or equal to about 20% haze. The panels may have or be substantially free of visible, average visible, or PAR haze.

As used herein, the color rendering index (CRI) is the range of perceptible visible light. The CRI is subsequently utilized to determine aesthetic limits for visibly transparent solar cells. Specifically, the CRI is a quantitative metric for evaluating the quality of lighting systems and can be utilized to evaluate the level or perceptible color-tinting of a window. CRIs are calculated based on ideal transmission profiles (step-functions) in combination with International Commission on Illumination (CIE) 1976 three-dimensional uniform color space (CIELUV), CIE 1974 test-color samples, and with correction for chromatic adaptation (non-planckian-locus), when necessary, according to:

$$CRI = \frac{1}{8}\sum_{i=1}^{8}\left(100 - 4.6\sqrt{(\Delta L_i^*)^2 + (\Delta u_i^*)^2 + (\Delta v_i^*)^2}\right),$$

<div align="right">Equation 4</div> where $$\Delta L_i^*, \Delta u_i^*, \text{ and } \Delta v_i^*$$

are the difference in lightness (L*) and chromaticity coordinates (u*, v*) between each color sample, i (8 in total) "illuminated" with a fixed reference solar spectrum (AM1.5G) and the transmission sources (T(λ)·AM1.5(λ)). CRI and AVT are described in detail in Lunt, "Theoretical Limits for Visibly Transparent Photovoltaics." Appl. Phys. Lett., 101, 043902 (2012), which is incorporated herein by reference in its entirety.

In at least one example embodiment, the solar panel may have a CRI of greater than or equal to about 80 (e.g., greater than or equal to about 85, greater than or equal to about 90, or greater than or equal to about 95), referenced to an air mass 1.5 global (AM 1.5G) solar spectrum or the PAR spectrum. Therefore, in at least one example embodiment, the solar cell is visibly or plant transparent, such that when an observer looks through the solar cell, objects on an opposing side of solar cell appear substantially (or completely) in their natural "color" and substantially without tint or haze. Commission on Illumination (CIE) light utilization efficiency (LUE) color metrics can also be utilized as a substitute for CRI.

Power conversion efficiency (PCE) is derived from current-density (J)-voltage (V) curves, and specifically the electrical power generated divided by the incident solar power. In at least one example embodiment, the solar panel has a PCE of greater than or equal to about 0.3% (e.g., greater than or equal to about 0.5%, greater than or equal to about 0.6%, greater than or equal to about 0.65%, greater than or equal to about 0.7%, greater than or equal to about 0.75%, greater than or equal to about 0.8%, greater than or equal to about 0.9%, greater than or equal to about 1%, greater than or equal to about 1.5%, greater than or equal to about 2.0%, greater than or equal to about 3%, greater than or equal to about 4%, greater than or equal to about 5%, greater than or equal to about 6%, or greater than or equal to about 7%, greater than or equal to about 8%, greater than or equal to about 9%, or greater than or equal to about 10%).

In at least one example embodiment, a surface area of a single solar panel may be greater than or equal to about 0.01 m² (e.g., greater than or equal to about 0.05 m², greater than or equal to about 0.1 m², greater than or equal to about 0.5 m², greater than or equal to about 1 m², greater than or equal to about 1.5 m², or greater than or equal to about 5 m²). The solar cell area may be less than or equal to about 10 m² (e.g., less than or equal to about 5 m², less than or equal to about 2 m², less than or equal to about 1 m², less than or equal to about 0.5 m², less than or equal to about 0.1 m², or less than or equal to about 0.05 m²).

As used herein, external quantum efficiency (EQE) is the efficiency of converting photons of a particular wavelength to electrons. In at least one example embodiment, the EQE may be greater than or equal to about 1% (e.g., greater than or equal to about 1.5%, greater than or equal to about 2%, greater than or equal to about 2.5%, greater than or equal to about 3%, greater than or equal to about 3.5%, greater than or equal to about 4%, greater than or equal to about 4.5%, greater than or equal to about 5%, greater than or equal to about 6%, greater than or equal to about 7%, greater than or equal to about 10%, greater than or equal to about 20%, greater than or equal to about 30%, greater than or equal to about 40%, greater than or equal to about 50%, greater than or equal to about 60%, greater than or equal to about 70%, greater than or equal to about 80%, or greater than or equal to about 90%). The EQE may be less than or equal to about 95%.

Traditionally, LUE or light utilization factor is the product of PCE and the AVT. It is a measure of how well the spectrum is utilized for both light transmission and power generation. Here, we define LUE* as the PCE times the APT (instead of AVT) so that it is a measure of how well the spectrum is utilized for both plant growth and power generation. The LUE* may be greater than or equal to about 0.5 (e.g., greater than or equal to about 0.7, greater than or equal to about 1, greater than or equal to about 1.5, greater than or equal to about 2, greater than or equal to about 3, greater than or equal to about 4, greater than or equal to about 5, greater than or equal to about 6, greater than or equal to about 7, greater than or equal to about 8, greater than or equal to about 9, or greater than or equal to about 10). The LUE* may be less than or equal to about 10 (e.g., less than or equal to about 9, less than or equal to about 8, less than or equal to about 7, less than or equal to about 6, less than or equal to about 5, less than or equal to about 4, less than or equal to about 3, less than or equal to about 2, or less than or equal to about 1).

The solar cells described herein may have a L*a*b* color space defined by the CIE, i.e., a CIELAB color space, that is substantially white. More particularly, the solar cells exhibit |a*| and |b*| values of less than or equal to about 25 (e.g., less than or equal to about 20, less than or equal to about 15, less than or equal to about 10, or less than or equal to about 5) and L* values greater than or equal to about 10 (e.g., greater than or equal to about 25, greater than or equal to about 50, greater than or equal to about 75, or greater than or equal to about 95), including L* values of about 100, about 95, about 90, about 85, about 80, about 75, about 70, about 65, about 60, about 55, about 50, about 45, about 40, about 35, about 30, about 25, about 20, about 15, and about 10. More particularly, the solar cells exhibit sqrt ($|a*|^2 + |b*|^2$) values of less than or equal to about 25 (e.g., less than or equal to about 20, less than or equal to about 15, less than or equal to about 10, less than or equal to about 5, or less than or equal to about 3).

As described above, in at least one example embodiment, the solar panel is configured to transmit light to a photosynthetic organism. As used herein, photosynthetic organisms are organisms that benefit from sunlight, such as organisms capable of capturing solar energy and using it for the production of organic compounds. The photosynthetic organism may include plants, bacteria, protists (e.g., algae and euglena), coral, or any combination thereof, for example. Plants may include plants cultivated for their leaves and stems, referred to as leafy plants (e.g., basil), plants cultivated for their flowers, referred to as flowering plants (e.g., petunia), plants cultivated for their fruits, referred to as fruit-bearing plants (e.g., tomatoes, soy), grains (e.g., wheat, corn), forage crops (e.g., alfalfa) or any combination thereof. Some crops may belong to more than one of the above groups. By way of examples, plants amenable to growth using the solar panel optimized for growth may include rice, corn, wheat, soybean, potato, tomato, sugarcane, grape, cotton, apple, onion, cucumber, garlic, banana, oil palm, watermelon, mango, mangosteen, guava, groundnut, chili, pepper, sweet potato, barley, orange, eggplant, olive, sunflower, tangerine, mandarin, clementine, satsuma, cabbage, spinach, strawberry, peach, nectarine, tobacco, cannabis, coffee, lettuce, chicory, rubber, tea, pea, cowpea, sorghum, millet, oat, rye, buckwheat, quinoa, cassava, sugar beet, rapeseed, bean, peanut, yam, coconut, plantain, pear, cherry, pineapple, lemon, lime, papaya, plum, grapefruit, pomelo, date, avocado, apricot, kiwifruit, cranberry, blueberry, fig, currant, gooseberry, raspberry, blackberry, aubergine, carrot, turnip, cauliflower, broccoli, asparagus, mushroom, truffle, leek, artichoke, taro, okra, chickpea, pigeon pea, string bean, broad bean, green bean, dry bean, persimmon, cashew apple, gooseberry, linseed, cocoa bean, ginger, chicory, cashew, walnut, almond, chestnut, hazelnut, pistachio, bamboo, Chinese cabbage, kale, dill, hyacinth bean, mung bean, tamarind, black pepper, clove, durian, sago palm, turmeric, basil, flax, jujube, radicchio, safflower, sesame, Turkish filbert, alfalfa, anise, hawthorn, pomegranate, pumpkin, squash, quince, saffron, celery, chervil, endive, hop, lavender, parsley, peppermint, rhubarb, rosemary, rutabaga, sage, sorrel, thyme, black-eyed pea, lentil, teff, amaranth, arrowroot, cactus pear, agave, chayote, cherry tomato, chocolate, epazote, green sapote, lima bean, tequila, cherimoya, passionfruit, peach palm, pepino, brazil nut, melon, brussels sprouts, cactus, collard greens, mustard greens, swiss chard, sprouts, geranium, begonia, impatiens, petunia, pansy, sweet pea, snapdragon, lobelia, yarrow, hollyhock, alternanthera, alyssum, anemone, columbine, sea thrift, artemesia, butterfly weed, aster, aurinia, campanula, canna, celosia, red valerian, chrysanthemum, coreopsis, delosperma, delphinium, dianthus, foxglove, dusty miller, echinacea, globe thistle, erysimum, poinsettia, ornamental grass, gaillardia, gaura, gerbera, geum, helichrysum, coral bells, hibiscus, hypericum, spring snowflake, daisy, lisianthus, ornamental millet, bee balm, evening primrose, oregano, poppy, penstemon, pentas, phlox, balloon flower, lily, primula, rudbeckia, hosta, scabiosa, sedum, stock, tanacetum, veronica, vinca, viola, viburnum, spirea, stweartia, maple, peony, magnolia, hydrangea, iris, redbud, cleome, cedar, coleus, epimedium, serviceberry, hellebores, fothergilla, witch hazel, allium, rose, rhododendron, azalea, russian sage, yew, lantana, crocus, marigold, euphorbia, calibrachoa, verbena, scaevola, daylily, cineraria, heliotrope, mimulus, nemesia, zinnia, osteospermum, argyranthemum, bidens, browallia, cosmos, gazania, nasturtium, statice, tithonia, cactus, phalaenopsis, cymbidum, cattleya, zygopetalum, miltoniopsis, oncidium, dendrobium, anthurium, foliage plants, new guinea impatiens, fern, Easter lily, daffodil, hyacinth, tulip, mandevilla, african violet, oxalis, peace lily, jasmine, clivia, easter cactus, thanksgiving cactus, Christmas cactus, gloxinia, shrimp plant, bromeliad, kalanchoe, cyclamen, amaryllis, calla lily, dahlia, or any combination thereof.

As used herein, crop yield means crop yield means crop biomass per unit area. In at least one example embodiment, a crop yield of the plant grown under the light within the first wavelength range transmitted by the solar panel is reduced by less than or equal to 50% (e.g., less than or equal to about 45%, less than or equal to about 40%, less than or equal to about 35% less than or equal to about 30%, less than or equal to about 25%, less than or equal to about 20%, less than or equal to about 15%, less than or equal to about 10%, or less than or equal to about 5%) compared to a plant grown under full spectrum light in otherwise identical conditions.

Figure 2:
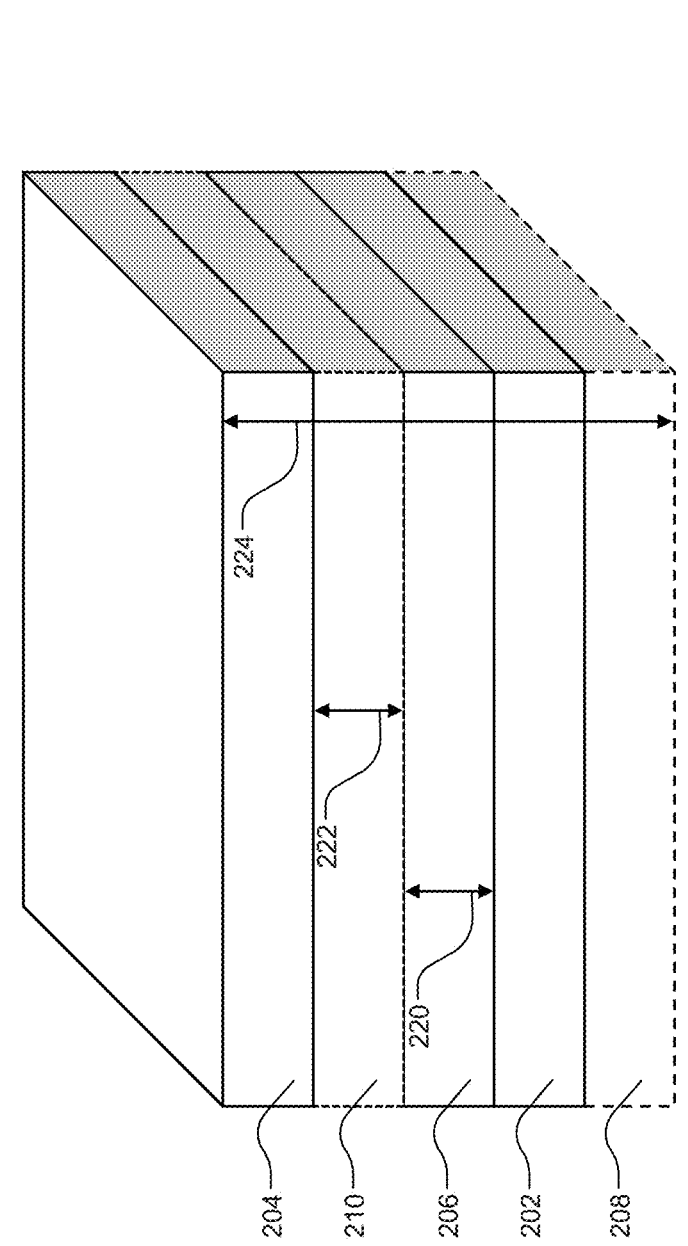

A TPV 200 according to at least one example embodiment is shown in FIG. 2. The TPV 200 generally includes a first electrode 202, a second electrode 204, and an active layer 206 between the first and second electrodes 202, 204. In at least one example embodiment, one or both of the first and second electrodes 202, 204 may be disposed on a transparent substrate 208. In at least one example embodiment, the first electrode 202 may be positioned on the transparent substrate 208 and include materials that act as the electrode, such that the substrate and electrode are visibly indistinguishable (not shown).

The TPV 200 (e.g., the entire TPV 200 between a surface that receives direct light and a surface that transmits the light) may have any of the characteristics described above, including, but not limited to APT, DLI, eDLI, YPFD, substantially absorbent wavelengths, wavelengths at largest peak absorption, wavelength cutoffs, blue light transparencies, green light transparencies, red light transparencies, far-red light transparencies, SHGC, transmission haze, CRI, PCE, and/or LUE*. Additionally, the TPV 200 may be used to transmit light to any of the photosynthetic organisms listed above at the above crop yields.

The active layer 206 includes a wavelength-selective light-absorbing material. The wavelength-selective light-absorbing material may be an electron donor or an electron acceptor. In at least one example embodiment, the TPV 200 may include more than one active layer 206. The wavelength-selective light-absorbing material and TPV device 200 are configured to transmit light that facilitates increased growth and/or yield of a living organism, such as a plant.

In at least one example embodiment, the wavelength-selective light-absorbing material is a polymer, a non-fullerene acceptor (NFA), or both a polymer and a NFA. Polymers may include D18, DPP2T (DT-PDPP2T-TT), DPP-DTT, J52, PBDB-T, PBDB-T-2CI, PBDB-T-2F, PBDD4T, PBDD4T-2F, PBDTT-DPP, PBDTTPD, PBDTTT-C-T, PBDTTTPD, PCDTBT, PDBD-T-SF, PDPP3T, PDPP4T, PDPP4T-2F, PffBT4T-2OD, PffBT4T-C9C13, PJ71, PMDPP3TPDBT-CO-TT, PTB7, and/or PTB7-Th (PCE10)), or any combination thereof, by way of example. NFAs may include 6TIC, BODIPYBTP-4CI-12, BTP-4F-12 (Y6-BO), BTP-eC9, COi8DFIC (O6T-4F), COTIC-4CI, COTIC-4F, DTY6, eC9-2CI, FBR, IDIC-4F, IDT-2Br, IEICO-4CI, IEICO-4F, IHIC, IO-4CI, ITIC, ITIC-2F, ITIC-4CI, ITIC-4F, ITIC-M, ITIC-Th, L8-BO, L8-BO-F, N3, 0-IDTBR, TPT-10, TPT10-C8C12, Y6 (BTP-4F), Y7, ZY-4CI, or any combination thereof, by way of example.

In at least one example embodiment, the wavelength-selective light-absorbing material includes a material as described in U.S. Pat. App. Pub. No. 2020/0343053 to Lunt et al., titled "UV Harvesting Transparent Photovoltaics," filed Jul. 7, 2020, which is incorporated by reference herein in its entirety. In at least one example embodiment, the wavelength-selective light-absorbing material is a metal halide, a metal nitride, a metal sulfide, a metal selenide, a metal telluride, an alloy thereof, or a combination thereof. The metal halide may include $PbI_2$, $PbCl_2$, $PbBr_2$, $PbI_xBr_{(1-X)}$, $PbI_xCl^{(1-x)}$, $PbBr_xCl^{(1-x)}$, $SnI_2$, $SnCl_2$, $SnBr_2$, $SnI_xBr_{(1-x)}$, $SnI_xCl^{(1-x)}$, $SnBr_xCl^{(1-x)}$, $GeI_2$, $GeCl_2$, $GeBr_2$, $GeI_xBr_{(1-x)}$, $GeI_xCl^{(1-x)}$, $GeBr_xCl^{(1-x)}$, $InI_3$, $InCl_3$, $InBr_3$, $TiI_3$, $TiCl_3$, $TiBr_3$, $GaI_3$, $GaBr_3$, $GaCl_3$, $AlCl_3$, $AlBr_3$, $AlI3$, $A_2TiI_6$, $A_2TiCl_6$, and $A_2TiBro$, where A is an alkali metal (Li, Na, K, Rb, Cs, or any combination thereof), an organic cation (methylammonium (MA), formamidinium (FA), ethanediammonium (EA), iso-propylammonium, dimethylammonium, guanidinium, piperidinium, pyridinium, pyrrolidinium, imidazolium, t-butylammonium or any combination thereof), or any combination thereof; the metal nitride comprise at least one of $In_{(X)}Ga^{(1-x)}N$ and $In_{(X)}Al^{(1-x)}N$; the metal sulfide comprises $ZnS_{(X)}Se^{(1-x)}$; the metal selenide comprises at least one of ZnSe, $ZnO_{(X)}Se^{(1-x)}$ and $Zn_{(X)}Mg^{(1-x)}Se$; and the metal telluride comprises at least one of $Zn_{(X)}Mg^{(1-x)}Te$ and $BeSe_{(X)}Te^{(1-x)}$, wherein for all of the above formulas O≤x≤1. In at least one example embodiment, the wavelength-selective light absorbing material includes $In_{(X)}Ga^{(1-x)}N$ (0.05≤x≤0.25), $In_{(X)}Al^{(1-x)}N$ (0.25≤x≤0.7), $ZnS_{(X)}Se^{(1-x)}$(0.1≤x≤0.9), $Zn_{(X)}Mg^{(1-x)}SE$ (0.05≤x≤0.5), $Zn_{(X)}Mg_{(1-x)}Te$ (0.05≤x≤0.95), and $BeSe_{(X)}Te^{(1-x)}$ (0.6≤x≤1).

In at least one example embodiment, the wavelength-selective light-absorbing material includes a material as described in U.S. Pat. App. Pub. No. 2020/0303667 to Lunt et al., titled "Enhancing the Lifetime of Organic and Organic Salt Photovoltaics," filed May 5, 2020, which is incorporated by reference herein in its entirety. In at least one example embodiment, the wavelength-selective light-absorbing material includes a neutral organic molecule or an organic salt. In at least one example embodiment, the photoactive neutral organic molecule is a cyanine, phthalocyanine, a porphyrin, a thiophene, a perylene, a polymer, derivatives thereof, or any combination thereof. For example, a phthalocyanine can include copper phthalocyanine, and chloroaluminum phthalocyanine (CIAIPc). In at least one example embodiment, the photoactive organic salt is a polymethine salt, cyanine salt, derivative thereof, or any combination thereof. Examples of suitable organic ions (which are "base ions" relative to their derivatives) that form organic salts in the presence of a counterion include 1-Butyl-2-(2-[3-[2-(1-butyl-1H-benzo[cd]indol-2-ylidene)-ethyl-idene]-2-phenyl-cyclopent-1-enyl]-vinyl)-benzo[cd]indolium (peak absorbance at 1024 nm), 1-Butyl-2-(2-[3-[2-(1-butyl-1H-benzo[cd]indol-2-ylidene)-ethylidene]-2-chloro-cyclohex-1-enyl]-vinyl)-benzo[cd]indolium (peak absorbance at 1014 nm), 1-Butyl-2-(2-[3-[2-(1-butyl-1H-benzo[cd]indol-2-ylidene)-ethylidene]-2-phenyl-cyclohex-1-enyl]-vinyl)-benzo[cd]indolium (peak absorbance at 997 nm), 1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium (peak absorbance at 996 nm), 1-Butyl-2-[7-(1-butyl-1H-benzo[cd]indol-2-ylidene)-hepta-1,3,5-trienyl]-benzo[cd]indolium (peak absorbance at 973 nm), 2-[2-[2-chloro-3-[2-(1,3-dihydro-3,3-dimethyl-1-ethyl-2H-benz[e]indol-2-ylidene)ethylidene]-1-cyclohexen-1-yl]-ethenyl]-3,3-dimethyl-1-ethyl-1H-benz[e]indolium ("Cy+"; peak absorbance at 820 nm), N,N,N',N'-Tetrakis-(p-di-n-butylaminophenyl)-p-benzochinon-bis-immonium (peak absorbance at 1065 nm), 4-[2-[2-Chloro-3-[(2,6-di-phenyl-4H-thiopyran-4-ylidene)ethylidene]-1-cyclohexen-1-yl]ethenyl]-2,6-diphenylthiopyrylium, 1-Butyl-2-[2-[3-[(1-butyl-6-chlorobenz[cd]indol-2(1H)-ylidene)ethylidene]-2-chloro-5-methyl-1-cyclohexen-1-yl]ethenyl]-6-chlorobenz[cd]indolium, 1-Butyl-2-[2-[3-[(1-butyl-6-chlorobenz[cd]indol-2(1H)-ylidene)ethylidene]-2-chloro-1-cyclohexen-1-yl]ethenyl]-6-chlorobenz[cd]indolium, Dimethyl {4-[1,7,7-tris(4-dimethylaminophenyl)-2,4,6-hep-tatrienylidene]-2,5-cyclohexadien-1-ylidene}ammonium, 5,5'-Dichloro-11-diphenylamino-3,3'-diethyl-10,12-ethyl-enethiatricarbocyanine, 2-[2-[2-Chloro-3-[2-(1,3-dihydro-1, 1,3-trimethyl-2H-benzo[e]-indol-2-ylidene)-ethylidene]-1-cyclohexen-1-yl]-ethenyl]-1,1,3-trimethyl-1H-benzo[e] indolium, 2-[2-[2-Chloro-3-[2-(1,3-dihydro-1,3,3-trimethyl-2H-indol-2-ylidene)-ethylidene]-1-cyclopenten-1-yl]-ethenyl]-1,3,3-trimethyl-3H-indolium, 2-[2-[3-[(1,3-Dihydro-3,3-dimethyl-1-propyl-2H-indol-2-ylidene) ethylidene]-2-(phenylthio)-1-cyclohexen-1-yl]ethenyl]-3,3-dimethyl-1-propylindolium, 1,1',3,3,3',3'-4,4',5,5'-di-benzo-2,2'-indotricarbocyanine perchlorate, 2-[2-[2-Chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium, 3,3'-Diethylthiatricarbocyanine, 2-[[2-[2-[4-(dimethylamino)phenyl]ethenyl]-6-methyl-4H-pyran-4-ylidene]methyl]-3-ethyl, 2-[7-(1,3-Dihydro-1,3,3-trimethyl-2H-indol-2-ylidene)-1,3,5-heptatrienyl]-1,3,3-trimethyl-3H-indolium, cyanine3 (Cy3), cyanine3.5 (Cy3.5), cyanine5 (Cy5), cyanine5.5 (Cy5.5), cyanine7 (Cy7), cyanine7.5 (Cy7.5), derivatives thereof, and combinations thereof. As used herein, "derivatives" of the organic ions refer to or include organic ions that resemble a base organic ion, but that contain minor changes, variations, or substitutions, such as in, for example, solubilizing groups with varying alkyl chain length or substitution with other solubilizing groups, which do not substantially change the bandgap or electronic properties, as well as substitutions at a central methane position (X,Y) with various halides or ligands. Examples of counterions (which are "base counterions" relative to their derivatives) that form salts with the organic ions include halides, such as F—, Cl—, I—, and Br—; aryl borates, such as tetraphenylborate, tetra(p-tolyl)borate, tetrakis(4-biphenylyl)borate, tetrakis(1-imidazolyl)borate, tetrakis(2-thienyl)borate, tetrakis(4-chlorophenyl)borate, tetrakis(4-fluorophenyl)borate, tetrakis(4-tert-butylphenyl)borate, tetrakis (pentafluorophenyl)borate (TPFB), tetrakis[3,5-bis (trifluoromethyl)phenyl]borate (TFM), [4-[bis(2,4,6-trimethylphenyl)phosphino]-2,3,5,6-tetrafluorophenyl] hydrobis(2,3,4,5,6-pentafluorophenyl)borate, [4-di-tert-butylphosphino-2,3,5,6-tetrafluorophenyl]hydrobis(2,3,4,5, 6-pentafluorophenyl)borate; carboranes, $(\wedge,R)$-(1,1'-binaphthalene-2,2'diolato)(bis(tetrachlor-1,2-benzenediolato)phosphate (V)) (BINPHAT), [$\Delta$-tris (tetrachloro-1,2-benzenediolato)phosphate (V)] (TRISPHAT); fluoroantimonates, such as hexafluoroantimonate ($SbF_6^-$); fluorophosphates, such as hexafluorophosphate ($PF_6^-$); fluoroborates, such as tetrafluoroborate ($BF_4$); derivatives thereof; or any combination thereof. As used herein, "derivatives" of the counterion refer to or include counterions or anions that resemble a base counterion, but that contain minor changes, variations, or substitutions, that do not substantially change the ability of the counterion to form a salt with the organic ion.

In at least one example embodiment, the TPV 200 optionally includes a complementary layer 210 including an electron acceptor. The complementary layer 210 can be a distinct layer, as shown, or may be included in the active layer 206. Therefore, the active layer 206 can comprise, consist essentially of, or consist of the organic photoactive component and the electron acceptor, or the active layer 16 can comprise, consist essentially of, or consist of the organic photoactive component. As used herein, the term "consists essentially of" means that a layer can only include trace amounts, i.e., less than or equal to about 10 wt. %, of additional unavoidable impurity materials that do not substantially affect the activity (i.e., by less than about 10%) generated by the pairing of the electron donor (photoactive component) and electron acceptor.

The active layer or donor layer 206 may define a first or donor thickness 220. In at least one example embodiment, the first thickness 220 is greater than or equal to about 3 nm (e.g., greater than or equal to about 5 nm, greater than or equal to about 10 nm, greater than or equal to about 15 nm, greater than or equal to about 20 nm, greater than or equal to about 25 nm, greater than or equal to about 30 nm, greater than or equal to about 40 nm, greater than or equal to about 50 nm, greater than or equal to about 60 nm, greater than or equal to about 70 nm, greater than or equal to about 80 nm, or greater than or equal to about 90 nm). The first thickness 220 may be less than or equal to about 100 nm (e.g., less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 25 nm, less than or equal to about 20 nm, less than or equal to about 15 nm, less than or equal to about 10 nm, or less than or equal to about 5 nm).

The complementary layer 210 may define a second or acceptor thickness 222. In at least one example embodiment, the second thickness 222 is greater than or equal to about 3 nm (e.g., greater than or equal to about 5 nm, greater than or equal to about 10 nm, greater than or equal to about 15 nm, greater than or equal to about 20 nm, greater than or equal to about 25 nm, greater than or equal to about 30 nm, greater than or equal to about 40 nm, greater than or equal to about 50 nm, greater than or equal to about 60 nm, greater than or equal to about 70 nm, greater than or equal to about 80 nm, or greater than or equal to about 90 nm). The second thickness 222 may be less than or equal to about 100 nm (e.g., less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, less than or equal to about 25 nm, less than or equal to about 20 nm, less than or equal to about 15 nm, less than or equal to about 10 nm, or less than or equal to about 5 nm).

The TPV 200 may define a third or overall thickness 224. In at least one example embodiment, the overall thickness 224 is greater than or equal to about 10 nm (e.g., greater than or equal to about 20 nm, greater than or equal to about 30 nm, greater than or equal to about 40 nm, greater than or equal to about 50 nm, greater than or equal to about 75 nm, greater than or equal to about 125 nm, greater than or equal to about 150 nm, greater than or equal to about 175 nm, greater than or equal to about 200 nm, or greater than or equal to about 225 nm). The overall thickness 224 may be less than or equal to about 250 (e.g., less than or equal to about 225 nm, less than or equal to about 200 nm, less than or equal to about 175 nm, less than or equal to about 150 nm, less than or equal to about 125 nm, less than or equal to about 100 nm, less than or equal to about 75 nm, less than or equal to about 50 nm, less than or equal to about 40 nm, less than or equal to about 30 nm, or less than or equal to about 20 nm).

Although not shown, in at least one example embodiment, the TPV further includes one or more buffer layers (not shown) positioned between any of the layers 206, 210 and electrodes 202, 204. The buffer layers may block excitons, modify a work function or collection barrier, induce ordering or templating, and/or serve as optical spacers.

In at least one example embodiment, the electrodes 202, 204 may include thin metal (e.g., Ag, Au, Al, and/or Cu), indium tin oxide (ITO), tin oxide, aluminum doped zinc oxide, metallic nanotubes, metal nanowires (e.g., Ag, Au, Al, and/or Cu), conductive low-e stack, low-e single-silver stack, low-e double-silver stack, low-e triple-silver stack, or any combination thereof.

In at least one example embodiment, the transparent substrate 208 may include glass, plastic (e.g., polythethylene, polycarbonate, polymethyl methacrylate, and/or polydimethylsiloxane), or any combination thereof. In addition to the wavelength selective light absorbing material the electrodes 202, 204 and optional transparent substrate 208 should also enable light transmission and the entire TPV 200 or device stack, when integrated together, should, in at least one example embodiment, show the desired wavelength selective absorption or transmission properties through the entire device. Multiple TPVs 200 may be stacked monolithically or otherwise to form multifunction TPVs.

In at least one example embodiment, additionally or alternatively, the TPV 200 may include materials as described in U.S. Pat. No. 9,728,735 to Bulovic et al., titled "Transparent Photovoltaic Cells," issued Aug. 8, 2017; and/or U.S. Pat. App. Pub. No. 2021/0233717 to Lunt et al., titled "Flexible Inorganic Perovskite Solar Cells and Room-Temperature Processing Thereof," filed Oct. 27, 2020; all of which are incorporated by reference herein in their entireties, that are capable of meeting the desired performance characteristics for use of the TPV 200 for transmitting light to a photosynthetic organism.

Figure 3A:
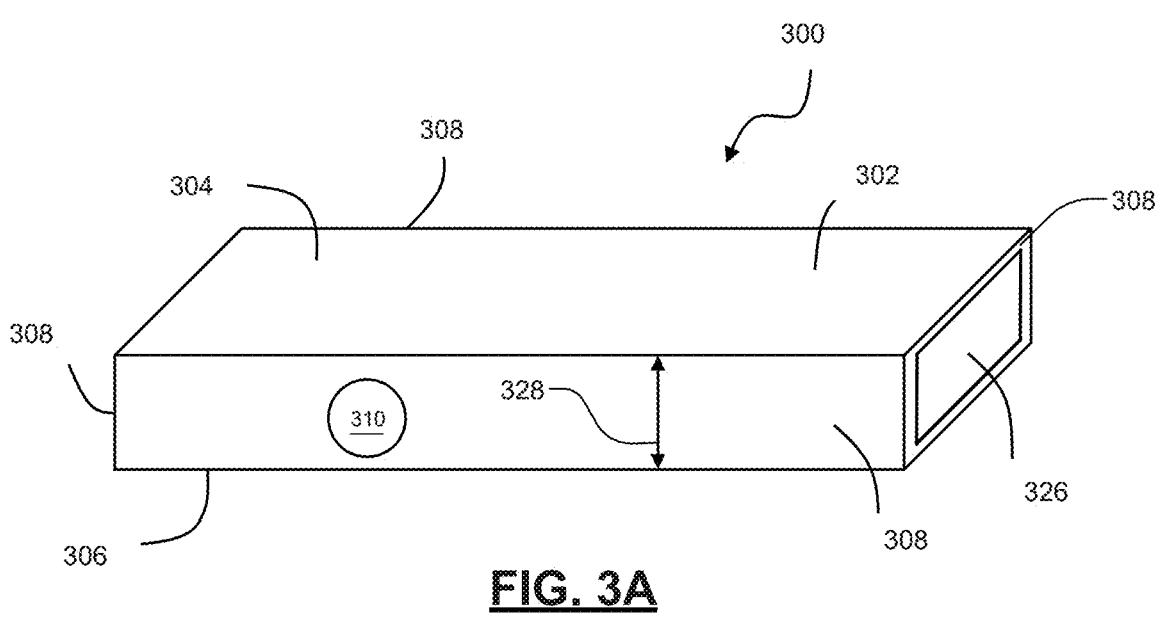

With reference to FIG. 3A, a TLSC 300 according to at least one example embodiment is shown. The TLSC 300 comprises a waveguide or substrate 302. The waveguide 302 comprises a first surface 304 that receives light, such as incident light, and an opposing second surface 306 that transmits light. The waveguide 302 also comprises edges 308. The waveguide 302 comprises a visibly transparent material.

The TLSC 300 (e.g., the entire TLSC 300 between a surface that receives direct light and a surface that transmits the light) may have any of the characteristics described above, including, but not limited to APT, DLI, eDLI, YPFD, substantially absorbent wavelengths, wavelengths at largest peak absorption, wavelength cutoffs, blue light transparencies, green light transparencies, red light transparencies, far-red light transparencies, SHGC, transmission haze, CRI, PCE, and/or LUE*. Additionally, the TLSC 300 may be used to transmit light to any of the photosynthetic organisms listed above at the above crop yields.

The waveguide 302 is in contact with a luminophore or waveguide redirecting material 310 (or plurality of luminophores), described in greater detail below. The luminophore 310 may be embedded within the waveguide 302, disposed directly on the waveguide 302, provided within a layer or film on the waveguide 302, or any combination thereof. The waveguide 302 may include one or more different luminophores. The TLSC 300 may include multiple waveguides 302, each with the same and/or different luminophores 310. These multiple waveguides can be coupled to the same PV cell or different PV cells (see, e.g., PV cell 326, described below) to make a multi-junction device.

Figure 3B:
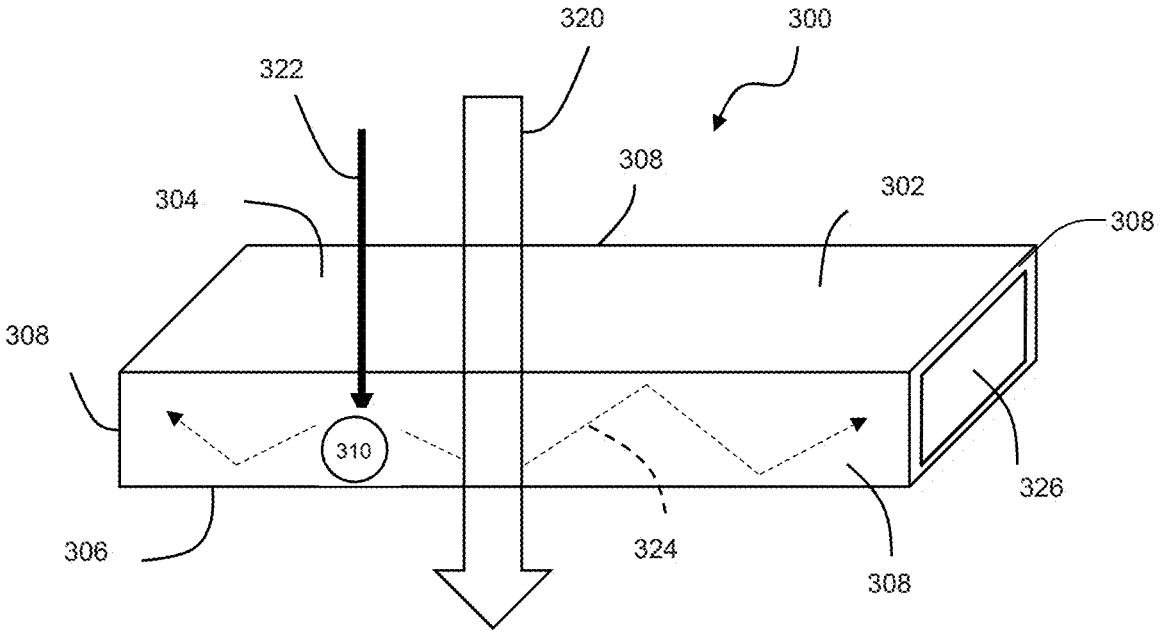

FIG. 3B shows the TLSC 300 as it receives light within a first wavelength range 320 and light within a second wavelength range 322 on the first surface 304 of the waveguide 302. The luminophore 310 absorbs at least a portion of light in the second wavelength range 322. However, the luminophore 310 does not substantially absorb the light within the first wavelength range 320, which passes through the second surface 306 of the waveguide 302. The absorbed light 322 excites the luminophore 310, which emits light 324 of a different wavelength, which is guided by the waveguide 302 to the edges 308. Therefore, the TLSC 300 harvests the light 322 and the waveguide 302 guides the light 324 emitted from the luminophore 310.

The emitted light 324 is directed to a photovoltaic (PV) cell 326 or array connected to one or more of surfaces 304, 306 (e.g., over a portion of the surface(s) 304, 306, adjacent to one or more of the edges 308) and/or edges 308 to generate electricity. Additionally or alternatively, the TLSC 300 may include a PV cell or array connected to the first surface 304, the second surface 306, and/or embedded in the waveguide 302 between the first and second surfaces 304, 306.

In at least one example embodiment, the PV cell 326 includes germanium (Ge); amorphous germanium (a-Ge); gallium (Ga); gallium arsenide (GaAs); silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as $CH_3NH_3PbI_3$, $CH_3NH_3PbCl_3$ and $CH_3NH_3PbBr_3$; or any combination thereof.

The luminophore 310 is configured to be wavelength selective to transmit light that facilitates increased growth and/or improved quality of a photosynthetic organism, such as a plant. In at least one example embodiment, the TLSC 300 contains luminophores that predominantly harvest light not utilized by the living organism and then will emit light deeper in the near-infrared. Additionally or alternatively, the TLSC 300 could include a luminophore 310 that emit light in the PAR spectrum (via downshifting or upconversion) to both produce power and enhance the usable DLI from escape emission from the waveguide. In at least one example embodiment, 70-80% of emitted light is guided to the edge for power production while 20-30% can escape from the front/back of the waveguide that might be useful for plants.

In at least one example embodiment, the waveguide 302 is transparent. The waveguide 302 may include glass, plastic (e.g., polythethylene, polycarbonate, polymethyl methacrylate, polydimethylsiloxane, and/or polypropylene, and/or polyvinyl chloride), or any combination thereof. In at least one example embodiment, the waveguide 302 defines a thickness 328 of greater than or equal to about 50 μm (e.g., greater than or equal to about 0.1 mm, greater than or equal to about 0.3 mm, greater than or equal to about 0.5 mm, greater than or equal to about 1 mm, greater than or equal to about 2 mm, greater than or equal to about 3 mm, greater than or equal to about 5 mm, greater than or equal to about 10 mm, or greater than or equal to about 15 mm). The thickness 328 may be less than or equal to about 20 mm (e.g., less than or equal to about 15 mm, less than or equal to about 10 mm, less than or equal to about 5 mm, less than or equal to about 3 mm, less than or equal to about 2 mm, less than or equal to about 1 mm, less than or equal to about 0.5 mm, less than or equal to about 0.3 mm, or less than or equal to about 0.1 mm)

The luminophore 310 composition, concentration, molecular orientation, and/or host interaction also affect APT, AVT, CRI, DLI, a*b*, and PCE. In at least one example embodiment, the luminophore 310 includes nanocluster(s) (NC), cyanine(s), cyanine salt(s), porphyrin(s), BODIPY(s), squaraine(s), heptamethine(s), non-fullerene acceptor(s) (NFA), halide perovskite(s), quantum dot(s), or any combination thereof. In at least one example embodiment, the luminophore 310 includes 1-Butyl-2-[7-(1-butyl-3,3-dimethyl-1,3-dihydro-indol-2-ylidene)-hepta-1,3,5-trienyl]-3,3-dimethyl-3Hindolium; 1-Butyl-2-[3-(1-butyl-1H-benzo[cd]indol-2-ylidene)-propenyl]-benzo[cd]indolium; 2-[2-[2-Chloro-3-[2-(1,3-dihydro-1,3,3-trimethyl-2H-indol-2-ylidene)-ethylidene]-1-cyclohexen-1-yl]-ethenyl]-1,3,3-trimethyl-3H-indolium; 2-(2-[2-Chloro-3-[2-(3-ethyl-1,1-dimethyl-1,3-dihydro-benzo[e]indol-2-ylidene)-ethylidene]-cyclohex-1-enyl]-vinyl)-3-ethyl-1,1-dimethyl-1H-benzo[e]indolium; 1-Butyl-2-(2-[3-[2-(1-butyl-1H-benzo[cd]indol-2-ylidene)-ethylidene]-2-diphenylamino-cyclopent-1-enyl]-vinyl)-benzo[cd]indolium2-[2-[2-Chloro-3-[2-[1,3-dihydro-3,3-dimethyl-1-(4-sulfobutyl)-2H-indol-2-ylidene]-ethylidene]-1-cyclohexen-1-yl]-ethenyl]-3,3-dimethyl-1-(4-sulfobutyl)-3H-indolium; COi8DFIC; BODIPY; BODIPY derivatives; 2-((E)-2-((E)-2-(diethylamino)-3-(2-((E)-1,3,3-trimethylindolin-2-ylidene)ethylidene)cyclohex-1-en-1-yl) vinyl)-1,3,3-trimethyl-3H-indol-1-ium iodide (Cy7-NEt2-I); 2-((E)-2-((E)-2-(diethylamino)-3-((E)-2-(3-ethyl-1,1-dimethyl-1,3-dihydro-2H-benzo[e]indol-2-ylidene)ethylidene)cyclohex-1-en-1-yl) vinyl)-3-ethyl-1,1-dimethyl-1H-benzo[e]indol-3-ium iodide (Cy7.5-NEt2-I); hexanuclear metal halide nanoclusters; $M_6X_{12}$ (where M=Mo, Ta, Nb, W; and X=F, Cl, Br, I, for example); $A_2M_6X_{14}$ (where A=Cs, Rb, K, Na; M=Mo, Ta, Nb, W; and X=F, Cl, Br, I, for example); $A_2M_6X_8L_6$ (where A=Cs, Rb, K, Na; M=Mo, Ta, Nb, W; X=F, Cl, Br, I; and L=short chain fatty acids such as acetate, propionate, butyrate, trifluoroacetate, fluoropropionate, and/or heptafluorobutyrate) or any combination thereof.

In at least one example embodiment, the luminophore 310 includes a luminophore as described in PCT Pat. App. Pub.

No. WO 2021/150504 to Lunt et al., titled "High-Performance Near-Infrared Harvesting Transparent Luminescent Solar Concentrators," filed Jan. 19, 2021, which is incorporated by reference in its entirety. In at least one example embodiment, the luminophore 310 is a non-fullerene acceptor (electron acceptor), such as a thiophene a polythiophene, or a combination thereof. Examples of thiophenes and polythiophenes include 2,2'-[4,4,11,11-tetrakis(4-hexylphenyl)-4,11-dihydrothieno[2',3':4,5]thieno[2,3-d]thieno[2",3":4",5"]thieno[2",3":4",5"]pyrano[2",3":4',5']thieno[2',3':4,5]thieno[3,2-b]pyran-2,9-diyl]bis[methylidyne (5,6-difluoro) (COi8DFIC), 3,9-bis(2-methylene-(3-(1,1-dicyanomethylene)-indanone))-5,5,11,11-tetrakis(4-hexylphenyl)-dithieno [2,3-d:2',3'-d']-s-indaceno[1,2-b: 5,6-b']dithiophene) (ITIC), 2,2'-[[4,4,9,9-Tetrakis(4-hexylphenyl)-4,9-dihydro-s-indaceno[1,2-b: 5,6-b']dithiophene-2,7-diyl]bis[4-[(2-ethylhexyl)oxy]-5,2-thiophenediyl]methylidyne(5,6-difluoro-3-oxo-1H-indene-2,1 (3H)-diylidene)]]bis[propanedinitrile] (IEICO-4F), derivatives thereof that do not change each molecular weight by more than about 50% and that retain each thiophene backbone, and combinations thereof. In at least one example embodiment, the luminophore 310 is boron-dipyrromethene (BODIPY). In at least one example embodiment, a BODIPY derivative that keeps the following BODIPY backbone, such as BOD-66, Keio Flours (KFL), Oligothienyl-BODIPY, 4,4-difluoro-4-bora-3a,4a-diaza-s-indacene, "zig-zag" edge-fused BODIPY, aza-BODIPY, [a]-fused BODIPY, [b]-fused BODIPY, and combinations thereof, as examples. These compounds can optionally be used in combination with BODIPY. In at least one example embodiment, the luminophore 310 can be any combination of thiophene, polythiophene and BODIPY. The luminophore 310 can include a first luminophore and a second luminophore, wherein the first luminophore is a thiophene or polythiophene and the second luminophore is a BODIPY. In at least one example embodiment, the luminophore 310 is a luminescent nanocluster. In at least one example embodiment, the luminescent nanoclusters can be hexanuclear clusters, octahedral clusters, tetrahedral clusters, Chevral clusters, edge-capped halide clusters, metal clusters, or Chalcogenide clusters. The hexanuclear clusters can include a phosphorescent metal halide nanocluster or a phosphorescent metal halide nanocluster salt. The metal halide or metal halide salt can be, as examples, $M_6X_{12}$, $M_6X_{12}$*nR, $A_2M_6X_{14}$, $A_2M_6X_{14}$*nR, $EM_6C_{14}$, $EM_6X_{14}$*nR, $M_6X_8L_6$, $A_2M_6X_8L_6$, $M_6Y_{14}$, $M_6X_{14}$*nR, $A_4M_6X_{18}$, or $A_4M_6X_{18}$*nR, wherein M represents metals, X represents halogens, A and E represents terminal 1+ and 2+ cations respectively, R represents a first ligand, L represents a second ligand, such as propionate or pentafluoroproprionate, and n is value between zero and M+X. M is Mo, W, Cr, Mn, To, Re, Cu, Ti, V, Ta, Nb, Sn, Zn, Zr, or Ga; X is F, Cl, Br, I, At, or a mixture thereof; and A is FT, H30$^+$, K$^+$, Na$^+$, Li$^+$, Rb$^+$, Cu$^+$, Cs$^+$, ammonium, butylammonium, tetrabutylammonium (TBA), or NRV where R' is independently selected from alkyl or aryl groups, wherein R' is optionally substituted with one or more of halo, nitro, cyano, hydroxy, hydroxyalkyl, haloalkyl, haloalkoxy, amino, azido, carboxy, carbamoyl, mercapto, sulphamoyl, $C_{1-10}$ alkyl, $C_{2-10}$ alkenyl, $C_{2-10}$ alkynyl, $C_{1-10}$ alkoxy, $C_{1-10}$ alkoxyalkyl, $C_{1-10}$ alkanoyl, $C_{1-10}$ alkanoyloxy, N—(C1-10 alkyl)amino, N,N—(Ci-io alkyl)2amino, C1-10 alkanoylamino, N—(Ci-io alkyl) carbamoyl, N,N—(Ci-io alkyl)2carbamoyl, C1-10 alkyl-S(O) a wherein a is 0, 1 or 2, Ci-io alkoxycarbonyl, N—(Ci-io alkyl) sulphamoyl, N,N—(Ci-io alkyl)2Sulphamoyl, $H_2NS(O)_2NH$—, N—(CI-IO alkyl)NHS(O)$_2$ NH—N,N—(Ci-io alkyl)$_2$NS(O)2NH-aryl, aryloxy, arylthio, heteroaryl, heteroaryloxy, cycloalkyl, cycloalkyloxy, heterocyclyl, heterocyclyl(C═O)—, heterocyclyloxy and heterocyclylthio; L is F, Cl, Br, I, At, S, propionate, pentafluoroproprionate, or a mixture thereof, E is Be$^{2+}$, Mg$^{2+}$, Ca$^{2+}$, Sr$^{2+}$, Cu$^{2+}$, Ni$^{2+}$, Ti$^{2+}$, Ba$^{2+}$ or a mixture thereof; and R is $H_2O$, $CH_3CN$, or any other solvate. In at least one example embodiment, metal halide clusters, for example phosphorescent metal (II) halide clusters, can be modified from the parent salt compounds through ligand exchange reactions. The parent ion is usually synthesized through reduction of $M(V)X_5$, or obtained directly in the form of $M(II)X_2$. For Mo-based clusters, the parent compound is purified by conversion to the HCl salt, which is returned to $M(II)X_2$ or $M(II)X_{12}$ via heat-treatment under vacuum. Ligand exchange can be carried out in a Soxhlet extractor or by direct reaction in acidic solutions in the presence of free cations, forming various complexes or salts respectively. The properties of a selected range of metal halide complexes synthesized here (hydrates and salts) exhibit quantum yields from about 1% to great than about 70%. Many amine and thiol based ligands can be substituted around the terminal halides through thiolate and amine coordination. M, X, and L are varied in $MX_2 \cdot L_2$, $AMX_2 \cdot L_2$, $M_6X_{12} \cdot L_2$, $A_2M_6X_{14}$, and $A_2M_6X_{14} \cdot L_2$ including M=W, Mo and X═Cl, Br, I, and L=Cl, CFhCN, benzenethiols, ethanethiols, $H_2O$ (hydrates), HCl, acetonitrile (CAN) and A=K, Na, tetrabutylammonium (TBA), and other ammonium salts. Moreover, amines and ammonium salts can be readily anchored to polymer chain backbones to enhance particle separation and increase quantum yields. Exemplary phosphorescent nanoclusters include $K_2MO_6Cl_{14}$, $TBA_2Mo_6Cl_{14}$, $(H_3O)_2MO_6Cl_{14}$, and combinations thereof.

In at least one example embodiment, a concentration of the luminophore 310 may be greater than or equal to about 0.001 mg/ml (e.g., greater than or equal to about 0.002 mg/mL, greater than or equal to about 0.005 mg/mL, greater than or equal to about 0.01 mg/mL, greater than or equal to about 0.05 mg/mL, greater than or equal to about 0.1 mg/mL, greater than or equal to about 0.2 mg/mL, greater than or equal to about 0.5 mg/mL, greater than or equal to about 1 mg/mL, greater than or equal to about 2 mg/mL, greater than or equal to about 5 mg/mL, greater than or equal to about 10 mg/ml, greater than or equal to about 15 mg/mL, greater than or equal to about 20 mg/mL, greater than or equal to about 30 mg/mL, greater than or equal to about 40 mg/mL, or greater than or equal to about 50 mg/m,). The concentration may be less than or equal to about 100 mg/mL (e.g., less than or equal to about 90 mg/mL, less than or equal to about 80 mg/mL, less than or equal to about 70 mg/mL, less than or equal to about 60 mg/mL, less than or equal to about 50 mg/mL, less than or equal to about 25 mg/mL, less than or equal to about 10 mg/mL, less than or equal to about 5 mg/mL, less than or equal to about 1 mg/mL, less than or equal to about 0.1 mg/mL, or less than or equal to about 0.01 mg/mL). In at least one example embodiment, APT, AVT, CRI, and DLI may generally decrease as concentration increases, where the rate of decrease will depend on the selective spectral harvesting range. In at least one example embodiment, |a*|b*| may increase with concentration and then saturate or increase with concentration and then reduce with further increases in concentration.

In at least one example embodiment, the TLSC 300 may include materials as described in U.S. Pat. No. 9,985,158 to Lunt et al., titled "Visibly Transparent, Luminescent Solar Concentrator," issued May 29, 2018; U.S. application Ser. No. 17/277,807 to Lunt et al., titled "Transparent Luminescent Solar Concentrator," filed Mar. 19, 2021; and U.S. Pat. App. Pub. No. 2021/0230427 to Lunt et al, titled "Near-Infrared Harvesting Transparent Luminescent Solar Concentrators with Engineered Stokes Shift," filed Nov. 6, 2020, all of which are incorporated by reference herein in their entireties.

The TPV 200 and/or the TLSC 300 may be a device (e.g., a single device, an encapsulated device) and/or module (e.g., a mini-module, a full size module) that includes a frame. As used herein, a module is an array of individual devices strung together to build voltage and current with cells in series (to build voltage) and parallel (to build current). The frame may include metal (e.g., stainless steel, aluminum, anodized aluminum, and/or powder coated aluminum), wood, or plastic (e.g., polythethylene, polycarbonate, polymethyl methacrylate, polydimethylsiloxane, and/or polypropylene, and/or polyvinyl chloride), or any combination thereof.

The frame may have a color that facilitates scattering and/or reflection of light (for possible transmission or absorption in the respective TPV 200 and/or TLSC) rather than absorption of the light by the frame. The frame color may be described by RGB decimal code (R, G, B), where R is red, G is green, and B is blue. In at least one example embodiment, R, G, and B are all greater than or equal to about 150 (e.g., greater than or equal to about 170, greater than or equal to about 180, greater than or equal to about 190, greater than or equal to about 200, greater than or equal to about 210, greater than or equal to about 220, greater than or equal to about 230, greater than or equal to about 240, or greater than or equal to about 250). R, B, G, may each be less than or equal to about 255 (e.g., less than or equal to about 250, less than or equal to about 240, less than or equal to about 230, less than or equal to about 220, less than or equal to about 210, or less than or equal to about 200). In at least one example embodiment, the frame color includes white having an RGB decimal code of (255, 255, 255). In at least one example embodiment, the frame color includes silver having an RBG decimal code of (192, 192, 192). The R, B, G may be independently selected such that they are the same and/or different. Additionally or alternatively, the frame color may be described by CIE L*a*b* coordinates, where (0, 0) is white. In at least one example embodiment, a* and b* are both greater than or equal to −2 to less than or equal to 2 (e.g., greater than or equal to −1.75 to less than or equal to 1.75, greater than or equal to −1.5 to less than or equal to 1.5, greater than or equal to −1.25 to less than or equal to 1.25, greater than or equal to −1 to less than or equal to 1, greater than or equal to −0.75 to less than or equal to 0.75, greater than or equal to −0.5 to less than or equal to 0.5, or greater than or equal to −0.25 to less than or equal to 0.25). a* and b* may be independently selected such that they are the same or different.

In at least one other example embodiment, the frame includes a PV cell. The PV cell may include germanium (Ge); amorphous germanium (a-Ge); gallium (Ga); gallium arsenide (GaAs); silicon (Si); amorphous silicon (a-Si); silicon-germanium (SiGe); amorphous silicon-germanium (a-SiGe); gallium indium phosphide (GaInP); copper indium selenide, copper indium sulfide, or combinations thereof (CIS); copper indium gallium selenide, copper indium gallium sulfide, or combinations thereof (CIGS); cadmium telluride (CdTe); perovskites (PV), such as $CH_3NH_3PbI_3$, $CH_3NH_3PbCl_3$ and $CH_3NH_3PbBr_3$; or any combination thereof.

The solar panel (e.g., the TPV 200 and/or the TLSC 300), a device including the solar panel, and/or a module including the solar panel may be used in structures, including enclosed structures (see, e.g., FIG. 4) and/or open (unenclosed) structures (see, e.g., FIGS. 5A-12). Enclosed structures can include greenhouses, PhytoBiotrons, Phytotrons, hoop houses, or any combination thereof, by way of example. Open systems can include cells or arrays as independent structures (see, e.g., FIGS. 5A-10) or in combination with agricultural or other equipment (see, e.g., FIGS. 11A-12). Open systems may be positioned over land (e.g., fields, pastureland, agricultural land) and/or water (e.g., rivers, lakes, oceans, swamp), by way of example.

Figure 4:
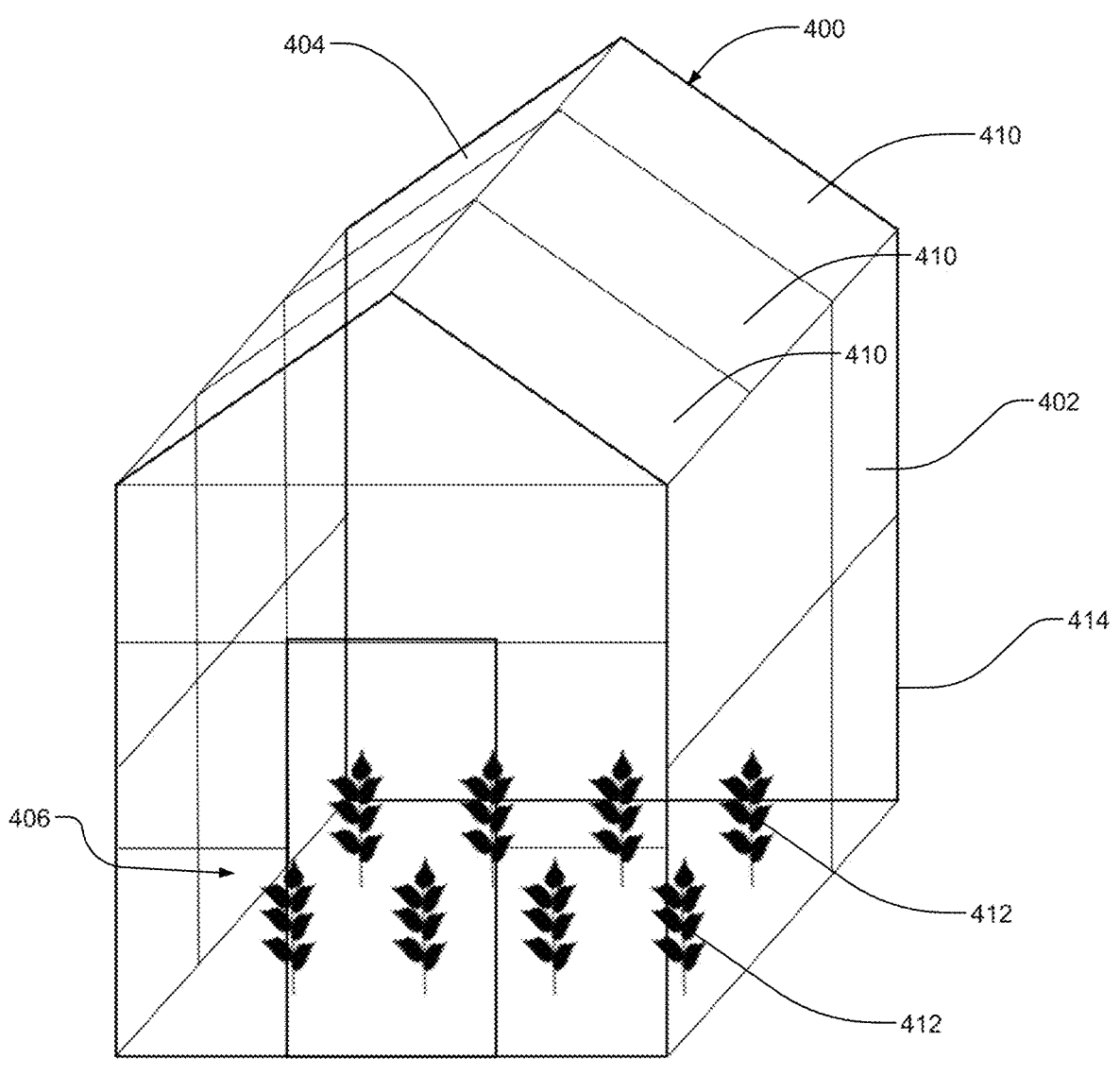
Figure 5A:
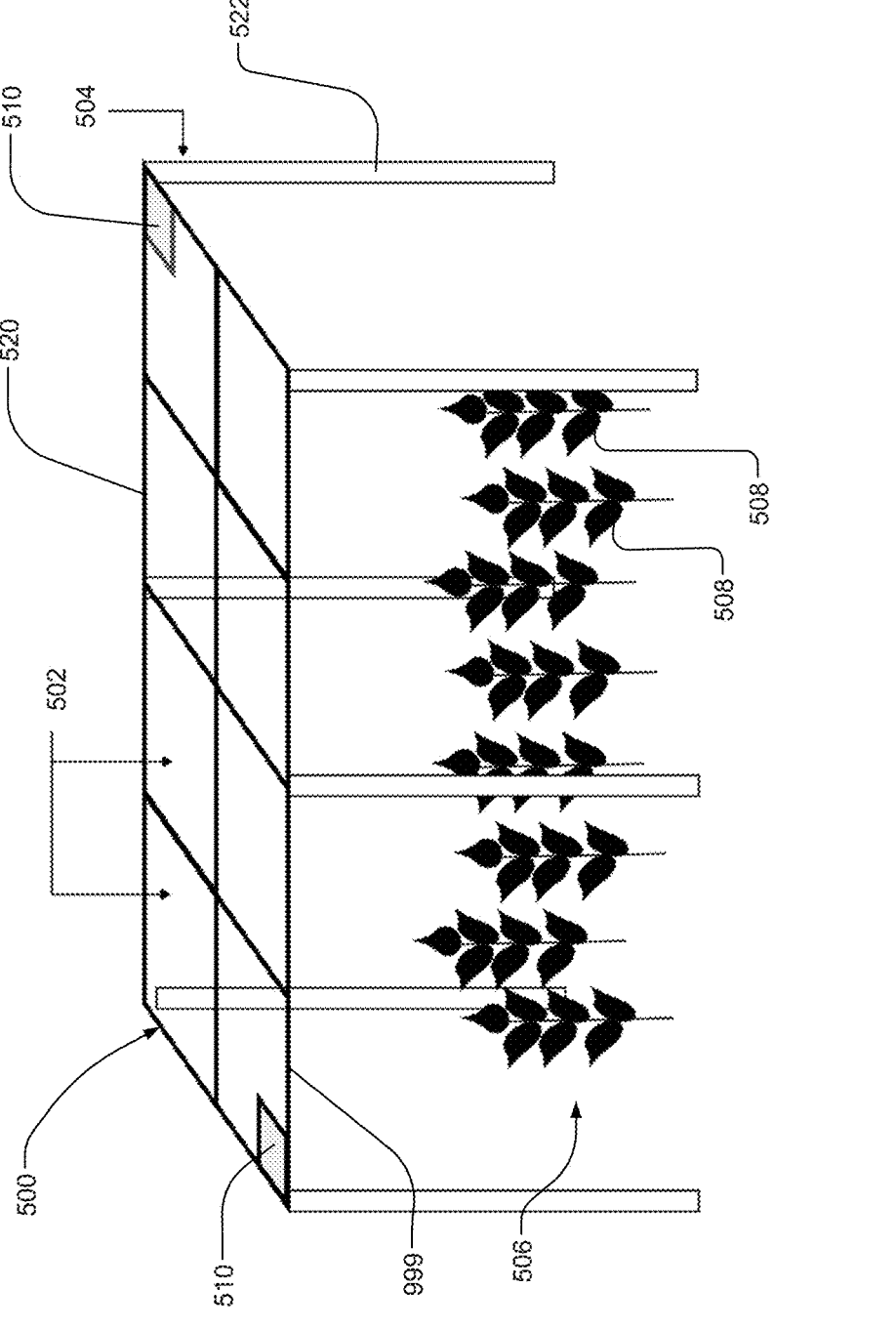
Figure 5B:
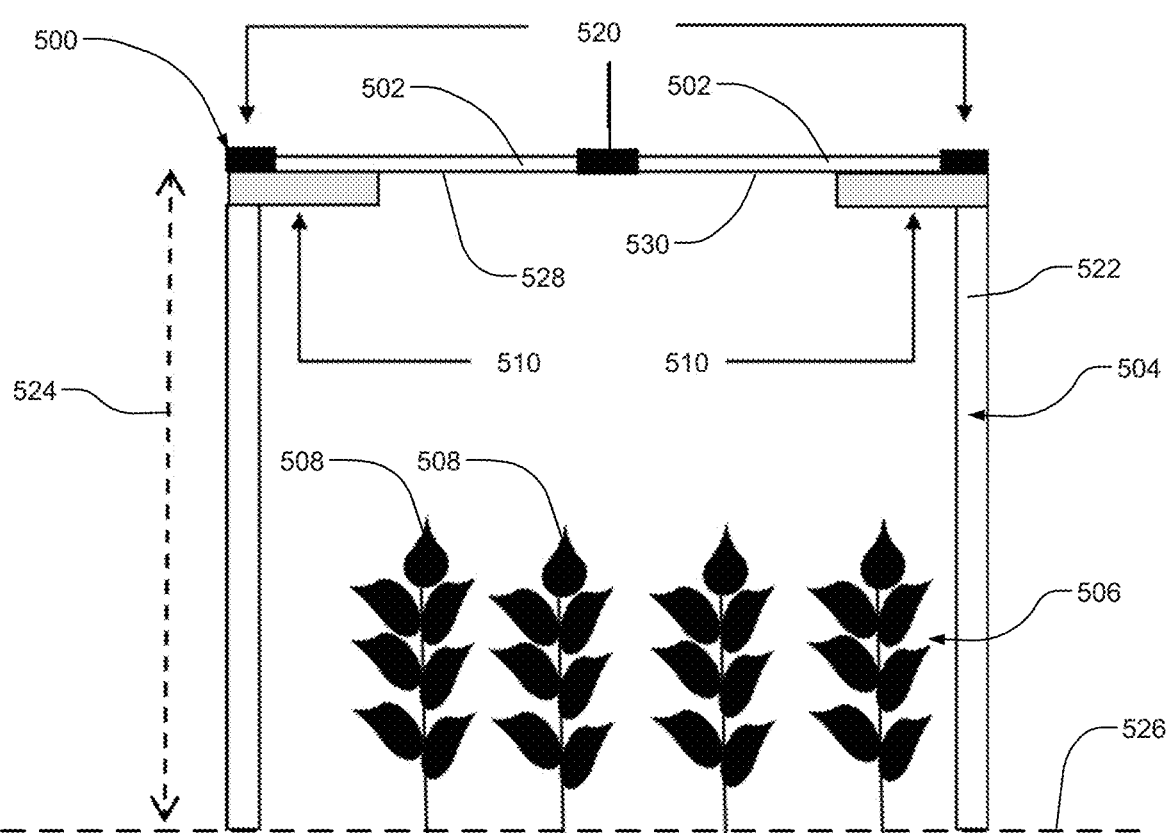
Figure 6A:
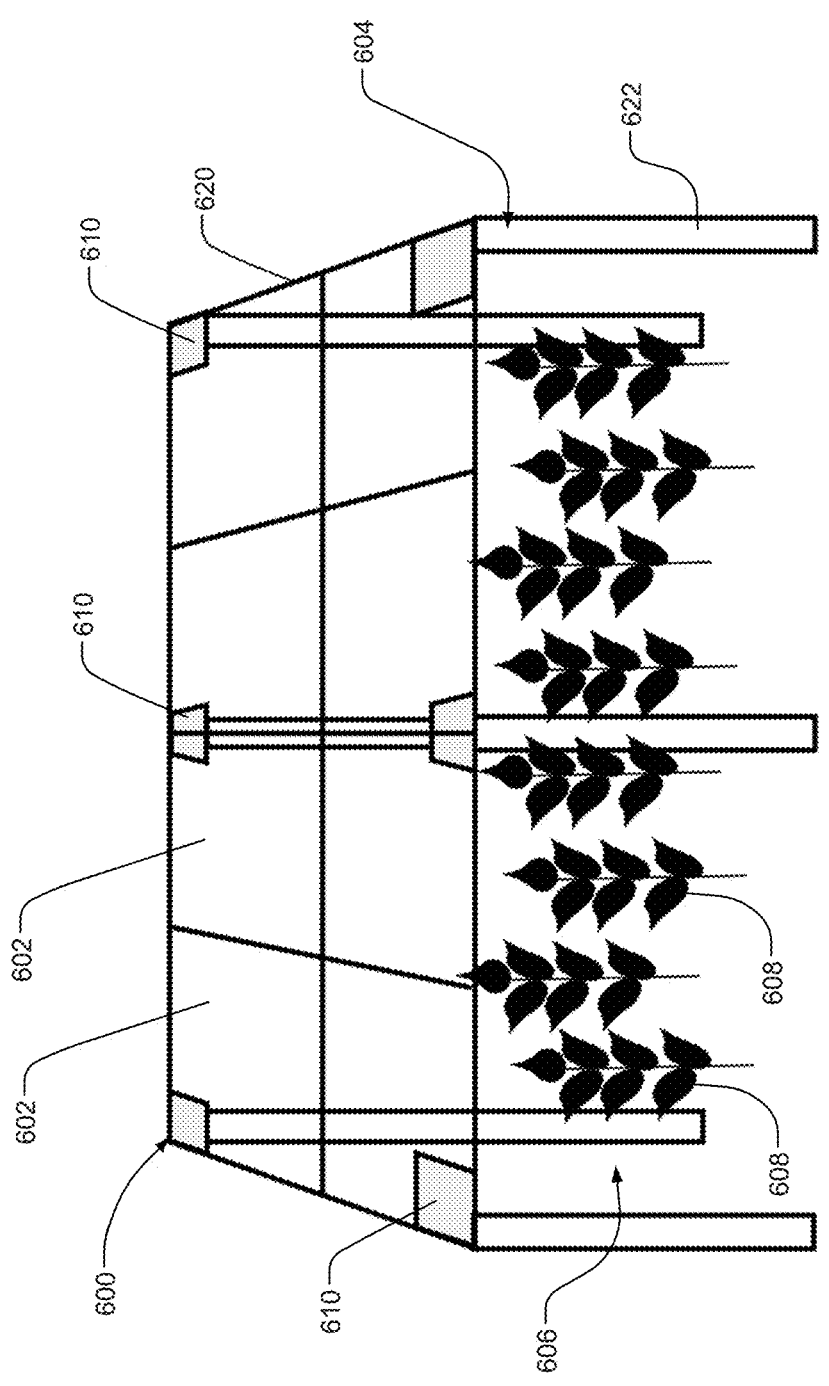
Figure 6B:
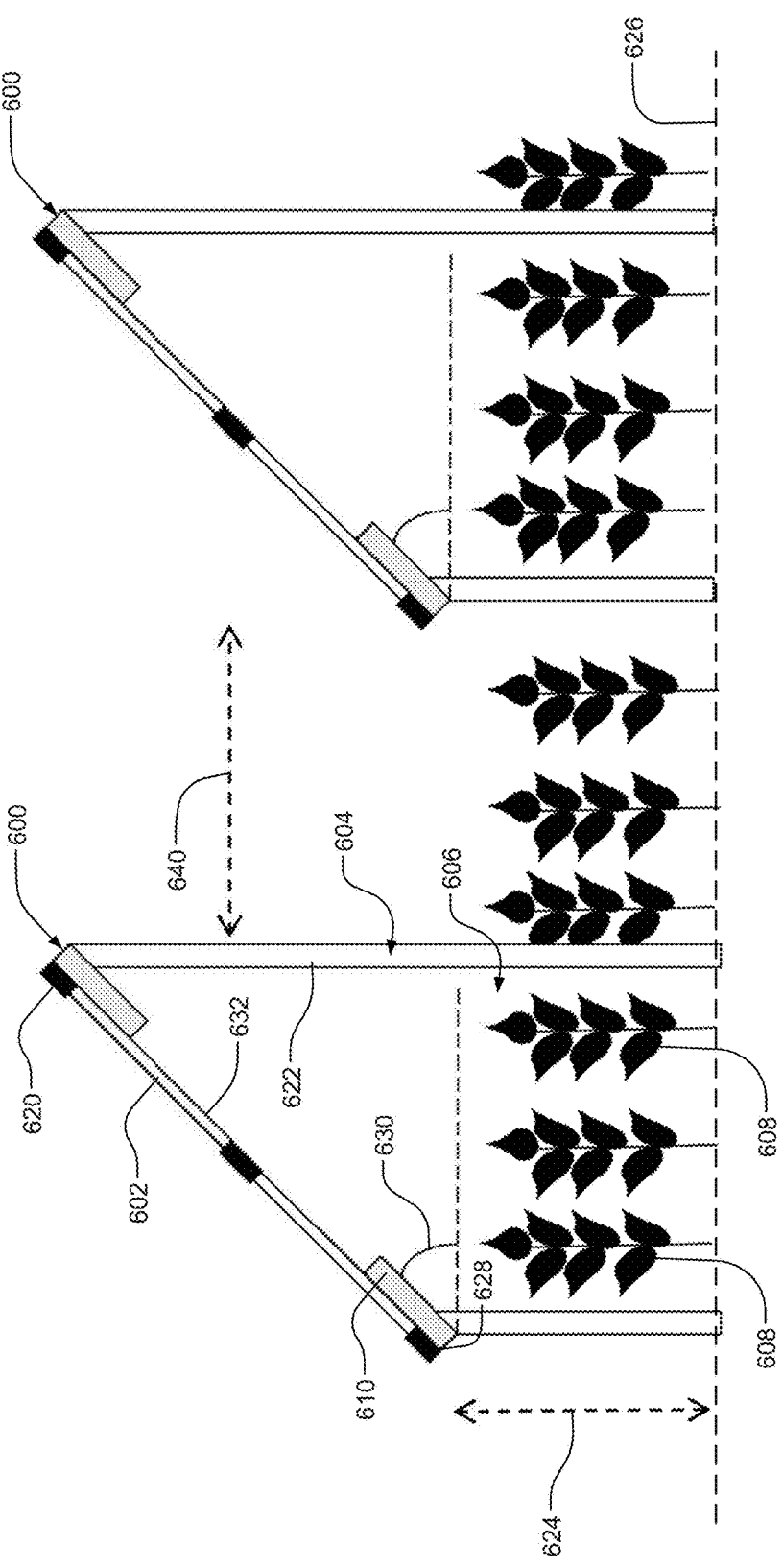
Figure 7A:
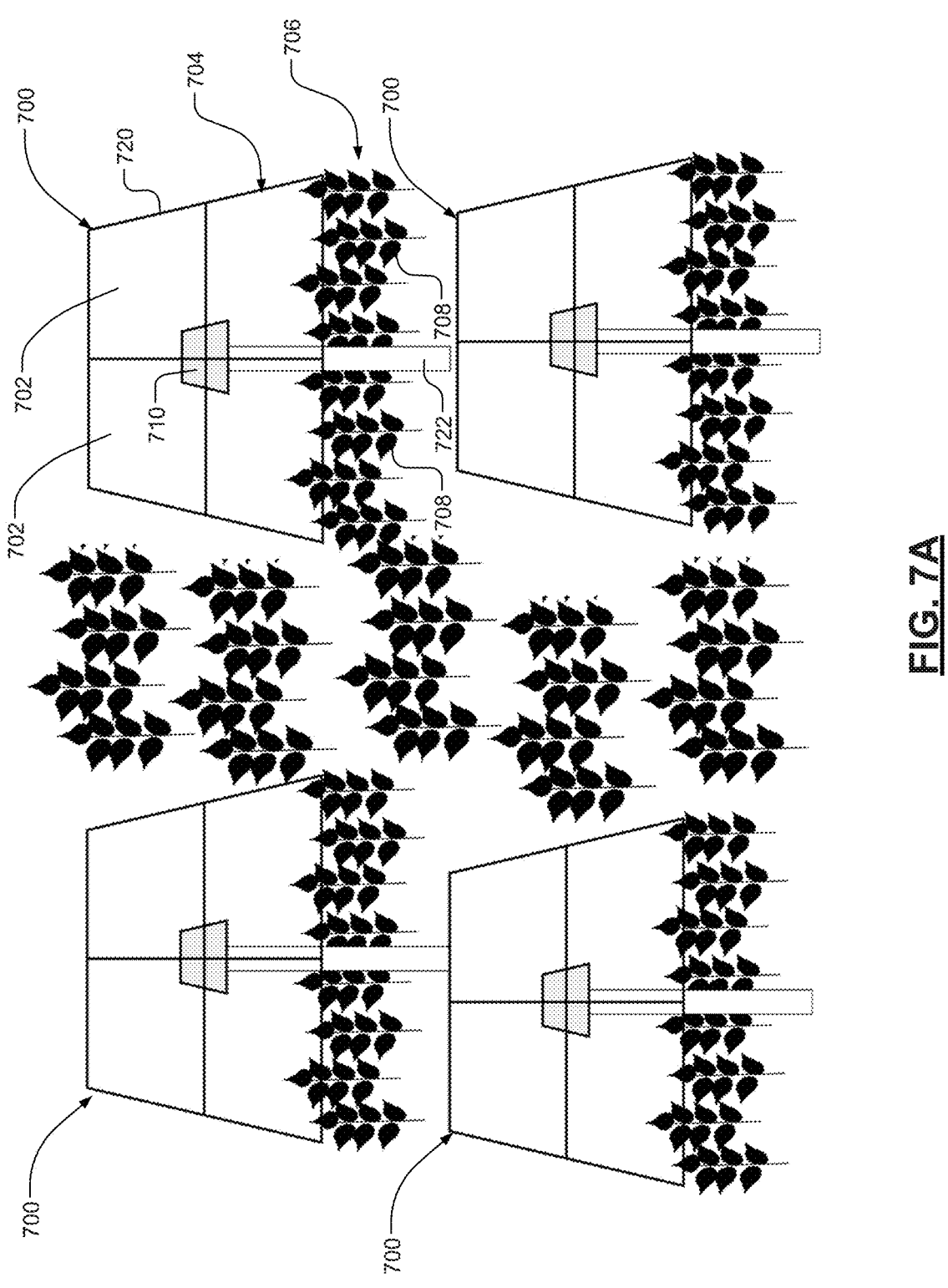
Figure 7B:
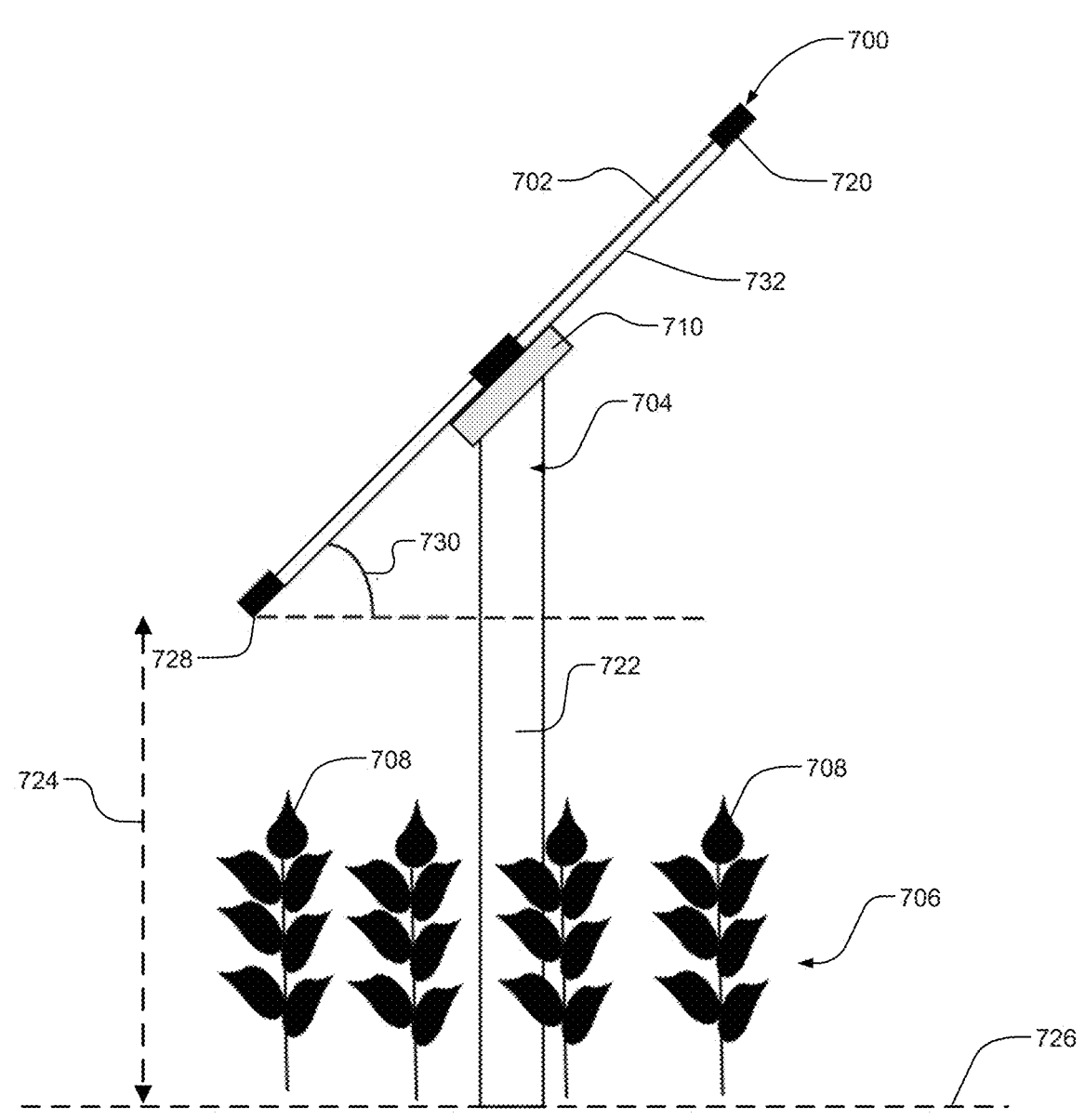
Figure 8A:
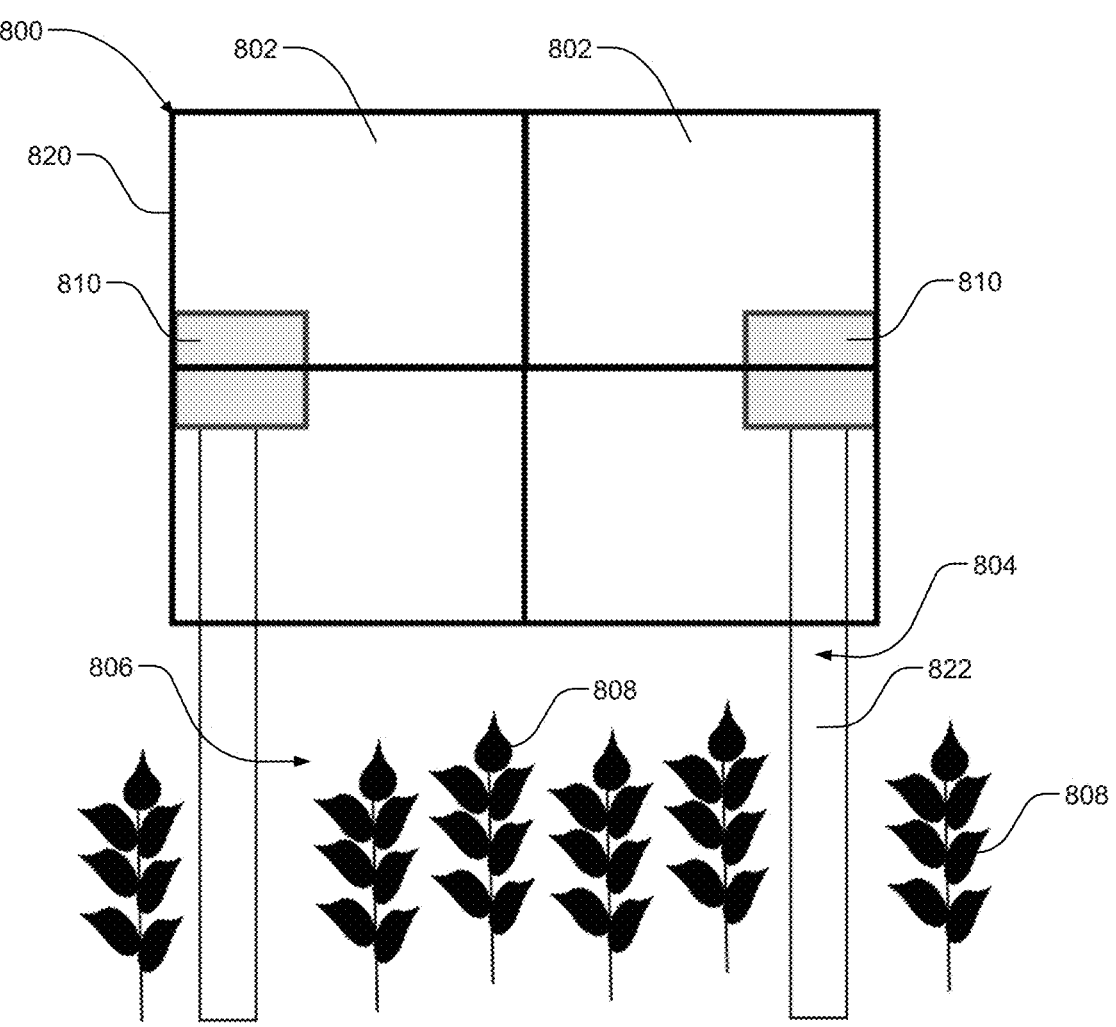
Figure 8B:
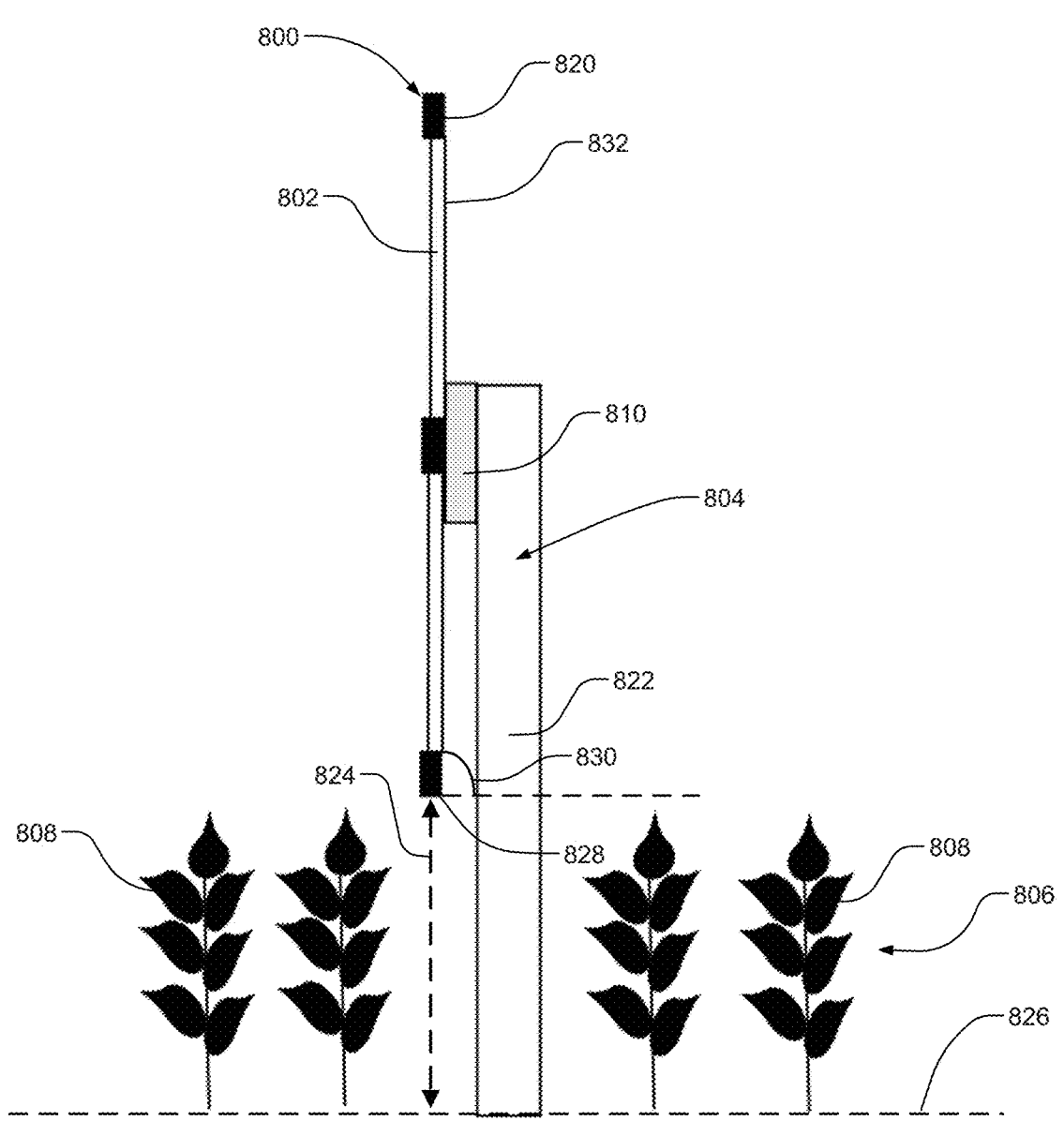
Figures 9A, 9B:
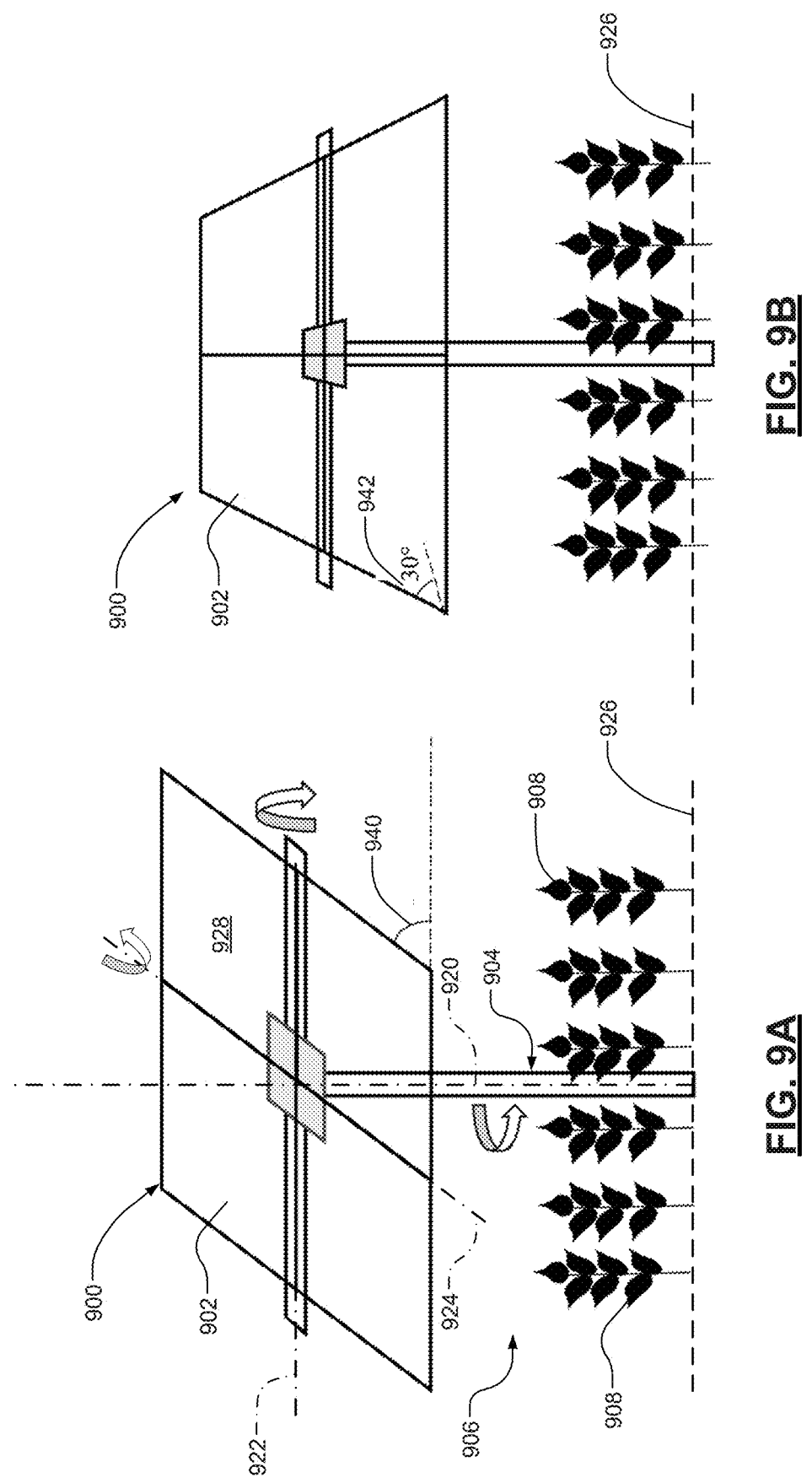
Figure 10:
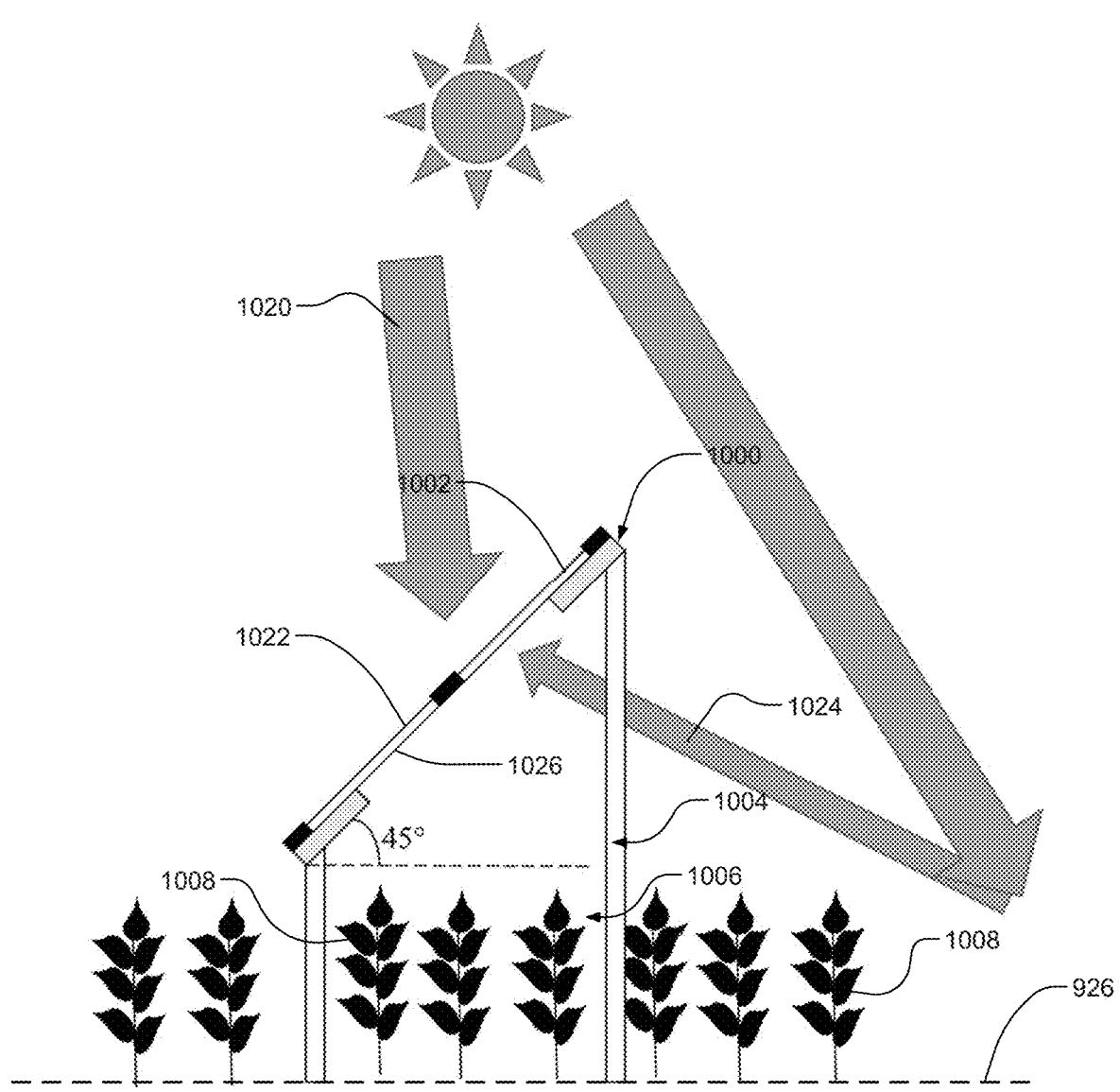
Figures 11A, 11B:
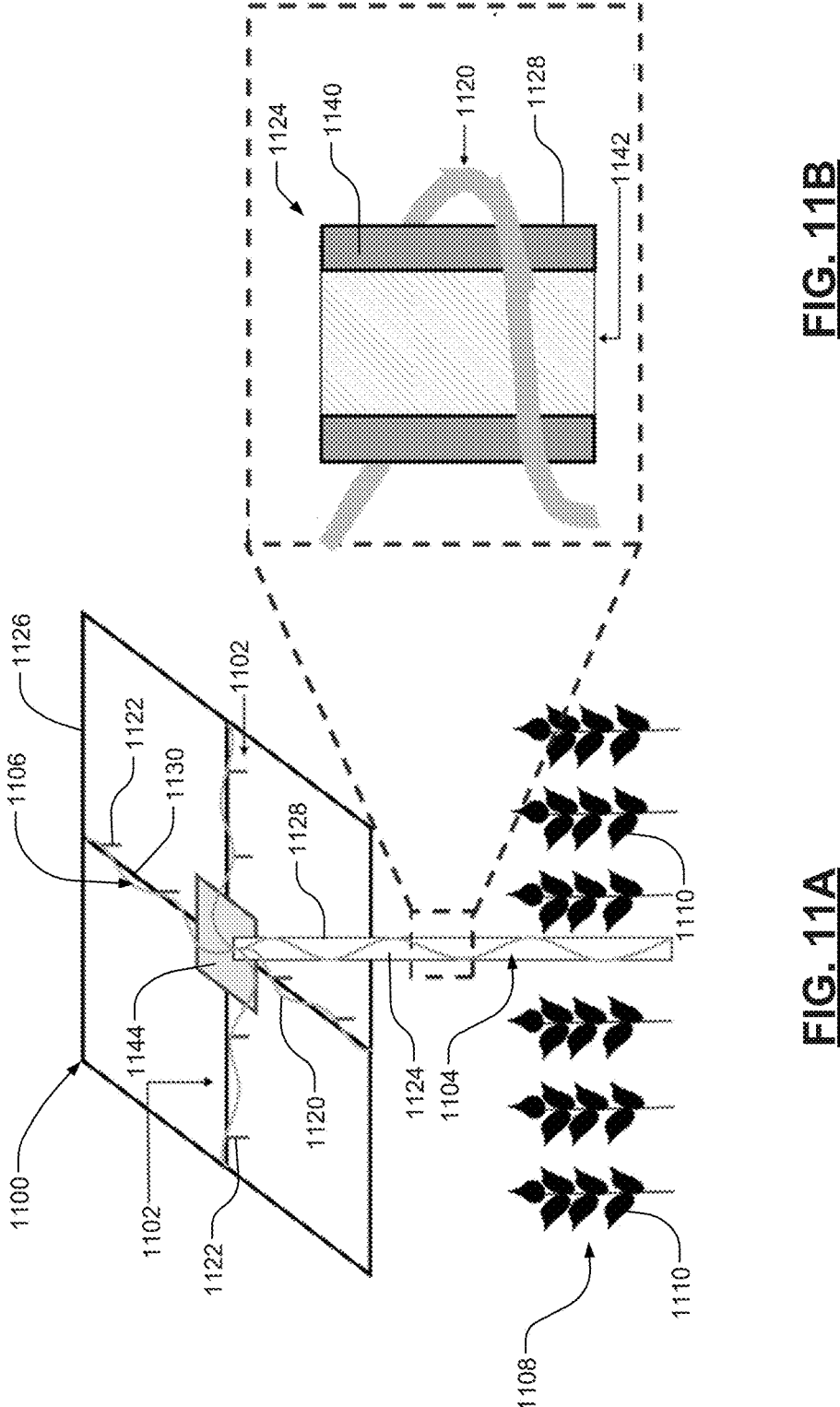
Figure 12:
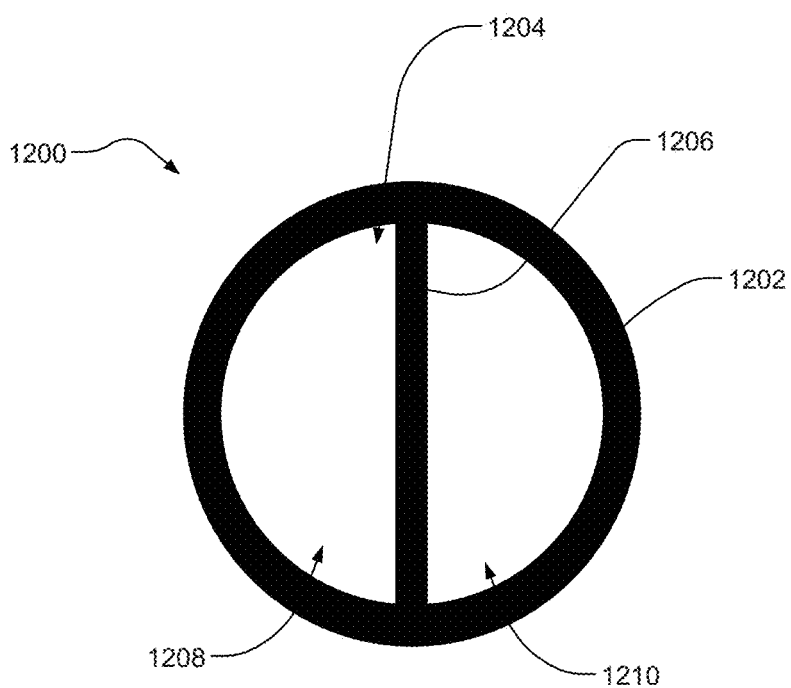
FIG. 12 is a sectional view of a support structure for a solar array and irrigation system according to at least one example embodiment.

The structures may include supports and/or array frames (see, e.g., frame 414 of FIG. 4; support structure 504 of FIGS. 5A-5B; support structure 604 of FIGS. 6A-6B; support structure 704 of FIGS. 7A-7B; support structure 804 of FIGS. 8A-8B; support structure 904 of FIGS. 9A-9B; support structure 1004 of FIG. 10, support structure 1104 of FIGS. 11A-11B; and post 1200 of FIG. 12). In at least one example embodiment, the supports and/or array frames are constructed from metal. In at least one example embodiment, wires for the solar panels, devices, or modules may be at least partially within the supports and/or array frames (see, e.g., FIG. 12 and accompanying discussion).

The supports and/or array frames may have a color that facilitates scattering and/or reflection of light (for possible transmission or absorption in the respective TPV 200 and/or TLSC) rather than absorption of the light by the supports and/or array frames. The color of the supports and/or array frames may be described by RGB decimal code (R, G, B), where R is red, G is green, and B is blue. In at least one example embodiment, R, G, and B are all greater than or equal to about 150 (e.g., greater than or equal to about 170, greater than or equal to about 180, greater than or equal to about 190, greater than or equal to about 200, greater than or equal to about 210, greater than or equal to about 220, greater than or equal to about 230, greater than or equal to about 240, or greater than or equal to about 250). R, B, G, may each be less than or equal to about 255 (e.g., less than or equal to about 250, less than or equal to about 240, less than or equal to about 230, less than or equal to about 220, less than or equal to about 210, or less than or equal to about 200). In at least one example embodiment, the color of the supports and/or array frames includes white having an RGB decimal code of (255, 255, 255). In at least one example embodiment, the color of the supports and/or array frames includes silver having an RBG decimal code of (192, 192, 192). The R, B, G may be independently selected such that they are the same and/or different. Additionally or alternatively, the color of the supports and/or array frames may be described by CIE L*a*b* coordinates, where (0, 0) is white. In at least one example embodiment, a* and b* are both greater than or equal to −2 to less than or equal to 2 (e.g., greater than or equal to −1.75 to less than or equal to 1.75, greater than or equal to −1.5 to less than or equal to 1.5, greater than or equal to −1.25 to less than or equal to 1.25, greater than or equal to −1 to less than or equal to 1, greater than or equal to −0.75 to less than or equal to 0.75, greater than or equal to −0.5 to less than or equal to 0.5, or greater than or equal to −0.25 to less than or equal to 0.25). a* and b* may be independently selected such that they are the same or different.

In enclosed structures, solar panel configurations and/or orientations may be fixed as dictated by the design of the structural frame. In open structures, such as in outdoor fields, PV arrays can be deployed in any desired configuration, such as linear arrays, at fixed 0° or 90° angle, fixed tilted angle 0°-90°, fixed tilt poles, and/or multi-axis tracking poles. Dimension and angles may be optimized by consideration of the solar trajectory at particular latitudes.

The transparent solar panels may be positioned at any desired angle with respect to a surface (e.g., the ground), such as 0°, (see, e.g., FIGS. 8A-8B), 90° (see, e.g., FIGS. 5A-5B), or any angle between 0° and 90°, such as 45° (see, e.g., FIGS. 6A-7B and 9A-10). The angle may be fixed or adjustable. In at least one example embodiment, the angle is configured to track a position of the sun (see, e.g., FIGS. 9A-9B). The structure may include any desired configuration, including single supports (see, e.g., FIGS. 7A-7B and 9A-9B) or multiple supports (see e.g., FIGS. 5A-6B, 8A-8B, and 10). The solar panel may be bifacial (see, e.g., FIG. 10).

In enclosed structures and unenclosed structures, adjacent solar panels may be spaced apart by a first desired (or alternatively, predetermined) distance. The first distance may facilitate water penetration between the solar panels, for example. In at least one example embodiment, the first distance is greater than or equal to about 2 mm (e.g., greater than or equal to about 5 mm, greater than or equal to about 10 mm, greater than or equal to about 25 mm, greater than or equal to about 50 mm, greater than or equal to about 75 mm, greater than or equal to about 1 cm, greater than or equal to about 2 cm, greater than or equal to about 3 cm, greater than or equal to about 4 cm, greater than or equal to about 5 cm, greater than or equal to about 6 cm, greater than or equal to about 10 cm, greater than or equal to about 15 cm, or greater than or equal to about 20 cm). The first distance may be less than or equal to about 25 cm (e.g., less than or equal to about 21 cm, less than or equal to about 15 cm, less than or equal to about 7 cm, less than or equal to about 6 cm, less than or equal to about 5 cm, less than or equal to about 4 cm, less than or equal to about 3 cm, less than or equal to about 2 cm, less than or equal to about 1 cm, less than or equal to about 75 mm, less than or equal to about 50 mm, less than or equal to about 25 mm, less than or equal to about 10 mm, or less than or equal to about 5 mm).

Adjacent structures may be spaced apart by a second desired (or alternatively, predetermined) distance (see, e.g., FIGS. 6A-6B). The second distance may be determined by latitude and/or desired clearance for equipment passage between structures. For example, combine harvesters are large pieces of farming equipment that can be up to 60 ft wide and 12-15 ft tall in the largest models. Thus the panel spacing (second distance) and/or frame width could be optimized for these machines and given a suitable buffer to reduce or prevent collisions laterally or vertically. In at least one example embodiment, second distance may be greater than or equal to about 10 ft (e.g., greater than or equal to about 20 ft, greater than or equal to about 30 ft, greater than or equal to about 40 ft, greater than or equal to about 50 ft, greater than or equal to about 60 ft, greater than or equal to about 70 ft, greater than or equal to about 80 ft, greater than or equal to about 90 ft, or greater than or equal to about 100 ft). The second distance may be less than or equal to about 100 ft (e.g., less than or equal to about 90 ft, less than or equal to about 80 ft, less than or equal to about 70 ft, less than or equal to about 60 ft, less than or equal to about 50 ft, less than or equal to about 40 ft, less than or equal to about 30 ft, less than or equal to about 20 ft, or less than or equal to about 10 ft).

In at least one example embodiment, array frame separation may be greater than or equal to about 10 ft (e.g., greater than or equal to about 20 ft, greater than or equal to about 30 ft, greater than or equal to about 40 ft, greater than or equal to about 50 ft, greater than or equal to about 60 ft, greater than or equal to about 70 ft, greater than or equal to about 80 ft, greater than or equal to about 90 ft, or greater than or equal to about 100 ft). In at least one example embodiment, array frame separation may be less than or equal to about 100 ft (e.g., less than or equal to about 90 ft, less than or equal to about 80 ft, less than or equal to about 70 ft, less than or equal to about 60 ft, less than or equal to about 50 ft, less than or equal to about 40 ft, less than or equal to about 30 ft, less than or equal to about 20 ft, or less than or equal to about 10 ft).

With reference to FIG. 4, a structure 400 (e.g., a greenhouse) according to at least one example embodiment is shown. The structure 400 includes side walls 402 and a roof 404. The side walls 402 and roof 404 cooperate to at least partially define an interior region 406. The interior region 406 is fully enclosed such that it does not include any portions open to an outside environment. Although the side walls 402 and roof 404 are shown as being planar, all or a portion of the side walls 402 and/or roof 404 may be curved. In at least one other example embodiment, a structure has a domed or hemispherical shape that forms both sides and a roof.

At least one of the side walls 402 and/or roof 404 includes a transparent solar panel 410, such as the TPV 200 (shown in FIG. 2) and/or the TLSC 300 (shown in FIGS. 3A-3B). The interior region 406 is configured to contain one or more photosynthetic organisms, such as plants 412, which may be planted directly in the ground, as shown, or in containers optionally placed on one or more tables and/or shelves (not shown). The enclosed structure 400 further includes a frame 414. The frame 414 may have colors as described above to facilitate light scattering.

Unenclosed structures may have any desired height. As shown in FIGS. 5B, 6B, 7B, and 8B, described below, height is defined as a distance between the ground (or water) and a closest or bottom edge or point of the solar panel. In at least one example embodiment, the height is greater than or equal to about 3 m (e.g., greater than or equal to about 3.5 m, greater than or equal to about 4 m, greater than or equal to about 4.5 m, greater than or equal to about 5 m, greater than or equal to about 5.5 m, greater than or equal to about 6 m, or greater than or equal to about 6.5 m). The height may be less than or equal to about 7 m (e.g., less than or equal to about 6.5 m, less than or equal to about 6 m, less than or equal to about 5.5 m, less than or equal to about 5 m, less than or equal to about 4.5 m, less than or equal to about 4 m, or less than or equal to about 3.5 m).

With reference to FIGS. 5A-5B, an unenclosed structure or linear field array 500 according to at least one example embodiment is provided. The array 500 includes a plurality of transparent solar panels 502, such as the TPV 200 (shown in FIG. 2) and/or the TLSC 300 (shown in FIGS. 3A-3B). The array 500 further includes a support structure 504. The transparent solar panels 502 are configured to transmit light to a region 506 containing photosynthetic organisms, such as plants 508. The array 500 further includes electronics assemblies 510 electrically coupled to the solar panels 502. In at least one example embodiment, the electronics assemblies 510 may also function as support pads. The support structure 504 may include a frame 520 and a plurality of posts 522. The frame 520 and/or posts 522 may have colors as described above to facilitate light scattering.

Referring to FIG. 5B, the array 500 may have a height 524 defined between an environment surface 526, such as the ground, and a closest or bottom edge 528 of the solar panel 502. In at least one example embodiment, the height 524 is within the ranges described above. An angle may be defined between a surface 530 of the solar panel 502 and the environment surface 526. In at least one example embodiment, the angle is about 0° such that it is substantially parallel to the environment surface 526. Accordingly, the array 500 may be referred to as a horizontal array.

With reference to FIGS. 6A-6B, an unenclosed structure or linear field array 600 according to at least one example embodiment is provided. The array 600 includes a plurality of transparent solar panels 602, such as the TPV 200 (shown in FIG. 2) and/or the TLSC 300 (shown in FIGS. 3A-3B). The array 600 further includes a support structure 604. The transparent solar panels 602 are configured to transmit light to a region 606 containing photosynthetic organisms, such as plants 608. The array 600 further includes electronics assemblies 610 electrically coupled to the solar panels 602. In at least one example embodiment, the electronics assemblies 610 may also function as support pads. The support structure 604 may include a frame 620 and a plurality of posts 622. The frame 620 and/or posts 622 may have colors as described above to facilitate light scattering.

Referring to FIG. 6B, the array 600 may have a height 524 defined between an environment surface 626, such as the ground, and a closest or bottom edge 628 of the solar panel 602. In at least one example embodiment, the height 624 is within the ranges described above.

An angle 630 may be defined between a surface 632 of the solar panel 602 and the environment surface 626. The angle 630 may be between 0° and 90°. In at least one example embodiment, the angle is fixed. In at least one example embodiment, the angle 630 is greater than or equal to about 0° (e.g., greater than or equal to about 10°, greater than or equal to about 20°, greater than or equal to about 30°, greater than or equal to about 40°, greater than or equal to about 50°, greater than or equal to about 60°, greater than or equal to about 70°, greater than or equal to about) 80° The angle 630 may be less than or equal to about 90° (e.g., less than or equal to about 80°, less than or equal to about 70°, less than or equal to about 60°, less than or equal to about 50°, less than or equal to about 40°, less than or equal to about 30°, less than or equal to about 20°, or less than or equal to about) 10°. In at least one example embodiment, the angle 630 is about 45°, as shown.

In at least one example embodiment, an environment includes a plurality of arrays 600. Each array 600 may be spaced apart from adjacent arrays by a distance 640. In at least one example embodiment, the distance 640 may be within the second distance ranges described above. Horizontal and vertical spacing between adjacent arrays may be the same or different.

With reference to FIGS. 7A-7B, a plurality of unenclosed structures or pole assemblies 700 according to at least one example embodiment is provided. Each of the pole assemblies 700 includes a plurality of transparent solar panels 702, such as the TPV 200 (shown in FIG. 2) and/or the TLSC 300 (shown in FIGS. 3A-3B). Each of the pole assemblies 700 further includes a support structure 704.

The transparent solar panels 702 are configured to transmit light to a region 706 containing photosynthetic organisms, such as plants 708. Each of the pole assemblies 700 further includes an electronics assembly 710 electrically coupled to the solar panels 702. In at least one example embodiment, the electronics assembly 710 may also function as a support pad. The support structure 704 may include a frame 720 and a single post 722. The post 722 may be in a center of the pole assembly 700. The frame 720 and/or posts 722 may have colors as described above to facilitate light scattering.

Referring to FIG. 7B, the pole assembly 700 may have a height 724 defined between an environment surface 726, such as the ground, and a closest or bottom edge 728 of the solar panel 702. In at least one example embodiment, the height 724 is within the ranges described above.

An angle 730 may be defined between a surface 732 of the solar panel 702 and the environment surface 726. The angle 730 may be between 0° and 90°, as described above in the discussion accompanying FIG. 6B. Adjacent pole assemblies 700 may be spaced apart as described above in the discussion accompanying FIG. 6B.

With reference to FIGS. 8A-8B, an unenclosed structure or pole assembly 800 according to at least one example embodiment is provided. The pole assembly 800 includes a plurality of transparent solar panels 802, such as the TPV 200 (shown in FIG. 2) and/or the TLSC 300 (shown in FIGS. 3A-3B). The pole assembly 800 further includes a support structure 804.

The transparent solar panels 802 are configured to transmit light to a region 806 containing photosynthetic organisms, such as plants 808. The pole assembly 800 further includes an electronics assembly 810 electrically coupled to the solar panels 802. In at least one example embodiment, the electronics assembly 810 may also function as a support pad. The support structure 804 may include a frame 820 and a single post 822. The post 822 may be in a center of the pole assembly 800. The frame 820 and/or posts 822 may have colors as described above to facilitate light scattering.

Referring to FIG. 8B, the pole assembly 800 may have a height 824 defined between an environment surface 826, such as the ground, and a closest or bottom edge 828 of the solar panel 802. In at least one example embodiment, the height 824 is within the ranges described above.

An angle 830 may be defined between a surface 832 of the solar panel 802 and the environment surface 826. The angle 830 may be about 90° such that the solar panel 802 is substantially perpendicular to the environment surface 826. The pole assembly 800 may be referred to as a vertical assembly. The vertical nature may facilitate improved rainfall distribution, higher yield and/or quality winter month production, large spacing, and/or larger clearance for farming equipment compared to horizontal (see, e.g., FIGS. 5A-5B) and/or tiled (see, e.g., FIGS. 6A-8B) arrays. Furthermore, the use of vertical arrays may balance annular production to be roughly constant or uniform throughout the year.

With reference to FIG. 9A, a pole assembly 900 according to at least one example embodiment is provided. The pole assembly 900 may be the same as the pole assembly 700 of FIG. 7 except as otherwise described below. The pole assembly 900 generally includes transparent solar panels 902, such as the TPV 200 (shown in FIG. 2) and/or the TLSC 300 (shown in FIGS. 3A-3B) and a support structure 904. The transparent solar panels 902 are configured to transmit light to a region 906 containing photosynthetic organisms, such as plants 908.

An orientation of the pole assembly 900 may be adjustable along one, two, or three axes. In at least one example embodiment, as shown, the pole assembly 900 is adjustable about a first axis 920, a second axis 922, and a third axis 924. The first axis 920 is substantially perpendicular to an environment surface 926. The second and third axes 922, 924 are substantially perpendicular to one another and lie within a plane defined by a surface 928 of the solar panel 902. In the example embodiment shown, the solar panel 902 is disposed at a first angle 940 of about 45° about the second axis 922 in FIG. 9A and a second angle 942 of about 30° about the second axis 922 in FIG. 9B.

In at least one example embodiment, the assembly 900 is configured to automatically track a position of the sun. Such tracking can be pre-programmed to follow the expected sun trajectory for each day of the year or follow the sun based on active monitoring of power production and orientation optimization. Accordingly, it may enable enhanced power production compared to arrays that are not equipped with solar tracking. Tilting the array can reduce the area needing to help increase light capture, thus decreasing the number of panels needed and reducing overall cost, increasing rainfall distribution, and permit farm equipment to pass between/under the supports and panels. The assembly 900 may therefore further include motors and a control system (not shown) to automatically modify an orientation of the assembly 900 about the first, second, and or third axes 920, 922, 924

With reference to FIG. 10, a bifacial array 1000 according to at least one example embodiment is provided. Except as otherwise described below, the bifacial array 1000 may be the same as the array 600 of FIG. 6. The bifacial array 1000 may generally include a bifacial transparent solar panel 1002, such as the transparent solar panel 200 of FIG. 2 and/or the transparent solar panel 300 of FIG. 3, and a support structure 1004. As used herein, "bifacial" means that the solar panel has a PCE from illumination on the backside that is greater than or equal to about 50% of that of the front side (e.g., greater than or equal to about 55%, greater than or equal to about 60%, greater than or equal to about 65%, greater than or equal to about 70%, greater than or equal to about 75%, greater than or equal to about 80%, greater than or equal to about 85%, greater than or equal to about 90%, or greater than or equal to about 95%). The solar panels 1002 are configured to transmit light to a region 1006 containing photosynthetic organisms, such as plants 1008. In at least one example embodiment, the bifacial transparent solar panel 1002 is free low-e coatings that would minimize the backside harvesting.

The bifacial array 1000 is configured to accept direct sunlight 1020 on a first or top side 1022 and indirect sunlight 1024 (e.g., solar albedo) on a second or bottom side 1026. The bifacial configuration is beneficial, particularly in these ground mount applications where the solar albedo can be effectively captured by the backside of the panels, increasing the performance. The TPVs (e.g., TPV 200 of FIG. 2) and TLSCs (e.g., TLSC 300 of FIGS. 3A-3B) disclosed herein can be made and optimized to be bifacial to enable efficient power generation from both sides. Any of the assemblies or arrays disclosed herein may be bifacial.

At least one example embodiment includes agricultural equipment with the solar panel (e.g., the TPV 200 of FIG. 2 and/or the TLSC of FIGS. 3A-3B) integrated. The agricultural equipment may include an irrigation system, a fertilizer system, a seeding system, a harvesting system, $CO_2$ enrichment system, any other appropriate agricultural equipment, or any combination thereof. Advantageously, the solar panel may share electrical and/or mechanical infrastructure with the agricultural equipment. An irrigation system may include a drip irrigation system, a subsurface irrigation system, a gravity irrigation system, a center-pivot irrigation system, a traveling gum irrigation system, a linear move system, or any combination thereof. In some examples, the solar cell integrated with agricultural equipment may be wavelength-selective. However, agricultural equipment may additionally or alternatively include non-wavelength-selective solar cells.

With reference to FIGS. 11A-11B, a solar array and irrigation system 1100 according to at least one example embodiment is provided. Except as otherwise described below, the system 1100 may be the same as the pole assembly of FIGS. 7A-7B. Although the system 1100 is shown as a single-pole, fixed angle assembly, it may have any other suitable configuration, such as those described herein.

The system 1100 includes transparent solar panels 1102, such as the TPV 200 (shown in FIG. 2) or the TLSC 300 (shown in FIG. 3). The system further includes a support structure 1104 an irrigation system 1106. The transparent solar panels 1102 are configured to transmit light to a region 1108 containing photosynthetic organisms, such as plants 1110.

In at least one example embodiment, the irrigation system 1106 includes flexible tubing 1120. The flexible tubing 1120 is configured to transfer water from a source to the region 1108 via a conduit. The flexible tubing 1120 may be fluidly coupled to a plurality of nozzles 1122 configured to discharge water into the region 1108. Additionally or alternatively, water may be delivered directly via the conduit.

In at least one example embodiment, the support structure 1104 includes a post 1124 and a frame 1126. In the example embodiment shown, the flexible tubing 1120 is wrapped around an outer surface 1128 of the post 1124 and an outer surface 1130 of the frame 1126. In at least one other example embodiment, flexible tubing may be inside the frame, as in FIG. 12).

In at least one example embodiment, the support structure 1104 (e.g., the post 1124 and/or the frame 1126) may be at least partially hollow to contain electrical service (wiring) and/or irrigation service (e.g., the flexible tubing 1120). In the example embodiment shown in FIG. 11B, the post 1124 includes a wall 1140 that at least partially defines an interior region 1142. The interior region 1142 may be configured to receive electrical wiring that is electrically connected to an electronics assembly 1144 and the solar panels 1102.

With reference to FIG. 12 a cross section of a post 1200 for a solar array and irrigation system according to at least one example embodiment is provided. The post 1200 includes a wall 1202 at least partially defining an interior region 1204. The post 1200 further includes an axial partition 1206. The partition 1206 divides the interior region 1202 into a first portion 1208 and a second portion 1210. One of the first and second portions 1208, 1210 may at least partially contain electrical service (wiring) and the other of the first and second portions 1208, 1210 may at least partially contain irrigation service (see, e.g., flexible tubing 1120 of FIGS. 11A-11B).

With reference to FIG. 13, a flowchart illustrating a method of photovoltaic power generation via a system including one or more transparent solar panels or arrays according to at least one example embodiment is provided. The method generally includes optionally determining a fixed angle a S1300; optionally determining a space between adjacent assembly at S1302; installing a solar panel or array at S1304; and producing power at S1306. Each of these steps is discussed in greater detail below. The method may be performed using the any of the panels (FIGS. 2-3B) or assemblies described above (FIGS. 4-12).

At S1300, the method optionally includes determining a fixed angle defined between a first surface of the solar panel and a second surface of a region. The angle may be determined based on latitude. In at least one example embodiment, the angle is within about 20° of a latitude at which the transparent solar array will be installed (e.g., within about 15°, within about 10°, within about 5°, or substantially equal to the latitude).

At S1302, when the system includes more than one transparent solar array, the method optionally includes determining a spacing between adjacent arrays. The spacing may be determined based on desired water penetration between adjacent devices, desired equipment clearance between devices, and/or reduction or minimization of shadow during midday solstice.

At S1304, the method includes installing the solar panel such that it transmits light to a region within a first wavelength range to a region containing a photosynthetic organism. In at least one example embodiment, the first wavelength range is suitable for cultivating a desired characteristic of the photosynthetic organism. The region may be land and/or water.

In at least one example embodiment, the photosynthetic organism is a plant. In at least one example embodiment, the solar panel is configured to transmit light to of the first wavelength range to the plant such that a crop yield reduction of the plant compared to a plant grown under full spectrum light in otherwise identical conditions, as described above (e.g., less than or equal to about 10%).

In at least one example embodiment, the plant is a fruit-bearing plant. As used herein, "fruit-bearing plant" means a plant primarily cultivated for its fruit. The solar panel may be configured to have an overall APT as described above (e.g., greater than or equal to about 65%). The solar panel may be configured to transmit light at any DLI as described above (e.g., greater than or equal to about 15 mol·m$^{-2}$·d$^{-1}$).

In at least one example embodiment, the plant is a flowering plant. As used herein, "flowering plant" means a plant primarily cultivated for its flowers. The solar panel may be configured to have an overall APT as described above (e.g., greater than or equal to about 50% The solar panel may be configured to transmit light at any DLI as described above (e.g., greater than or equal to about 10 mol·m$^{-2}$·d$^{-1}$).

In at least one example embodiment, the plant is a leafy plant (e.g., a leafy green plant). As used herein, "leafy plant" means a plant primarily cultivated for its leaves. The solar panel may be configured to have an overall APT as described above (e.g., greater than or equal to about 50%). The solar panel may be configured to transmit light at any DLI as described above (e.g., greater than or equal to about 10 mol·m$^{-2}$·d$^{-1}$).

In at least one example embodiment, the plant is a grain. As used herein, "grain" means a plant primarily cultivated for its caryopsis. Grains may be dry harvested. The solar panel may be configured to have an overall APT as described above (e.g., greater than or equal to about 50%). The solar panel may be configured to transmit light at any DLI as described above (e.g., greater than or equal to about 10 mol·m$^{-2}$·d$^{-1}$).

In at least one example embodiment, the plant is a forage crop. As used herein, "forage crop" means a plant that is intended to be consumed by animals. The solar panel may be configured to have an overall APT as described above (e.g., greater than or equal to about 45%). The solar panel may be configured to transmit light at any DLI as described above (e.g., greater than or equal to about 10 mol·m$^{-2}$·d$^{-1}$).

At S1306, the method includes producing power by absorbing light within a second wavelength range. The second wavelength range may be different from the first wavelength range. Different means non-coextensive, but the first and second wavelength ranges may overlap. The light is absorbed by a wavelength-selective photoactive material, such as a transparent photoactive material and/or luminophore.

With reference to FIG. 14, a flowchart illustrating a method of designing and making a transparent solar panel is provided. The method generally includes identifying a DLI for achieving a characteristic of a photosynthetic organism at S1400; selecting a photoactive material and device design at S1402; optionally optimizing device characteristics at S1404; optionally selecting device layers and materials at S1406; and constructing a transparent solar panel including the photoactive material at S1408.

At S1400, the method includes determining DLI for achieving a desired characteristic of a photosynthetic organism. Additionally or alternatively, the method includes determining an eDLI, APT, YPFD, wavelength range, and/or wavelength cutoff for achieving the characteristic. In at least one example embodiment, the photosynthetic organism is a plant. Achieving the desired characteristic can include maintaining and/or improving (e.g., increasing/maximizing or suppressing/decreasing/minimizing) the desired characteristic. For example, the characteristic can include large leaf size, high fruit mass, sugar content, nutrition, phytochemical concentration, plant architecture, time to harvest, fruit number, shoot fresh mass, leaf expansion, stem length, leaf chlorophyll content, dry mass, plant resilience, drought tolerance, or any combination thereof. Determining the DLI to achieve the desired characteristic can include use of the ranges disclosed above.

At S1402, the method includes selecting a photoactive material to be compatible with the DLI (and/or eDLI, APT, YPFD). That is, the material should be capable, in at least some configurations, of achieving the DLI (eDLI, APT, YPFD). Selecting the photoactive material may include use of the photoactive materials disclosed above.

At S1404, the method optionally includes optimizing device characteristics to achieve desired performance. For a TPV, such as the TPV 200 of FIG. 2, these characteristics can include entire device thickness (e.g., third thickness 224 shown in FIG. 2), donor thickness (e.g., first thickness 220 shown in FIG. 2), and/or acceptor thickness 222 (e.g., second thickness 222 shown in FIG. 2). For a TLSC, such as the TLSC 300 of FIGS. 3A-3B, these characteristics can include waveguide thickness, luminophore concentration, molecular orientation, and/or waveguide-luminophore pairing.

At S1406, the method optionally includes selecting device layers and materials to achieve a desired SHGC* and/or LUE*. Materials can include electrode materials as described above, by way of example.

At S1408, the method includes constructing a transparent solar panel (e.g., the TPV 200 of FIG. 2 or the TLSC 300 of FIGS. 3A-3B) including the photoactive material.

Embodiments of the present technology are further illustrated through the following non-limiting examples.

Example 1

Recent efforts have been made to introduce and improve visible transparency of PV cells—either broadband or through the use of selectively-absorbing materials—to enable applicability to a greater number of surfaces. We can evaluate these approaches in the context of agrivoltaics—from spatially segmenting opaque solar cells to wavelength-selective active materials. This is an important distinction as they offer fundamentally different theoretical limits as a function of transparency, where the theoretical limit of a spatially segmented cell is 0% at 100% transparency and around 21% for a wavelength selective transparent photovoltaics (TPVs) at 100% transparency.

Figure 15:
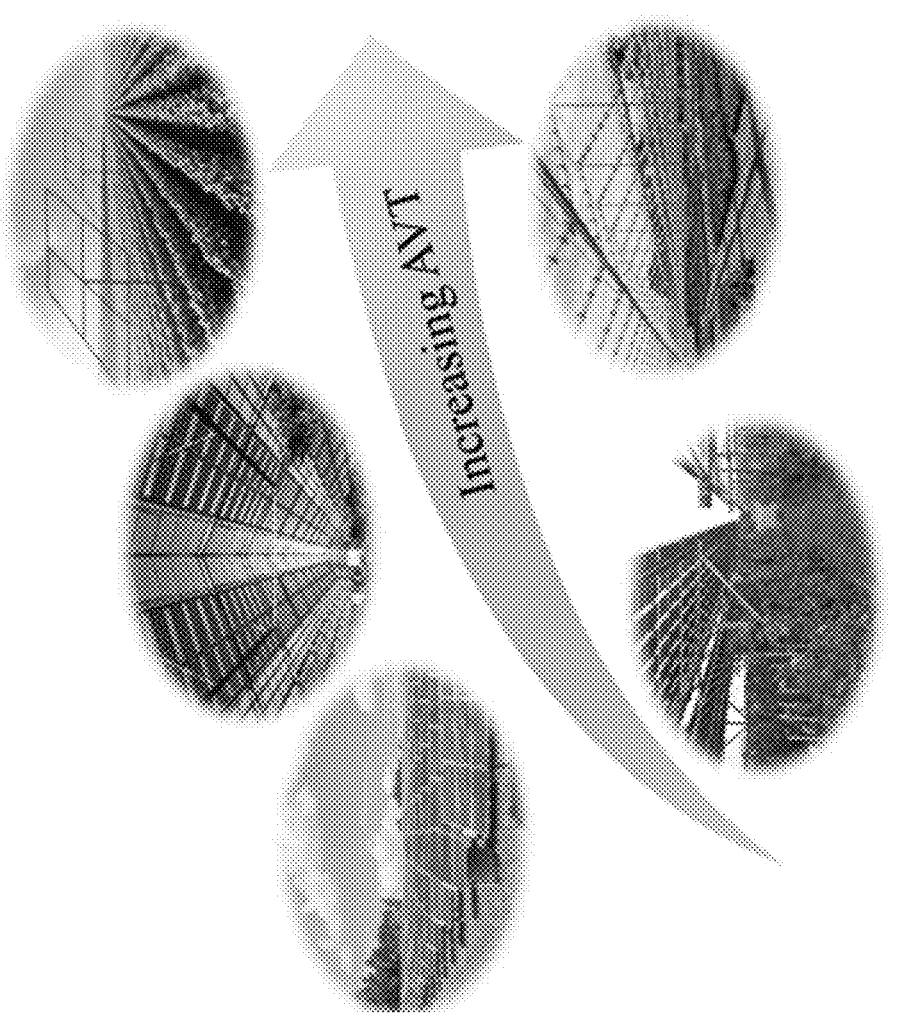
FIG. 15 is a schematic illustration of the progression and outlook of various agrivoltaic approaches according to at least one example embodiment.

FIG. 15 illustrates the progression and outlook of agrivoltaic approaches, including current approaches shown here, based on increasing transparency, starting with opaque PV modules, and moving towards PAR-transparent PV devices. Ideally, agrivoltaic systems would have high transmission of photosynthetically active radiation (PAR; photons between 400-700 nm). The simplest implementation of agrivoltaics is by deploying opaque modules over or adjacent to crops. Higher APT can be achieved by moving to wavelength-selective modules that do not absorb PAR.

This example evaluates the effects of neutral shading and wavelength-selective shading on three diverse and highly representative and commercially important species of plants: leafy: the culinary herb basil (*Ocimum basilicum*), flowering ornamental: petunia (*Petunia* x *hybrida*), and fruit-bearing: tomato (*Solanum lycopersicum*). Emphasis is placed around the NIR edge to better understand where it is appropriate to absorb light for TPV without affecting plant growth and development. Ultimately, we show that overall DLI has particularly important ramifications on growth, yield, and morphology across species and that weighted DLI further impacts these metrics, indicating wavelength-specific phenomena should be studied further. This example will help to enable the design of agrivoltaic approaches to ensure greater compatibility with existing agricultural infrastructure across a large range of crop types and regions with different solar availability.

The field of agrivoltaics is relatively new and pursued by several interested disciplines in engineering and plant sciences. Comparisons between studies are challenging because study methodology and reporting vary widely in the literature. In particular, reporting percentage shade and roof cover are ambiguous and insufficient because incident solar radiation depends on geographical location and season, and crops have diverse light responses. In this example, we first describe plant responses to DLI because it is a quantum unit that drives photosynthesis, is highly correlated to crop yield and quality, and responses have been characterized in a wide range of greenhouse crops. Radiometric units (Watts or Joules) that integrate over a wider waveband of electromagnetic radiation are still important to the field of agrivoltaics because they can better describe the effect of covering materials (BIPV panels) on the microclimate around plants (e.g., air temperature) or plant process such as transpiration that can ultimately influence crop growth.

Results

Seven ventilated chambers (each having a roof area of ~0.8 m$^2$) that were each covered with a different experimental TPV glazing material, as shown in FIGS. 16A-16B and 17A-17B. Three neutral-shading treatments were provided to quantify the effects of PAR loss on crop production: 91% (ND91), 58% (ND58), and 33% (ND33) transmittance across PAR. With reference to FIG. 19A, ND91 is shown at 1800, ND58 is shown at 1802, and ND33 is shown at 1804. Four wavelength-selective treatments were developed based on luminescent solar concentrator (LSC) molecule platforms designed with different cutoffs to determine how removing specific wavebands and overall DLI affect plant growth, development, and yield. FIG. 18B illustrates two treatments in the NIR: CO700 is shown at 1810 and CO770 is shown at 1812. ND91 is shown at 1800 for reference. FIG. 18C illustrates two treatments in the PAR wavebands: CO550a is shown at 1820 and CO550b is shown at 1822. ND91 is shown at 1800 for reference.

FIGS. 19A-19M depict selected growth attributes of basil, petunia, and tomato as a function of the DLI transmitted through the different glazing treatments, with FIG. 19A being a legend. Each yield or quality parameter is plotted as a function of the average treatment DLI, since DLI is strongly correlated with plant growth and yield for many greenhouse crops; regression equations are displayed in FIGS. 20-22. These attributes were selected because they are important to the yield and quality of each crop and vary among crop types. Basil yield reflects the biomass accumulation of leaves and stems whereas stem length, leaf size, and color are quality parameters (FIGS. 19B-19E). While it is important to quantify the biomass accumulation of petunia, floriculture crops derive more of their marketability from aesthetic qualities such as stem length (preference for compactness) and number of flowers (floral display) (FIGS. 19F-19I). Unlike basil and petunia, tomato yield reflects fruit fresh mass and number (FIGS. 19J-19M).

Basil growth. Basil growth and development parameters measured were highly correlated with the average transmission DLI. Basil yield is characterized as the average shoot dry mass per plant (leaves plus stems). Regardless of the spectral transmission differences among treatments, there was a sigmoidal relationship between the yield of basil and the average DLI (FIGS. 19B, 22 (equation)), where yield increased linearly when the DLI was between ~6 and ~12 mol m$^{-2}$d$^{-1}$. Yield did not increase much further when the DLI exceeded ~12 mol m$^{-2}$d$^{-1}$. Basil yield was similar when grown under the ND91, CO770, and CO700 treatments, corresponding to treatments with a transmitted DLI typically ≥12 mol m$^{-2}$d$^{-1}$ (see FIG. 23). Basil grown between a DLI of ~10 and ~14 mol m$^{-2}$d$^{-1}$ (i.e., CO770, CO700, and CO550a) had statistically similar stem lengths compared to the ND91 treatment (DLI=~20 mol m$^{-2}$d$^{-1}$) but produced fewer nodes and thinner stems at the substrate surface (FIGS. 19C, 23). Elongation and narrowing of basil stems (FIG. 24) caused plants to become progressively less upright compared to the ND91 treatment, which could negatively affect basil consumer appeal or ease of production (i.e., harvest and shipping). In addition to yield, leaf morphology is important to basil cultivation. Similar to basil yield and stem morphology, leaf morphology was correlated with treatment DLI (FIG. 20). Basil leaf length, width, and total surface area were similar when the average DLI was ≥12 mol m$^{-2}$d$^{-1}$, which typically occurred in the ND91, CO770, and CO700 treatments (FIGS. 19D, 23). However, the relative chlorophyll content (soil plant analysis development or SPAD) of basil decreased with any amount of shading, resulting in leaves with a lighter green color (FIG. 19E). Reduced pigmentation could negatively affect the aesthetic appeal of basil products. In summation, when DLI was ≥12 mol m$^{-2}$d$^{-1}$, basil yield was statistically similar across treatments but came at the consequence of altered stem and leaf morphology.

Petunia growth. Petunia yield was characterized as the average shoot dry mass per plant (leaves plus stems), and regardless of the spectral transmission differences among treatments, there was a sigmoidal relationship between biomass and the average DLI (FIGS. 19F, 21). Yield increased linearly when the DLI was between ~6 and ~12 mol m$^{-2}$d$^{-1}$. When the DLI exceeded ~12 mol m$^{-2}$d$^{-1}$, the yield response was at or near saturation. Thus, petunia yield was similar when grown under the ND91, CO770, CO700, and CO550a treatments when the transmitted DLI was typically ≥12 mol $m^{-2}d^{-1}$ (FIG. 25). While shoot biomass is not inconsequential to floriculture crops, floriferousness, time to flower, and overall canopy size can have a larger role in the marketability of a crop. Petunia grown under a DLI >13 mol $m^{-2}d^{-1}$ (i.e., CO770 and CO700) had statistically similar central stem lengths compared to the ND91 treatment (DLI=~20 mol $m^{-2}d^{-1}$) (FIGS. 19G, 21). As shown in FIG. 24, when the DLI was <13 mol $m^{-2}d^{-1}$, apical dominance increased in a dose-dependent manner, to the point that lateral branching was completely inhibited in the lowest DLI treatment (CO550b, DLI=~7 mol $m^{-2}d^{-1}$). Petunia lateral branch length was statistically similar under treatments with DLIs between ~10 and ~20 mol m $m^{-2}d^{-1}$, but petunia lateral branches were significantly longer under the CO550a (DLI=12.8 mol $m^{-2}d^{-1}$) treatment compared to the ND91 treatment. This suggested the CO550a wavelength-selective material that removed many of the blue and green photons from transmission increased extension growth. However, the CO550a treatment did not comparably increase leaf area, and petunia that received a DLI between ~12 and 20 mol $m^{-2}d^{-1}$ had a statistically similar individual leaf size (FIG. 19I). The time to first open flower after transplant was statistically similar for petunia in the ND91, ND58, CO770, CO700, and CO550a treatments, which all had an average DLI >7 mol $m^{-2}d^{-1}$ (FIG. 25). When DLI was ≤7 mol $m^{-2}d^{-1}$, petunia flowered ~3 days later than those in the ND91 treatment. Petunia produced fewer total flowers when the DLI was <12 mol $m^{-2}d^{-1}$ (FIG. 19H).

Tomato growth. As a fruiting crop, tomato usually has a longer production time than basil or petunia. Tomato yield is characterized as the total fresh mass of all fruits (ripe and unripe) per plant at a single destructive harvest. While most growth parameters for basil and petunia were best described as sigmoidal functions of DLI, tomato yield increased linearly with DLI and never approached an upper asymptote (FIG. 26). This indicated that any decrease in PAR transmission negatively influenced yield, and even the panels with the highest PAR transmission (CO770 and CO700) had 25% and 37% less yield than the ND91 treatment (FIG. 19J). Total number of fruit and fruit dry mass in these three treatments were similar, indicating a decrease in DLI decreased fruit size, delayed fruit ripening, or both (FIG. 19L). As such, tomato in the CO770 and CO700 treatments had 52% and 74% fewer ripe fruit at harvest than the ND91 treatment, respectively (FIG. 19J). Tomato leaf morphology was not influenced by the average DLI or specific absorption bandwidths. However, tomato stem length increased and stem diameter decreased with decreasing DLI (FIGS. 19K, 24). As a result, tomato required physical support to remain upright under low DLI conditions. The time to first open flower after transplant was statistically similar for tomato in the ND91, ND58, CO770, CO700, and CO550a treatments, which all had an average DLI ≥6 mol $m^{-2}d^{-1}$ (FIG. 26). When DLI was <6 mol $m^{-2}d^{-1}$, tomato flowered ~14 days later than those in the ND91 treatment.

Discussion

Crop Growth and Yield. Crop yield (crop biomass per unit area) and quality (e.g., metrics of aesthetics or nutritional density) influence revenue generated from horticultural crops whether grown in a field or controlled environment such as a greenhouse. While yield has a simple mathematical definition, crop quality is subjective and can consider consumer preferences for, and interactions with, an agricultural product. Examples include crop nutrition and flavor and physical qualities that make a crop easier to manage, harvest, ship, or market. Ideally, agrivoltaic systems would have no negative effect on crop yield or quality while creating passive income through electrical generation. An inescapable challenge for designing and using agrivoltaic systems is accounting for the many different crops and growing systems used in plant-based agriculture. The diversity of uses for the same land area should emphasize the desirability for flexible agrivoltaic systems, since each crop, and even diversity within a crop species, could have specific tolerances to DLI reductions and/or removed wavebands of radiation.

To strive towards broad agricultural application of BIPV cover, namely one that would have negligible impact on the yield and quality of different crops, we grew three economically important greenhouse crops that offered diverse comparisons among plants primarily grown for their leaves and stems (basil), flowers (petunia), and fruits (tomato). Generally, basil and petunia are commercially grown under moderate DLIs, while light is usually maximized for fruiting crops such as tomato. However, in regions in which light is seasonally limiting, such as >35°N or S latitude, most commercial greenhouse growers cannot tolerate more than slight reductions in the DLI, even for crops such as basil and petunia.

For broad comparison, relative growth parameters are plotted for the three greenhouse crops as a function of the average DLI in each treatment, as shown in FIG. 27A-27F. This facilitates more direct response comparisons for the three representative crops commonly produced by greenhouse growers in terms of growth and yield (FIG. 27B, where basil is indicated by regression line 2700 and associated symbols, petunia is indicated at 2702 and associated symbols, and tomato is indicated at regression line 2704 and associated symbols), as well as leaf (FIGS. 27C, where basil is indicated by regression line 2710 and associated symbols, petunia is indicated at 2712 and associated symbols, and tomato is indicated at regression line 2714 and associated symbols; and FIG. 27D, where basil is indicated by regression line 2720 and associated symbols, petunia is indicated at 2722 and associated symbols, and tomato is indicated at regression line 2724 and associated symbols), stem (FIGS. 27E, where basil is indicated by regression line 2730 and associated symbols, petunia is indicated at 2732 and associated symbols, and tomato is indicated at regression line 2734 and associated symbols; and FIG. 27F, where basil is indicated by regression line 2740 and associated symbols, and tomato is indicated at regression line 2744 and associated symbols), and plant (FIG. 27G, where basil is indicated by regression line 2750 and associated symbols, petunia is indicated at 2752 and associated symbols, and tomato is indicated at regression line 2754 and associated symbols) morphological responses. The three crops generally responded similarly to DLI, with two notable exceptions: 1) relative yield approached or reached a saturating DLI for basil and petunia, but not for tomato; 2) stem length of basil increased with DLI until a saturating value, whereas it decreased with DLI for petunia and tomato.

Direct comparisons between the results of this example and past agrivoltaic studies are challenging because many of those studies reported shading factors or percentage roof cover of experimental BIPV materials, but actual light conditions would depend on geographic location and time of year, among other factors. For example, lettuce grown under PV panels that decreased PPFD by as much as 50% caused limited yield reductions in some studies. In contrast, other studies reported that basil, spinach, lettuce, and arugula yield decreased under PV panels that decreased PPFD by 25-60%. Reporting common quantum units and DLI, not just reduction in quantum flux, would aid in comparing studies. Many of these studies were conducted in the summer with very high incident DLIs, which may have resulted in relatively little yield loss. However, during winter greenhouse conditions, when DLIs may be at or below 10 mol $m^{-2}d^{-1}$, any shading may reduce yields and thus a decrease in DLI may not be tolerable. Inconsistencies among studies as well as seasonal and geographic differences in solar radiation attest to the challenges of providing consistent shading tolerances for non-fruiting crops. Nonetheless, one study concluded that up to 25% shading was generally tolerable to crops, but this would still depend on location and crops grown.

FIG. 27B indicates a near-saturating DLI for production of high-quality basil and petunia is ~12 mol $m^{-2}d^{-1}$, which is consistent with previous studies on sweet basil and petunia, as well as other floriculture crops including impatiens (*Impatiens wallerana*), begonia (*Begonia* x *semperflorens-cultorum*), and ageratum (*Ageratum houstonianum*). This indicates agrivoltaic panels that decrease the DLI by up to 40% (maintaining DLI ≥12 mol $m^{-2}d^{-1}$) can be useful for greenhouse systems during late spring and summer. However, when the ambient solar DLI is lower, such as during the winter and early spring, these reductions would negatively impact growth. Thus, for BIPV panels acting as a permanent greenhouse glazing, acceptable transmissions should heavily consider often suboptimal seasonal conditions for a particular geographical location.

Tomato did not tolerate even modest shading (e.g. a DLI <12 mol $m^{-2}d^{-1}$ or a decrease of 4 mol $m^{-2}d^{-1}$ in the current example) without a decrease in yield or number of ripe fruits at harvest (FIG. 27B), which is consistent with previous literature on tomato and other fruiting crops such as pepper (*Capsicum annuum*) and cucumber (*Cucumis sativus*). Moreover, it is likely our dwarf tomato cultivar was more tolerant of less light than much larger indeterminate tomato varieties typically grown in greenhouses with DLIs >20 mol $m^{-2}d^{-1}$. Decreased yield and delayed ripening were previously observed as a consequence of BIPV and traditional shading. Therefore, for tomato and other fruiting crops, BIPV panels used for greenhouse applications should increase or maximize transmission of PAR in temperate regions, but modest decreases in PAR transmission may be tolerable in subtropical, tropical, and especially arid regions.

Crop Morphology and Quality

In addition to yield, shading can negatively impact crop quality, but such effects are often not reported in agrivoltaics research. The marketability and quality of many floriculture crops, as well as other ornamentals, is influenced more by their appearance and physical qualities (e.g., flower number and size) than biomass accumulation. Therefore, application of BIPV materials to greenhouses must also consider morphological acclimation, leaf and flower pigmentation, branching, time to flower, and floriferousness of crops. Striking a balance between crop quality, yield, and electrical generation by BIPV panels necessitates a comprehensive approach to crop evaluation in agrivoltaic systems.

Leaf morphology. Leaf morphology, pigmentation, and in some cases flavor, are important quality attributes for greenhouse crops sold for their vegetative growth. In part, leaf surface area remained constant at DLIs less than that under ND91 (DLI=16-20 mol $m^{-2}d^{-1}$) because leaves had a greater specific leaf area (SLA) (i.e., thinner leaves). FIG. 27C shows SLA was inversely and linearly related to the treatment DLI for each species, especially for tomato. Increased SLA (i.e., increase leaf surface area at the expense of leaf thickness) is a common response to increased light interception. One study suggested that certain plant species that acclimate to shading by increasing their light interception could be more desirable for agrivoltaic systems. However, the thinning of leaves could make them more susceptible to stressors (e.g., pathogens) and physical damage during production and harvest. Leaf pigmentation, which we quantified by relative chlorophyll content (SPAD) measurements, increased as a function of the average DLI for each crop (FIG. 27D). Among the three crops grown, basil quality could be the most negatively affected by lower chlorophyll concentration (i.e., lighter green color) because its quality is heavily dependent on leaf appearance. In addition to morphology and color, the concentration of flavonoids decreased as DLI decreased. Therefore, although leaf morphology and yield of basil, petunia, and tomato were similar when the DLI decreased from ~20 to ~12 mol $m^{-2}d^{-1}$, there were some negative effects on metrics of plant quality.

Stem morphology. Stem morphology (e.g., stem length and diameter) can influence the marketability of greenhouse crops. In most cases, commercial growers strive to produce containerized crops that are branched and compact (e.g., short and thick stems) to facilitate shipping and handling. A decrease in DLI increased stem elongation of tomato and decreased stem diameter of basil and tomato (FIGS. 27E-27F). The thinner and longer stems of basil and tomato plants necessitated physical support to remain upright. While this may not influence tomato production because string typically provides support during commercial greenhouse production, it can reduce the quality of potted horticultural crops like basil or increase lodging of agronomic crops like soybean (*Glycine max*), which should remain upright without support. Calculations for compactness (plant mass per unit height) or the ratio of plant height to plant diameter help estimate the space an individual plant occupies during production. Compactness decreased (i.e., each plant occupied more space) as DLI decreased in all crop species, suggesting cropping density may need adjustment under some agrivoltaic systems, and this could ultimately influence crop yield (FIG. 27G). Excessive extension growth is usually undesirable for floriculture crops, so the increase in stem elongation and decrease in plant compactness under lower DLIs decreased their quality, or would necessitate increased use of plant growth retardants in their management. Similar to leaf morphology, greenhouse crop quality decreased with the transmitted DLI, which highlights the nuanced trade-offs that exist between crop yield and quality and the desirability for BIPV covers with high transmission of PAR.

Flowing and Fruiting. Commercial greenhouse growers of ornamentals strive to produce crops in the shortest time possible while maintaining at least acceptable plant quality, while growers of fruiting crops seek to increase or maximize yield per unit area and time. We observed delayed flowering of petunia and tomato when the treatment DLI was <7 and 6 mol $m^{-2}d^{-1}$, respectively. Importantly, we started to observe morphological differences and reduced floriferousness when the DLI was <12 mol $m^{-2}d^{-1}$. This example indicates petunia, and likely other floriculture crops, could tolerate moderate shading without decreasing yield or quality, which makes ornamentals more suitable than fruiting vegetable crops for agrivoltaic systems located in temperate regions. To date, however, few studies have focused on ornamental crops in agrivoltaic systems.

Potential Power Output of Transparent Agrivoltaics. We first utilize the definition of APT and PAR to define the upper limit for TPVs in agrivoltaics with high or maximum transparency. For this example, the use of single-junction modules and perfectly sharp cutoffs is assumed where the transmittance is 1 between 395-715 nm (a wavelength range dictated by setting an APT of 95%) and 0 outside that range. The Shockley-Queisser limit is 33.7% for opaque single-junction modules and is 20.6% for modules that transmit all light between 435-670 nm. When expanding the range to 395-715 nm, the resulting theoretical limit of 17.4% for PAR with no contribution from the 395-715 nm range, which then has a practical limit (assuming 80% SQ voltage limit, 85% maximum external quantum efficiency, and 80% fill factor) around 9.5%. The thermodynamic limits we define here for standard TPV modules also translate equivalently to the limits for visibly transparent luminescent solar concentrators (TLSCs). TLSCs are capable of higher APT values (~90%) because TPV modules will be limited by their transparent electrodes to an APT of ~80%, however have lagged behind TPVs in PCE.

With these limits, we estimate the total potential energy output for agrivoltaics that maintain maximum transparency and reduced or minimal plant impact as a function of performance. In the U. S., the total amount of area under protected surfaces (e.g., glass and plastic greenhouses) is approximately $1.1\times10^7$ m$^2$ for fruit, vegetable, and herb production and 7.0 $10^7$ m$^2$ for floriculture crop production (for the 17 states surveyed). Assuming 50% of this covered area is permanent greenhouses, this gives an area of ~4.0× $10^7$ m$^2$. Given that the annual average incident solar insolation across the US is 4.5 kWh m$^{-2}$d$^{-1}$, benchmark efficiencies up to the calculated limits are used to show the potential annual energy output (FIG. 28). Assuming 5%-efficient modules, this translates to 3 TWh annually. While the greenhouse energy output value is modest, it can provide important power generation to cover much of the energy demands of greenhouse operation and produce excess energy in high solar flux regions. This effect could become increasingly important as the use of greenhouses expands to enable growth in regions that are less favorable for plant growth. In contrast, the total area of farmland (including pastureland) in the US is $3.6\times10^{12}$ m$^2$. Agrivoltaics could further be integrated more widely into fields and farmland, particularly if the tradeoffs between plant productivity and power generation can be minimized with the proposed TPV design approaches. In this case, array support structures that enable operating equipment (e.g., tractors and irrigation systems) to function as necessary would be important. Indeed, such solar installations could be synergistically and simultaneously installed with irrigation systems (and perhaps fertilizer and pesticide solutions too) such that the PV mounting systems double as conduit for subsurface, drip, or spray irrigation. At the theoretical limit, the total output would approach $1.0\times10^6$ TWh (~3,500 quadrillion British thermal units, quads), which is more than the entire energy demand of the U.S. across all sectors. It is estimated that TPV agrivoltaic panels could reasonably cover upwards of 1-10% of farmland area, translating to a minimum of 3.6 $10^{10}$ m$^2$ in this case. The use of 5% efficient TPV modules over 1% of farmland results in 3,000 TWh annually, enough energy to account for 75% of the U.S. electricity consumption (~4000 TWh), and 10%-efficient TPVs would provide 6,000 TWh annually, surpassing the entire electricity consumption. Scaling up to 10% of farmland and utilizing practically achievable 10%-efficient TPVs, the total power output would be 60,000 TWh (~200 quads), which would more than double the 27,000 TWh (~93 quads) of total power generated in the U.S. from all sources in 2020 (FIG. 29). Thus, even with minimal use of PAR for solar harvesting there remains significant opportunity for power generation in agrivoltaics enabling efficient dual land use that can power the entire country and the world.

Conclusions

In this example, we have presented an unprecedented and comprehensive approach to determine the applicability of TPV greenhouse glazings for diverse and economically important greenhouse crops. Unique to agrivoltaic greenhouse systems is the demand for growing many different crops continuously throughout the year. Currently, more comprehensive agrivoltaics research is necessary to understand what materials are most applicable to the broad range of crops grown in greenhouses while considering agricultural practices and geographical locations. The current example offers a novel plant-centric focus where TPV materials are investigated to reduce or minimize the impact on plant growth, productivity, and yield.

Despite the often-dramatic differences in PV panel photon distribution, panel transmission was the most significant predictor of crop yield and quality. Basil, petunia, and soy yield and quality responses were saturated when the average DLI was >12 mol m$^{-2}$d$^{-1}$, which corresponded to ~35-40% shading (~60% APT). This indicates tremendous potential for herbs and floriculture crops in agrivoltaic systems from late spring to early fall when solar irradiance is high. However, the fruiting crop tomato experienced reduced yield with even moderate BIPV shading, and thus APT >65%, is even more strongly desired. Pushing the absorption peak deeper into the NIR (>750 nm) increases the transmitted DLI and therefore should reduce the impact of TPVs on fruiting crops, resulting in productivity more comparable to the control of single-pane glass. Lastly, this example identifies the need for consistent quantum unit reporting in agrivoltaics to improve study reproducibility and applicability for future agrivoltaic systems, whether building- or field-based. Establishing appropriate APT, DLI, and wavelength cutoffs for different types of crops is an important step towards developing TPVs for a range of truly synergistic agrivoltaic implementations.

Experimental

Preparation of wavelength-selective panels (CO550b, CO700, and CO770). 2-[2-[2-Chloro-3-[(1,3-dihydro-1,3,3-trimethyl-2H-indol-2-ylidene)ethylidene]-1-cylcohexen-1-yl]-ethenyl]-1,3,3-trimethyl-1H-indolium iodide (IR775-1, Few Chemicals) and 2-[2-[2-chloro-3-[2-(1,3-dihydro-3,3-dimethyl-1-ethyl-2H-benz[e]indol-2-ylidene) et hylidene]-1-cylohexen-1-yl]-ethenyl]-3,3-dimethyl-1-ethyl-1H-benz [e]indolium iodide (Cy-I, American Dye Source). Cy-I and IR775-CI were mixed with potassium tetrakis(pentafluoro-phenyl)borate (K-TPFB) to create Cy-TPFB (CO770) and IR775-TPFB (CO700). Lumogen F Red 305 (CO550a) was purchased from BASF. The dyes were dissolved in ethanol and mixed with Shandon mounting media (CAS #9990435, Thermo Fisher Scientific) in a solution to mountant volume ratio of 1:2. This mixture was drop-cast onto acrylic sheets and allowed to dry in a fume hood for 6 hours. The dried panels were transferred into a glovebox under nitrogen. A layer of epoxy (KATIOBOND) was applied to the outer edge of the film, and a glass sheet was placed on top of the epoxy layer. The epoxy was treated with UV light until cured, and the active area of the panel was covered with a mask to reduce UV exposure prior to the example.

Preparation of wavelength-selective panel of CO550b: Copper (II) Pthalocyanine Blue (CuPC) films were grown on acrylic panes in a custom thermal evaporator from Angstrom Engineering by evaporating powdered CuPC (Sigma Aldrich) in a tungsten boat. The acrylic was mounted on a rotation stage. The film was grown at a rate of 2 Å/s to a thickness of 5000 Å at room temperature and a pressure of less than 3*10-6 torr.

Preparation of neutral density treatment: The Neutral Density Gray panels were purchased from ePlastics. Two pieces were stacked on top of each other to achieve the ND33 treatment.

Chamber construction: Seven chambers were constructed, each covered by different luminescent solar concentrator panels or ND panels. These chambers were placed on the benches of a research greenhouse (FIGS. 16A-17B). Each chamber was 92 cm wide, 98 cm long, and had a total volume of 0.66 $m^3$ (FIG. 16A). Chamber frames were constructed of polyvinyl chloride (PVC) pipe and enclosed on the four sides perpendicular to the base with opaque 1.3-cm thick insulation board to ensure light reaching plants passed solely through the panels. Moreover, we painted the inside of the insulation boards with flat white paint to increase light scattering. Each experimental chamber was constantly ventilated by heavily perforating the north-facing wall and installing one 120 V, 3.1 $m^3$ $min^{-1}$ fan (Axial 1238, AC Infinity Inc., City of Industry, CA) on the south-facing wall, which is in line with the research greenhouse airflow (FIG. 16B). Chamber roof frames were fabricated from steel angle-bar and pitched 20 degrees toward the south to increase or maximize sunlight transmission to plants inside.

Environmental sensing: Quantum sensors (LI-190SA; LI-COR, Inc., Lincoln, NE, or SQ-500; Apogee Instruments, Inc.) measured instantaneous PPFD and were located on the north-facing wall of each chamber and maintained level with the top of the plant canopies (FIG. 16B). One aspirated thermocouple (Type E; Omega Engineering, Inc., Stamford, CT) per chamber measured air temperature. A CR-1000 datalogger (Campbell Scientific, Logan, UT) and AM16/32B multiplexer (Campbell Scientific) sampled instantaneous air temperature and PPFD measurements every minute and recorded hourly averages. Average daily temperature and DLI) were calculated and recorded, as shown in FIGS. 30A-30G.

FIG. 30A illustrates basil average daily chamber air temperature for ND91 at 3000, ND58 at 3002, ND33 at 3004, CO770 at 3006, CO700 at 3008, CO550a at 3010, and CO550b at 3012. FIG. 30B illustrates petunia average daily chamber air temperature for ND91 at 3020, ND58 at 3022, ND33 at 3024, CO770 at 3026, CO700 at 3028, CO550a at 3030, and CO550b at 3032. FIG. 30C illustrates tomato average daily chamber air temperature for ND91 at 3040, ND58 at 3042, ND33 at 3044, CO770 at 3046, CO700 at 3048, CO550a at 3050, and CO550b at 3052. FIG. 30D is a legend for FIGS. 30E-30F. FIG. 30E illustrates DLI in the basil chambers. FIG. 30F illustrates DLI in the petunia chambers. FIG. 30G illustrates DLI in the tomato chambers.

Greenhouse environment: Each chamber was in an east-to-west oriented glass-glazed research greenhouse at Michigan State University (42.7° N/84.5° W) on individual aluminum benches. A greenhouse environmental control system (Integro 725; Priva North America, Vineland Station, ON, Canada) regulated the air temperature at a set point of 21° C. Radiant steam heating, roof vents, exhaust fans, and an evaporative cooling pad regulated air temperature. The air temperature inside the experimental chambers averaged 25, 27, and 24° C. for basil, petunia, and tomato, respectively, while air temperature differences between each chamber varied by a maximum of 2° C. (FIGS. 30A-30C, 41).

Basil seedling culture: Basil seeds (Johnny's Selected Seeds, Winslow, ME) were sowed directly into round 4-in pots (473 mL) filled with a greenhouse media consisting of 70% peat moss, 21% perlite, and 9% vermiculite (Suremix; Michigan Grower Products, Inc., Galesburg, MI) and placed inside experimental chambers on 12 May 2020. Each 4-in pot contained seven basil plants. Irrigation was provided as needed with a solution consisting of reverse osmosis water supplemented with 13N-1.3P-12.5K water-soluble fertilizer that contained (in $mg \cdot L^{-1}$) 125 N, 13 P, 120 K, 77 Ca, 19 Mg, 1.7 Fe, 0.4 Cu, and Zn, 0.8 Mn, 0.2 B and Mo (MSU Orchid RO Water Special; GreenCare Fertilizers, Inc., Kankakee, IL).

Petunia and tomato seedling culture: Petunia seeds (Harris Seeds Co., Rochester, NY) were sown in a controlled-environment growth room on 29 May 2020 into 288-cell (8-mL individual cell volume) plug trays filled with a propagation mix consisting of 50% of greenhouse media mentioned previously (Suremix; Michigan Grower Products, Inc.) and 50% vermiculite by volume. Seeds of tomato, a dwarf variety, (Park Seed Co., Hodges, SC) were sown in the same growth room on 13 Jul. 2020 into 128-cell (17.5-mL individual cell volume) plug trays filled with the same propagation mix as petunia. Petunia and tomato germinated under a 10-h and 18-h photoperiod, respectively, at a constant 23° C. and a PPFD of 175 $\mu mol$ $m^{-2}s^{-1}$. Sole source electrical lighting was provided with a white light-emitting diode (LED) fixture (RAY22; Fluence, Austin, TX). Transparent plastic humidity domes covered the germinating seedlings until cotyledon emergence (6 d). Seedlings were irrigated as needed with a solution of deionized water, hydroponic water-soluble fertilizer (12N-1.7P-13.3K RO Hydro FeED, JR Peters, Inc, Allentown, PA), and magnesium sulfate (Epsom salt, Pennington Seed Inc., Madison GA) that provided the following nutrients (in mg $L^{-1}$): 125 N, 18 P, 138 K, 73 Ca, 49 Mg, 37 S, 1.6 Fe, 0.5 Mn, 0.4 Zn, 0.2 B and Cu, and 0.01 Mo. Seedling stock solution pH and electrical conductivity were measured upon formulation with a handheld meter (HI9814; Hanna Instruments, Woonsocket, RI) and adjusted to a pH of 5.8 and electrical conductivity of 1.2 mS $cm^{-1}$.

Mature crop culture: Ten pots of basil, petunia, tomato, and soy were randomly placed into each chamber at a density of 10 pots $m^{-2}$ until ready for harvest. Each pot was filled with the same peat-based greenhouse media described for basil seedling culture. Basil grew inside the chambers for 35 d until harvest on 16 Jun. 2020. Petunia were transplanted into 4.5-in round pots on 20 Jun. 2020, and grew inside chambers until 21 Jul. 2020 (31 d) when all plant had at least one fully open flower. Tomato seedlings were transplanted into 4.5-in round posts on 30 Jul. 2020. Tomato seedlings were transplanted when they developed a good root system (17 d) and grew inside experimental chambers for 75 d until harvest on 13 Oct. 2020, which is when plants in the ND91 chamber had ripe fruit. Basil, petunia, and tomato were irrigated as needed with the identical solution described in the basil seedling culture.

Plant data collection: At harvest, the following data were measured for basil, petunia, and tomato: stem length (from the substrate to the apical meristem); fresh and dry above-ground biomass using scales (GR-200 and GX-1000; A&D Store, Inc., Wood Dale, IL); the length, width, area, and relative chlorophyll content of the youngest fully expanded leaf using a ruler, leaf area meter (LI-3100 Area Meter; LI-COR, Inc.), and relative chlorophyll content with handheld meter (MC-100; Apogee Instruments, Inc., Logan, UT). Basil, petunia, and tomato fresh samples were dried for at least four days in parchment bags at 60° C. in a drying oven (Blue M, Blue Island, IL) before dry mass was measured. In addition to the measurements taken for both species, independent measurements were taken for basil, petunia, and tomato. For basil, we also measured the total number of expanded leaves, expanded nodes, and branches >5 cm long; total leaf area of all expanded leaves; stem diameter at substrate level with a digital caliper (41101 DigiMax; Wiha Switzerland, Monticello, MN, USA); and fresh and dry mass of just the leaves or stems. Because each basil pot contained seven plants, we selected three plants from each pot that excluded the two tallest and two shortest plants and averaged their growth metrics. For petunia we counted the time to visible bud and flower since seed sow, number of branches >10 cm, inflorescence, and nodes under the first flower; and measured the longest lateral branch. For tomato, we also measured fruit number (ripe and unripe); fruit fresh and dry mass; and the date on which the first flower had fully reflexed petals. SLA was calculated by dividing the youngest fully expanded leaf's area by its dry mass, and plant compactness by dividing its above-ground dry mass (excluding fruit for tomato) by its stem length according to Burnett et al. Two-dimensional projected canopy area (PCA) was recorded for each tomato plant with an overhead photograph and analyzed in ImageJ software (http://imagej.nih.gov/ij).

Experimental design and statistics: The experiment was organized as a completely randomized design where treatments (7 levels) and plants were assigned to random chambers (experimental units) inside the research greenhouse. Data were analyzed in R software (Version 4.0.3, The R Foundation, Vienna, Austria) using analysis of variance (ANOVA) and Tukey's honestly significant difference test at $\alpha=0.05$. Regression analysis comparing basil and tomato growth parameters (i.e., dry mass, stem length, or leaf area) as a function of the average DLI was first evaluated as a linear or quadratic function, but often trends appeared sigmoidal, in which the following Gompertz function was used:

$$y = a\exp(-bc^x), \qquad \text{(Equation 5)}$$

where y=response variable (growth parameter), a=asymptote, b=displacement on the x-axis, c=growth rate, and x=predictor variable (DLI). The Gompertz function is an asymmetrical logistic function where the right-hand portion of the curve approaches the upper asymptote more gradually than the left-hand portion approaches the lower asymptote. Past studies have used the Gompertz function to describe the growth of biological organisms as a function of time and plant growth responses as a function of cumulative thermal energy and DLI. The Gompertz function was selected over the symmetrical logistic function because curves visually fit the data better and typically had higher $R^2$ values.

Assessing Crop Growth with Various Quantum Units

To determine the applicability of additional plant-centric quantum units like YPFD and eDLI to predict crop growth, we transformed our treatment DLIs to reflect the YPFD and ePAR using spectroradiometer measurements. Then, we compared the transformed predictor variables to a subset of our basil growth metrics (shoot dry mass, stem length, total leaf area, and relative chlorophyll content) to determine if one parameter was preferable for agrivoltaic reporting (FIGS. 32A-32E).

FIG. 32A is a legend for FIGS. 32B-32E including symbols for each of the glazing materials. FIG. 32B reports shoot dry mass on a y-axis, with a DLI curve shown at 3200, an eDLI curve shown at 3202, and a YPFD curve shown at 3204. FIG. 32C reports total leaf area on a y-axis, with a DLI curve shown at 3210, an eDLI curve shown at 3212, and a YPFD curve shown at 3214. FIG. 32D reports stem length on a y-axis, with a DLI curve shown at 3220, an eDLI curve shown at 3222, and a YPFD curve shown at 3224. FIG. 32E reports SPAD on a y-axis, with a DLI curve shown at 3230, an eDLI curve shown at 3232, and a YPFD curve shown at 3234.

The sigmoidal curves shifted to lower mol $m^{-2}d^{-1}$ values when DLI was transformed into YPFD, a result of quantum efficiencies less than one for most PAR wavelengths. Curves shifted to higher mol $m^{-2}d^{-1}$ values when transformed into eDLI, the result of integrating photons from a wider waveband. Each regression using the transformed predictor variables had an almost identical sigmoidal shape and similar ability to function as the DLI predictor variable for the entire subset of basil growth metrics selected. The observed critical illumination threshold (the mol $m^{-2}d^{-1}$ required to grow a crop with similar yield and quality to the ND91 treatment) for basil was an average DLI of ~12 mol $m^{-2}d^{-1}$. After transformation, the critical illumination threshold became ~10 mol $m^{-2}d^{-1}$ and ~14 mol $m^{-2}d^{-1}$ for YPFD and eDLI, respectively. Generally, these values appropriately reflect the imperfect quantum efficiency of YPFD (lower values) and the extended waveband integral of eDLI (higher values). However, the magnitude of change upon the x-axis will inevitably depend on the transmission spectra and transformation. For instance, because the CO700 treatment absorbed a large fraction of the FR photons, its DLI and eDLI should be closer (lower magnitude of change) compared to a neutral-density TPV that does not absorb FR photon (higher magnitude of change). Regardless, even though the magnitude of transformation existed between our treatments, due to the larger magnitude of difference between treatment DLIs, the effect of the x-axis transformations were likely minimized.

These results suggest that YPFD and eDLI were comparable to the traditional, unweighted DLI definition to predict plant yield and growth, despite spectral differences being utilized in the agrivoltaic design. As such, it may be beneficial to the field of agrivoltaics to use eDLI (the integration of photons between 400 and 750 nm) as the benchmark quantum unit as explained by Zhen and Bugbee (2020a and 2020b). Yet, regardless of the quantum unit, these results emphasize the necessity for the use of at least one quantum unit in agrivoltaic reporting but leaves room for further research into a common quantum metric that best describes PV panel transmission relative to crops grown underneath them. Furthermore, the use of DLI transformations such as these may be more important and meaningful when the average panel transmissions are more similar.

Example 2

Four crops were grown within chambers having roofs with different glazing materials. The crops included red-leaf lettuce (a leafy plant), snapdragon (a flowering plant), soybean (a fruit-bearing plant), and basil (a leafy plant). The glazing materials included ND91, CO850, CO770, CO700, ND58, CO575, CO475, and ND33. Results are presented below.

FIG. 33 is a chart including photographs of red leaf lettuce 'Rouxai', snapdragon 'Snapshot Yellow', and soybean plants representative of those grown under various experimental glazing materials.

FIG. 34 is a table reporting growth parameters of lettuce 'Rouxai' in 2021. SPAD refers to the relative chlorophyll content of leaves. SLA was calculated by dividing the leaf area (cm$^2$) by leaf mass (g) of a representative leaf. Compactness is calculated by dividing the total above-ground dry mass (g) by stem length (cm). Radiation use efficiency (RUE) is calculated by dividing the total above ground dry mass (g) by the mol of intercepted photons. Compactness is calculated by dividing dry mass (g) by stem length (cm). Data represent means with ten samples. Means with different letters are significant according to Tukey's honestly significant difference test (P<0.05) and correspond to each row.

FIG. 35 is a table reporting parameters of snapdragon 'Snapshot yellow' in 2021. SPAD refers to the relative chlorophyll content of leaves. SLA was calculated by dividing the leaf area ($cm^2$) by leaf mass (g) of a representative leaf. Compactness is calculated by dividing the total above-ground dry mass (g) by stem length (cm). RUE is calculated by dividing the total above ground dry mass (g) by the mol of intercepted photons. Compactness is calculated by dividing dry mass (g) by stem length (cm). Data represent means with ten samples. Means with different letters are significant according to Tukey's honestly significant difference test (P<0.05) and correspond to each row.

FIG. 36 is a table reporting growth parameters of basil 'Genovese' in 2021. SPAD refers to the relative chlorophyll content of leaves. SLA was calculated by dividing the leaf area ($cm^2$) by leaf mass (g) of a representative leaf. Compactness is calculated by dividing the total above-ground dry mass (g) by stem length (cm). RUE is calculated by dividing the total above ground dry mass (g) by the mol of intercepted photons. Compactness is calculated by dividing dry mass (g) by stem length (cm). Data represent means with ten samples. Means with different letters are significant according to Tukey's honestly significant difference test (P<0.05) and correspond to each row.

FIG. 37 is a table reporting growth parameters of soybean during 2021. SPAD refers to the relative chlorophyll content of leaves. SLA was calculated by dividing the leaf area ($cm^2$) by leaf mass (g) of a representative leaf. Compactness is calculated by dividing the total above-ground dry mass (g) by stem length (cm). RUE is calculated by dividing the total above ground dry mass (g) by the mol of intercepted photons. Compactness is calculated by dividing dry mass (g) by stem length (cm). Data represent means with ten samples. Means with different letters are significant according to Tukey's honestly significant difference test (P<0.05) and correspond to each row.

Example 3

Two crops were grown within chambers having roofs with different glazing materials. The crops included soybean (a fruit-bearing plant) and basil (a leafy plant). The glazing materials included ND91, CO850, CO770, CO700, ND58, CO575, CO475, and ND33. Results are presented below.

FIG. 38 is a chart including photographs of basil 'Genovese' and soybean plants representative of those grown under various experimental glazing materials.

FIG. 39 is a table reporting growth of basil 'Genovese' during 2022. SLA was calculated by dividing the leaf area ($cm^2$) by leaf mass (g) of a representative leaf. Compactness is calculated by dividing the total above-ground dry mass (g) by stem length (cm). RUE is calculated by dividing the total above ground dry mass (g) by the mol of intercepted photons. Compactness is calculated by dividing dry mass (g) by stem length (cm). Data represent means with twenty samples. Means with different letters are significant according to Tukey's honestly significant difference test (P<0.05) and correspond to each row.

FIG. 40 is a table reporting growth of soybean during 2022. Data represent means with twenty samples. Means with different letters are significant according to Tukey's honestly significant difference test (P<0.05) and correspond to each row.

Examples 1-3 Overview

FIGS. 41A-41D depict relative growth response of crops grown in between 2020 and 2022, including the 2020 crops of Example 1, the 2021 crops of Example 2, and the 2022 crops of Example 3. Each growth parameter was made relative to the maximum observation according to species and represents the average of ten samples. FIG. 41A is a legend for FIGS. 41B-41D.

With reference to FIG. 41B, relative yield is shown as a function of DLI. 2020 crops: basil is shown at 4100, petunia is shown at 4102, and tomato is shown at 4104. 2021 crops: basil is shown at 4110, soybean is shown at 4112, snapdragon is shown at 4114, and lettuce is shown at 4116. 2022 crops: basil is shown at 4120 and soybean is shown at 4122. Relative yield refers to basil, lettuce, snapdragon, soybean, and petunia shoot dry mass (leaves and stems) and tomato fresh fruit mass.

Referring to FIG. 41C, relative stem length is shown as a function of DLI. 2020 crops: basil is shown at 4130, petunia is shown at 4132, and tomato is shown at 4134. 2021 crops: basil is shown at 4140, soybean is shown at 4141, snapdragon is shown at 4144, and lettuce is shown at 4146. 2022 crops: basil is shown at 4150. Stem length was measured from soil surface to apical meristem.

With reference to FIG. 41D, relative compactness is shown as a function of DLI. 2020 crops: basil is shown at 4160, petunia is shown at 4162, and tomato is shown at 4164. 2021 crops: basil is shown at 4170, soybean is shown at 4172, snapdragon is shown at 4174, and lettuce is shown at 4176. 2022 crops: basil is shown at 4180. Compactness was calculated by dividing the total above-ground dry mass (g) by stem length (cm).

Example 4 (TPVs)

In this example, inverted LBL TPVs were fabricated with the near-infrared absorbing polymer PTB7-Th and NFA IEICO-4F as the electron accepting and donating materials. This is a non-traditional acceptor polymer that is paired with a NIR absorbing donor IEICO-4F that is typically considered a non-fullerene acceptor.

With reference to FIG. 42, APT, $J_{SC}$, open circuit voltage ($V_{OC}$), fill factor (FF), PCE, and LUE* are reported for devices having different thicknesses. Replacing the Ag/Alq$_3$ electrode with higher-transparency ITO is expected to increase the APT to about 65%. Additionally, lowering both the PTB7-Th thickness and the IEICO-4F thicknesses below 20 nm is expected to increase the APT to about 75%. FIGS. 43A-43C are graphs showing characteristics of the TPVs having different PTB7-Th thicknesses.

TPV fabrication: PTB7-Th (1-Material) was dissolved in o-xylene (Sigma Aldrich) at 1-10 mg mL$^{-1}$ and covered, stirred, and heated at 70° C. overnight. IEICO-4F (1-Material) was dissolved in o-xylene: n-butanol: 1-chloronaphthalene (Sigma Aldrich) at 75:25:0, 74.25:24.75:1, 73.5:24.5:2, 72.75:24.25:3, 72:24:4, 71.25:23.75:5, and 70.5:23.5:6 v/v ratios to yield 1-chloronaphthalene doping of 0 to 6%.[13] IEICO-4F solutions were then covered, stirred, and heated at 70° C. overnight. ZnO solutions were prepared with 1 g zinc acetate dihydrate (Sigma Aldrich), 0.277 mL ethanolamine (Sigma Aldrich), and 10 mL 2-methoxyethanol (Sigma Aldrich), and covered and stirred rigorously overnight in a fumehood.

Device fabrication: Pre-patterned ITO coated glass substrates were cleaned via sequential sonication for 10 minutes each in deionized water, acetone, and isopropanol. Substrates were dried on a hotplate at 135° C. for 1 minute and then plasma cleaned under light vacuum for 10 minutes. The ZnO layer was spin-coated onto the substrates immediately after plasma cleaning for 30 s at 4000 rpm (50 μL, 2000 rpm/s acceleration). ZnO covered substrates were annealed at 200° C. for 20 minutes in air prior to moving to a glovebox for active layer spin-coating. PTB7-Th films were spun using 65 μL at 1000 rpm for 15 s and 2000 rpm for 5 s to yield thicknesses ranging from 5-85 nm. IEICO-4F films were spun at 1500 rpm for 45 s (60 μL solution) to yield films of approximately 55 nm (VASE). After sequential bilayer deposition, devices were annealed at temperatures ranging from room temperature to 150° C. for 10-20 minutes. Substrates were then loaded into a high vacuum thermal vapor deposition chamber (Angstrom Engineering) where 7 nm of $MoO_3$ was deposited at $3 \times 10^{-6}$ torr. Finally, a top contact of Ag (opaque devices—80 nm) or $Ag/Alq_3$ (TPVs) was deposited using a mask to define an active area of 4.43 mm$^2$. For TPVs, Ag thickness ranged from 8 to 20 nm and $Alq_3$ thickness from 0 to 50 nm.

Device Testing: Current-voltage (J-V) characteristic curves were measured with a Keithley 2420 SourceMeter under illumination from a Xe Arc lamp calibrated to 1-sun intensity with a NREL-calibrated Si reference cell with KG5 filter. A minimum of 5 devices were tested for each condition. EQE measurements were made with monochromated light from a tungsten halogen lamp chopped at 200 Hz. A Newport-calibrated Si diode was used to calibrate the system prior to taking EQE measurements.

Example 5 (TLSCs)

2,2'-[[4,4,11,11-tetrakis(4-hexylphenyl)-4,11-dihydrothieno[2',3':4,5]thieno[2,3-d]thieno[2'''',3''':4'',5'']thieno[2'', 3'''':4'',5'']pyrano[2'',3'':4',5']thieno[2',3':4,5]thieno[3,2-b] pyran-2,9-diyl]bis[methylidyne(5,6-difluoro (COi8DFIC) was dissolved in dichloromethane at the concentrations listed. The nanocluster (NC) (Cs-$_2$Mo$_6$I$_8$ (CF$_3$CF$_2$COO)$_6$), 2-[2-[2-chloro-3-[2-(1,3-dihydro-3,3-dimethyl-1-ethyl-2H-benz[e]indol-2-ylidene)ethylidene]-1-cylohexen-1-yl]-ethenyl]-3,3-dimethyl-1-ethyl-1H-benz[e]indolium tetrakis(pentafluorophenyl)borate (CyTPFB), and 2-[2-[2-Chloro-3-[(1, 3-dihydro-1,3,3-trimethyl-2H-indol-2-ylidene)ethylidene]-1-cylcohexen-1-yl]-ethenyl]-1,3,3-trimethyl-1H-indolium tetrakis(pentafluorophenyl)borate (IR775-TPFB) salts were dissolved in ethanol at the concentrations listed in FIGS. 44-50D. The COi8DFIC solution was mixed with a mounting medium at 1:1 volumetric ratio, while the ethanol-based solutions were mixed with the mounting medium at a 1:2 volumetric ratio. The mixtures were then drop cast onto borosilicate glass substrates and allowed to dry under N$_2$ atmosphere. For the nanocluster devices with Cs$_2$Mo$_6$I$_8$ (CF$_3$CF$_2$CF$_2$COO)$_6$, an epoxy resin border was applied to the outer edge of the surface containing the dye film, and an additional glass substrate was placed onto the epoxy resin. The epoxy was UV-cured to complete the seal. A photovoltaic cell (Si or GaAs, as indicated in FIGS. 44-50D) was mounted to one edge of the device using an index-matching gel for testing.

Device Testing: Current-voltage (J-V) characteristic curves were measured with a Keithley 2420 SourceMeter under illumination from a Xe Arc lamp calibrated to 1-sun intensity with a NREL-calibrated Si reference cell with KG5 filter. EQE measurements were made with monochromated light from a tungsten halogen lamp chopped at 200 Hz. A Newport-calibrated Si diode was used to calibrate the system prior to taking EQE measurements.

Results are shown in FIGS. 44-50D.

FIG. 50A is a graph illustrating J-V curves for various concentrations of NC with COi at 0.075 mg/mL. NC 5 mg/mL is shown at 5000, NC at 20 mg/mL is shown at 5002, NC at 40 mg/mL is shown at 5004, and NC at 5 mg/mL is shown at 5006. FIG. 50B is a graph illustrating a J-V curve 5010 for COi8DFIC at 0.15 mg/mL and a J-V curve at 5012 for IR775-TPFB at 0.2 mg/mL. FIG. 50C is a graph illustrating EQE as a function of wavelength for various concentrations of NC with COi at 0.075 mg/mL. NC 5 mg/mL is shown at 5020, NC at 20 mg/mL is shown at 5022, NC at 40 mg/mL is shown at 5024, and NC at 5 mg/ml is shown at 5026. FIG. 50D is a graph illustrating an EQE curve 5030 for COi8DFIC at 0.15 mg/mL and EQE curve 5032 for IR775-TPFB at 0.2 mg/mL.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A transparent solar panel comprising:
a transparent substrate; and
a transparent photoactive material, wherein:
an average photosynthetic transmittance (APT) of the entire transparent solar panel is greater than or equal to about 45%,
the transparent solar panel is configured to be positioned between the sun and a plant to transmit light to a region containing the plant at a daily light integral (DLI) of greater than or equal to about 10 mol·m$^{-2}$·d$^{-1}$, and
the transparent solar panel has a power conversion efficiency (PCE) of greater than or equal to about 1.5%.

2. The transparent solar panel of claim 1, wherein the transparent solar panel is a transparent photovoltaic (TPV) comprising:
a first transparent electrode on the transparent substrate;
the transparent photoactive material; and
a second transparent electrode, wherein the transparent photoactive material is between the first transparent electrode and the second transparent electrode.

3. The transparent solar panel of claim 1, wherein the transparent solar panel is a transparent luminescent solar concentrator (TLSC) comprising:
the transparent substrate including,
a first surface,
a second surface opposite the first surface, and
an edge surface; and
the transparent photoactive material configured to absorb light at within a first wavelength range and emit light within a second wavelength range, the luminophore being (i) embedded in the transparent substrate, (ii) in a layer on the first surface, the second surface or both the first surface and the second surface, or (iii) both (i) and (ii); and a photovoltaic device coupled to the edge surface, the photovoltaic device configured to absorb light within the second wavelength range.

4. The transparent solar panel of claim 1, wherein the transparent solar panel has an APT of greater than or equal to about 65%.

5. The transparent solar panel of claim 1, wherein the transparent solar panel is configured to transmit light to the region is at an extended daily light integral (eDLI) of greater than or equal to about 12 mol·m$^{-2}$·d$^{-1}$.

6. The transparent solar panel of claim 1, wherein the transparent solar panel is configured to transmit light to the region is at a yield photon flux density (YPFD) of greater than or equal to about 9 mol·m$^{-2}$·d$^{-1}$.

7. The transparent solar panel of claim 1, wherein the transparent photoactive material has a peak absorbance of less than about 450 nm or greater than about 725 nm.

8. The transparent solar panel of claim 1, wherein the transparent photoactive material has a wavelength cutoff of 700 nm.

9. The transparent solar panel of any of claim 1, wherein the entire transparent solar panel is greater than or equal to about 65% transparent to light at a wavelength of 470 nm.

10. The transparent solar panel of claim 1, wherein the entire transparent solar panel is greater than or equal to about 65% transparent to light at a wavelength of 530 nm.

11. The transparent solar panel of any of claim 1, wherein the entire transparent solar panel is greater than or equal to about 65% transparent to light at all wavelengths of 500-550 nm.

12. The transparent solar panel of claim 1, wherein the entire transparent solar panel is greater than or equal to about 65% transparent to light at a wavelength of 620 nm.

13. The transparent solar panel of any of claim 1, wherein the entire transparent solar panel is greater than or equal to about 65% transparent to light at all wavelengths of 550-650 nm.

14. The transparent solar panel of claim 1, wherein the transparent solar panel has a solar heat gain coefficient (SHGC) of less than or equal to about 0.5.

15. The transparent solar panel of claim 1, wherein
the transparent solar panel has a light utilization efficiency (LUE*) that is a product of a power conversion efficiency (PCE) of the transparent solar panel and an average photosynthetic transmittance (APT) of the transparent solar panel, and
the LUE* is greater than or equal to about 1%.

16. The transparent solar panel of claim 1, wherein the transparent solar panel is bifacial.

17. The transparent solar panel of claim 1, further comprising:
a frame at least partially surrounding the transparent substrate, wherein a color of the frame has an R, G, B decimal code of:
R is greater than or equal to about 150 to less than or equal to about 255,
G is greater than or equal to about 150 to less than or equal to about 255, and
B is greater than or equal to about 150 to less than or equal to about 255.

* * * * *